United States Patent
Lai et al.

(10) Patent No.: US 12,243,822 B2
(45) Date of Patent: Mar. 4, 2025

(54) METHOD OF MANUFACTURING INTEGRATED CIRCUIT

(71) Applicant: TAIWAN SEMICONDUCTOR MANUFACTURING COMPANY, LTD., Hsinchu (TW)

(72) Inventors: Chih-Yu Lai, Hsinchu (TW); Hui-Zhong Zhuang, Hsinchu (TW); Chih-Liang Chen, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/447,572

(22) Filed: Aug. 10, 2023

(65) Prior Publication Data

US 2023/0387014 A1     Nov. 30, 2023

Related U.S. Application Data

(62) Division of application No. 17/459,756, filed on Aug. 27, 2021, now Pat. No. 11,862,562.

(51) Int. Cl.
*H01L 23/528*     (2006.01)
*H01L 21/8238*     (2006.01)
(Continued)

(52) U.S. Cl.
CPC .. *H01L 23/5286* (2013.01); *H01L 21/823871* (2013.01); *H01L 23/5226* (2013.01);
(Continued)

(58) Field of Classification Search
CPC ... H01L 23/485; H01L 23/528; H01L 23/552; H01L 23/5286; H01L 23/5225; H01L 23/5226; H01L 27/06; H01L 27/092; H01L 27/0922; H01L 27/0688; H01L 27/0928; H01L 27/11807; H01L 27/0924; H01L 21/822; H01L 21/8221; H01L 21/8238; H01L 21/823871; H01L 21/823821; H01L 21/823892; H01L 29/417; H01L 29/41725;
(Continued)

(56) References Cited

U.S. PATENT DOCUMENTS 7,260,442 B2    8/2007   Hwang et al.
9,256,709 B2    2/2016   Yu et al.
(Continued)

*Primary Examiner* — Chuong A Luu
(74) *Attorney, Agent, or Firm* — Hauptman Ham, LLP

(57) ABSTRACT

A method includes forming a first transistor stack over a substrate. The first transistor stack includes: a first transistor of a first conductivity type, and a second transistor of a second conductivity type different from the first conductivity type. The second transistor is above the first transistor. A plurality of first conductive lines is formed in a first metal layer above the first transistor stack. The plurality of first conductive lines includes, over the first transistor stack, a power conductive line configured to route power to the first transistor stack, one or more signal conductive lines configured to route one or more signals to the first transistor stack, and a shielding conductive line configured to shield the routed one or more signals. The one or more signal conductive lines are between the power conductive line and the shielding conductive line.

20 Claims, 28 Drawing Sheets

(51) Int. Cl.
  *H01L 23/522* (2006.01)
  *H01L 23/552* (2006.01)
  *H01L 27/092* (2006.01)
  *H01L 29/417* (2006.01)

(52) U.S. Cl.
  CPC .......... *H01L 23/552* (2013.01); *H01L 27/092* (2013.01); *H01L 29/41725* (2013.01)

(58) Field of Classification Search
  CPC . H01L 29/786; H01L 29/78633; H01L 29/04; H01L 29/045; H01L 29/16; H01L 29/18; H01L 29/1608; H01L 29/185; H01L 29/22; H01L 29/2206; H01L 29/36; H01L 29/365
  USPC ........................................................ 438/199
  See application file for complete search history.

(56) References Cited

U.S. PATENT DOCUMENTS

| | | |
|---|---|---|
| 2014/0040838 A1 | 2/2014 | Liu et al. |
| 2015/0278429 A1 | 10/2015 | Chang |
| 2020/0243503 A1 | 7/2020 | Padmanabhan et al. |
| 2020/0258938 A1* | 8/2020 | Chai .................. H01L 27/1255 |
| 2021/0257525 A1 | 8/2021 | Ryu et al. |
| 2022/0149133 A1 | 5/2022 | Lee et al. |
| 2022/0278112 A1* | 9/2022 | Karda .................. G11C 11/404 |

\* cited by examiner

METHOD OF MANUFACTURING INTEGRATED CIRCUIT

RELATED APPLICATION(S)

This application is a divisional application of U.S. patent application Ser. No. 17/459,756, filed Aug. 27, 2021, the disclosure of which is hereby incorporated by reference in its entirety.

BACKGROUND

An integrated circuit (IC) includes a number of IC devices manufactured in accordance with one or more IC layout diagrams. IC devices sometimes include complementary field effect transistor (CFET) devices. A CFET device has an upper FET overlying a lower FET in a stacked transistor configuration.

IC devices include an inverter circuit structure that outputs a voltage representing the opposite logic-level to its input. An inverter circuit functions to invert and output the input signal applied. When the applied input signal is low then the output becomes high and vice versa. Inverters can be constructed using two complementary transistors in a complementary metal-oxide-semiconductor (CMOS) configuration (e.g., a CFET).

BRIEF DESCRIPTION OF THE DRAWINGS

Aspects of the present disclosure are best understood from the following detailed description when read with the accompanying FIGS. In accordance with the standard practice in the industry, various features are not drawn to scale. In fact, the dimensions of the various features may be arbitrarily increased or reduced for clarity of discussion.

DETAILED DESCRIPTION

Figure 1A:
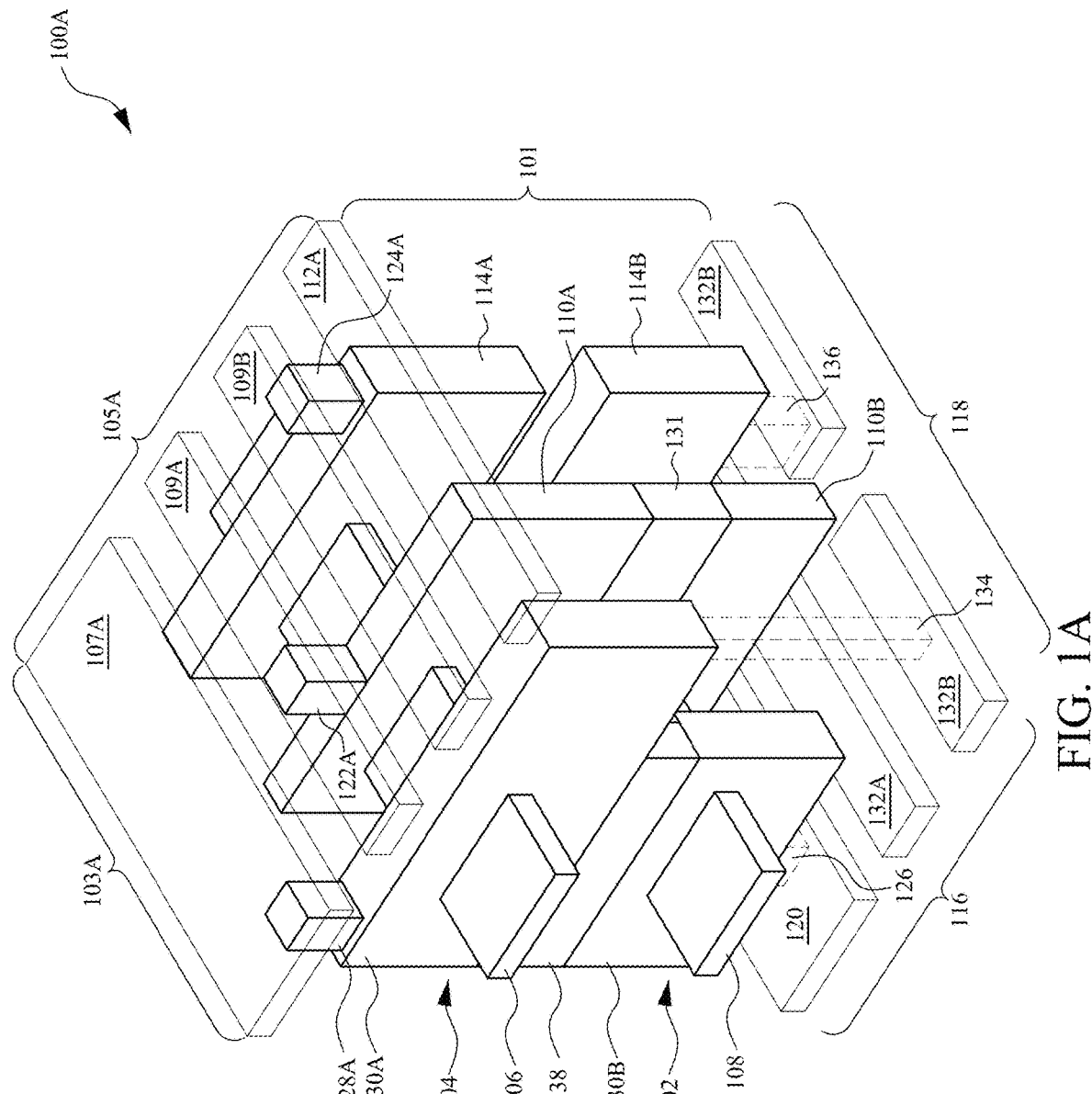
FIG. 1A is a schematic perspective view of a circuit structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

In some embodiments, a CFET has a first-type transistor stacked with a second-type transistor. Additionally or alternatively, the first-type transistor has a channel region in a first-type active-region semiconductor structure, and the second-type transistor has a channel region in a second-type active-region semiconductor structure. In some embodiments, the transistor stack includes a front-side conductive layer above the CFET transistors and a back-side conductive layer below the CFET transistors. Additionally or alternatively, the CFET performance improves based upon the positioning of a power conductive line, signal conductive lines, and a shielding conductive line, in one or more embodiments. In some embodiments, the power connections to the CFET are improved with reduced resistance between the CFET and the power conductive lines based on the increased size of the power conductive line. Additionally or alternatively, the front-side shielding conductive line in the front-side conductive layer and back-side shielding conductive line in the back-side conductive layer alleviates some restrictions on the pitch of the IC device, in one or more embodiments. In some embodiments, signal shielding for the front-side signal conductive lines are improved by the front-side shielding conductive line and inter-CFET signal shielding is improved by the back-side shielding conductive lines.

In some embodiments, a CFET includes an asymmetric front-side and back-side arrangement of power conductive lines, signal conductive lines, and shielding conductive lines. Additionally or alternatively, a CFET includes a structure that provides sufficient power, signal and shielding routing resources for one or more cells (e.g., a Scan D Flip-flop) to be fabricated at a more flexible pitch, in one or more embodiments. In some embodiments, two or more structures include a shielding conductive line and/or a routing resource conductive line. Additionally or alternatively, power conductive lines are shared and the width is increased (i.e., to reduce resistivity), in one or more embodiments.

In some embodiments, the cell height of the CFET (including front-side and back-side power, signal and shielding conductive lines) does not increase with the addition of additional shielding conductive lines and/or routing resource conductive lines to the front-side and/or back-side and the arrangement of transistors in the stacked transistor structure is maintained (e.g., reducing redesign costs). Additionally or alternatively, the CFET structure includes one power conductive line, two signal conductive lines, and one shielding conductive line on the front-side of a substrate where the power and shielding conductive line is shared between one or more neighboring stacked transistors. In some embodiments, one power conductive line and two signal conductive lines are on the back-side of the substrate where the bottom power conductive line is not shared with the top transistor, but the power conductive line is close to a cell boundary and configured to be shared with another bottom transistor in a neighboring cell. Additionally or alternatively, the power conductive lines act as a natural shielding for signal cross talk. In some embodiments, at least three separate methods for signal connection between the first-type transistor and the second-type transistor are disclosed below offering circuit design flexibility. Additionally or alternatively, the methods include 1) a source terminal/drain terminal connection or interconnect (also referred to as "MDLI") between source terminal/drain terminals of the stacked transistors; 2) a gate connection between the gates of the stacked transistors; and 3) a via from top to bottom (VTB) between a source terminal/drain terminal of a top transistor in the stacked transistor structure and a metal layer on the back-side of the CFET structure.

In accordance with some embodiments, FIG. 1A is a schematic perspective view of a circuit structure 100A (also referred to herein as a "cell"), implemented with a CFET, that includes power conductive line 107A, signal conductive lines 109A, 109 B (hereinafter referred to as signal conductive lines 109), and a shielding conductive line 112A in a front-side conductive layer 105A. Additionally or alternatively, while some embodiments are discussed with reference to an inverter circuit structure, another IC device, transistor stack or cell is between a front-side metal layer and a back-side metal layer. In some embodiments, a circuit structure 100A includes a substrate (not shown in FIG. 1A, but corresponding to, e.g., substrate 260 in FIG. 2C), and a first transistor stack 101 over the substrate. The first transistor stack 101 comprises a first transistor 102 which is a first conductivity type, and a second transistor 104, which is above first transistor 102 and is a second conductivity type different from the first conductivity type. Circuit structure 100A also includes a plurality of first conductive lines 103A in a first metal layer 105A above first transistor stack 101. A plurality of first conductive lines 103A over first transistor stack 101 includes a power conductive line 107A configured to route power to first transistor stack 101, one or more signal conductive lines 109 configured to route signals to first transistor stack 101, and a shielding conductive line 112A configured to shield the routed signals on one or more signal conductive lines 109, where one or more signal conductive lines 109 are between power conductive line 107A and shielding conductive line 112A.

In some embodiments, circuit structure 100A is an inverter circuit structure that implements a logical negation. Additionally or alternatively, circuit structure 100A, or the like, is a basic building block in digital electronics. In some embodiments, circuit structure 100A is implemented in multiplexers, decoders, state machines, flip-flops, or other sophisticated digital devices and the like.

In some embodiments, first transistor stack 101 is a CFET. Additionally or alternatively, first transistor stack 101 is constructed in such a way that a P-type transistor includes an input from a voltage source or VDD. Additionally or alternatively, first transistor stack 101 includes an N-type transistor that includes an input from VSS or ground. In some embodiments, transistor stack 101 complements every N-type transistor with a P-type transistor. Additionally or alternatively, high voltage on the gates will cause the N-type transistor to conduct and the P-type transistor not to conduct, while a low voltage on the gates causes an opposite behavior. In some embodiments, the outputs of the P-type and N-type transistors are complementary such that when the input is low, the output is high, and when the input is high, the output is low. Because of this behavior of input and output, in some embodiments, the CMOS circuit output is the inverse of the input.

In some embodiments, second transistor 104 is a PMOS (P-channel metal-oxide semiconductor field-effect transistor) active device. Additionally or alternatively, first transistor 102 is an NMOS (N-channel metal-oxide semiconductor filed effect transistor) active device. In some embodiments, second transistor 104 and first transistor 102 include a gate terminal (e.g., metal or polycrystalline silicon), oxide insulation and a semiconductor, such as silicon.

In some embodiments, first metal layer 105A including first conductive lines 103A that includes power conductive line 107A, signal conductive lines 109, and shielding conductive line 112A, second conductive lines 118 that includes power conductive line 120 and signal conductive lines 132A, 132B (hereinafter referred to as signal conductive lines 132), and vias (122A, 124A, 126, 134, 128A, 136) are one or more conductive materials, e.g., a metal such as copper, aluminum, tungsten, titanium, polysilicon, or another material capable of providing a low resistance signal path. In some embodiments, shielding conductive line 112A is a floating conductive line or shielding conductive line 112A is connected to a reference voltage (e.g., VDD, VSS or another voltage on circuit 100A). Additionally or alternatively, shielding conductive line 112A shields, prevents and/or reduces signal interference or signal cross-talk between signals on signal conductive lines 109A, 109B and signals on other neighboring circuit structures or cells.

In some embodiments, circuit structure 100A includes a first transistor 102, an NMOS device, and a second transistor 104, a PMOS device. First transistor 102 is sometimes referred to as a "bottom device" or "bottom transistor," and second transistor 104 is sometimes referred to as a "top device" or "top transistor." Additionally or alternatively, gate terminals 110B, 110A (hereinafter referred to as gate terminal 110) of first transistor 102 and second transistor 104 are electrically connected together by a gate connection 131, while functioning as an input terminal receiving a signal, through a top gate via 122A (also referred to as via-to-gate, or VG), from signal conductive line 109A. In at least one embodiment, gate connection 131 is omitted. In some embodiments, a bottom VG via (not shown) is provided to couple gate terminal 110B of the bottom device, i.e., first transistor 102, to a signal conductive line 132A, 132B on the metal layer 116. An example of a bottom VG via is described with respect to FIG. 1E.

In some embodiments, drain terminals 130A, 130B (hereinafter referred to as drain terminals 130) of second transistor 104 and first transistor 102 are connected together by an MDLI 138, while functioning as an output terminal outputting a signal, through via 134 (also referred to as VTB or via top to bottom), to signal conductive line 132B. In at least one embodiment, a similar MDLI is provided between source terminal 114A of second transistor 104 and source terminal 114B of first transistor 102. In one or more embodiments, either or both of the described MDLI is/are omitted. Additionally or alternatively, drain terminal 130A of second transistor 104 is maintained at the supply voltage VDD through top VD via 128A electrically connected to power conductive line 107A, and source terminal 114B of first transistor 102 is maintained at the supply voltage VSS through via 140 (not shown in FIG. 1A but indicated in FIG. 1E) electrically connected to power conductive line 120. Source terminals/drain terminals are also referred to as metal-to-device (MD) contact structures. The described "source terminal" and/or "drain terminal" are examples, and can be reversed as "drain terminal" and/or "source terminal" in one or more embodiments.

In some embodiments, circuit structure 100A includes a P-type active-region semiconductor structure 106 and an N-type active-region semiconductor structure 108 extending in the X-direction. Additionally or alternatively, the X-direction, the Y-direction, and the Z-direction, in FIG. 1A and other FIGS. throughout the disclosure are mutually orthogonal to each other and form an orthogonal coordinate frame. In some embodiments, P-type active-region semiconductor structure 106 is stacked with N-type active-region semiconductor structure 108 along the Z-direction. Additionally or alternatively, gate terminal 110 extending in the Y-direction intersects both P-type active-region semiconductor structure 106 and N-type active-region semiconductor structure 108. In some embodiments, gate terminal 110 functions as two stacked gate terminals 110A, 110B, conductively joined together: one gate terminal 110A intersects P-type active-region semiconductor structure 106 at a channel region of second transistor 104, and another gate terminal 110B intersects N-type active-region semiconductor structure 108 at a channel region of first transistor 102. Additionally or alternatively, gate terminal 110A of second transistor 104 is conductively connected to gate terminal 110B of first transistor 102 through gate connection 131. In some embodiments, each of P-type active-region semiconductor structure 106 and N-type active-region semiconductor structure 108 includes one or more nano-sheets, and consequently, each of second transistor 104 and first transistor 102 is a nano-sheet transistor. Additionally or alternatively, each of P-type active-region semiconductor structure 106 and N-type active-region semiconductor structure 108 includes one or more nano-wires, and consequently, each of second transistor 104 and first transistor 102 is a nano-wire transistor.

In some embodiments, circuit structure 100A includes conductive segments including source terminals 114 and drain terminals 130. Additionally or alternatively, each of source terminal 114 and drain terminal 130, extend in the Y-direction and intersect P-type active-region semiconductor structure 106 of second transistor 104. In some embodiments, each of source terminal 114 and drain terminal 130, extend in the Y-direction and intersect N-type active-region semiconductor structure 108 of first transistor 102. Additionally or alternatively, drain terminal 130A and drain terminal 130B are conductively connected through MDLI 138. In some embodiments, source terminal 114A of second transistor 104 is conductively connected to front-side signal conductive line 109B through a top via 124A, and source terminal 114B of the first transistor 102 is conductively connected to back-side power conductive line 120 through a bottom via (VB) 140 (FIG. 1E). Additionally or alternatively, front-side power conductive line 107A is configured to be held at a first supply voltage VDD, and back-side power conductive line 120 is configured to be held at a second supply voltage VSS.

In some embodiments, front-side power conductive line 107A extends in the X-direction in front-side metal layer 105A. Additionally or alternatively, back-side power conductive line 120 extends in the X-direction in back-side metal layer 116. In some embodiments, each of front-side metal layer 105A and the back-side metal layer 116 is in a plane having the normal vector orientated towards the Z-direction. Additionally or alternatively, front-side metal layer 105A is above both P-type active-region semiconductor structure 106 and N-type active-region semiconductor structure 108. In some embodiments, back-side metal layer 116 is below both P-type active-region semiconductor structure 106 and N-type active-region semiconductor structure 108. Additionally or alternatively, back-side metal layer 116 is fabricated on a substrate (260 FIG. 2C) as a buried conductive layer, and, N-type active-region semiconductor structure 108 is fabricated above the buried conductive layer. In some embodiments, P-type active-region semiconductor structure 106 is fabricated above N-type active-region semiconductor structure 108, and front-side metal layer 105A is fabricated above P-type active-region semiconductor structure 106. Additionally or alternatively, other arrangements of back-side metal layer 116 are also discussed in the disclosure (see, e.g., FIGS. 3A-4D). In some embodiments, conductive lines in front-side metal layer 105A and conductive lines in back-side metal layer 116 are asymmetrical to one another.

In some embodiments, circuit structure 100A includes front-side signal conductive lines 109 in front-side metal layer 105A and also back-side metal layer 116 includes back-side signal conductive lines 132. Additionally or alternatively, front-side signal conductive line 109A is an input signal conductive line for providing an input to gate terminal 110A and front-side signal conductive line 109B is an output signal conductive line for providing an output through drain terminal 130.

In some embodiments, front-side signal conductive line 109A is conductively connected to gate terminal 110A through a top gate via 122A and configured as an input signal conductive line of circuit structure 100A. In some embodiments, front-side signal conductive line 109B is conductively connected to source terminal 114A through via 124A and configured as an output signal conductive line of circuit structure 100A. Additionally or alternatively, back-side signal conductive lines 132 are configured to route signals between neighboring cells or circuit structures at opposite sides of circuit structure 100A. For example, in some embodiments, through VTB 134 (shown in dotted line as an optional element) connected to drain terminal 130A, an output of transistor stack 101 is routed through signal conductive line 132B. In this structure, as discussed above, drain terminal 130A of second transistor 104 is connected, through VTB 134, to another transistor outside circuit structure 100A, when a gate and/or a source terminal/drain terminal of such another transistor is electrically coupled to the signal conductive line 132B. In another example, additionally or alternatively, via 136 (shown in dotted line as an optional element—also referred to as bottom VD) electrically connects source terminal 114B to signal conductive line 132B. In this structure, source terminal 114B of first transistor 102 is connected, through bottom VD via 136 and signal conductive line 132B, to another transistor outside circuit structure 100A. In yet another example, additionally or alternatively, bottom VD via 126 (shown in dotted line as an optional element) electrically connects drain terminal 130B to power conductive line 120 to receive, e.g., a VSS voltage.

In the example configuration in FIG. 1A, signal conductive line 132B includes two disconnected sections aligned along the X direction. However, in at least one embodiment, the two sections are continuous and signal conductive line 132B extends continuously from under drain terminal 130A to under source terminal 114B. In at least one embodiment, drain terminal 130A is electrically coupled to source terminal 114B through VTB 134, continuous signal conductive line 132B, and bottom VD via 136. In some embodiments, one or more other signal conductive lines described herein (e.g., 109A, 109B, 132A) comprises aligned but disconnected sections as exemplarily illustrated for signal conductive line 132B in FIG. 1A.

Figure 1B:
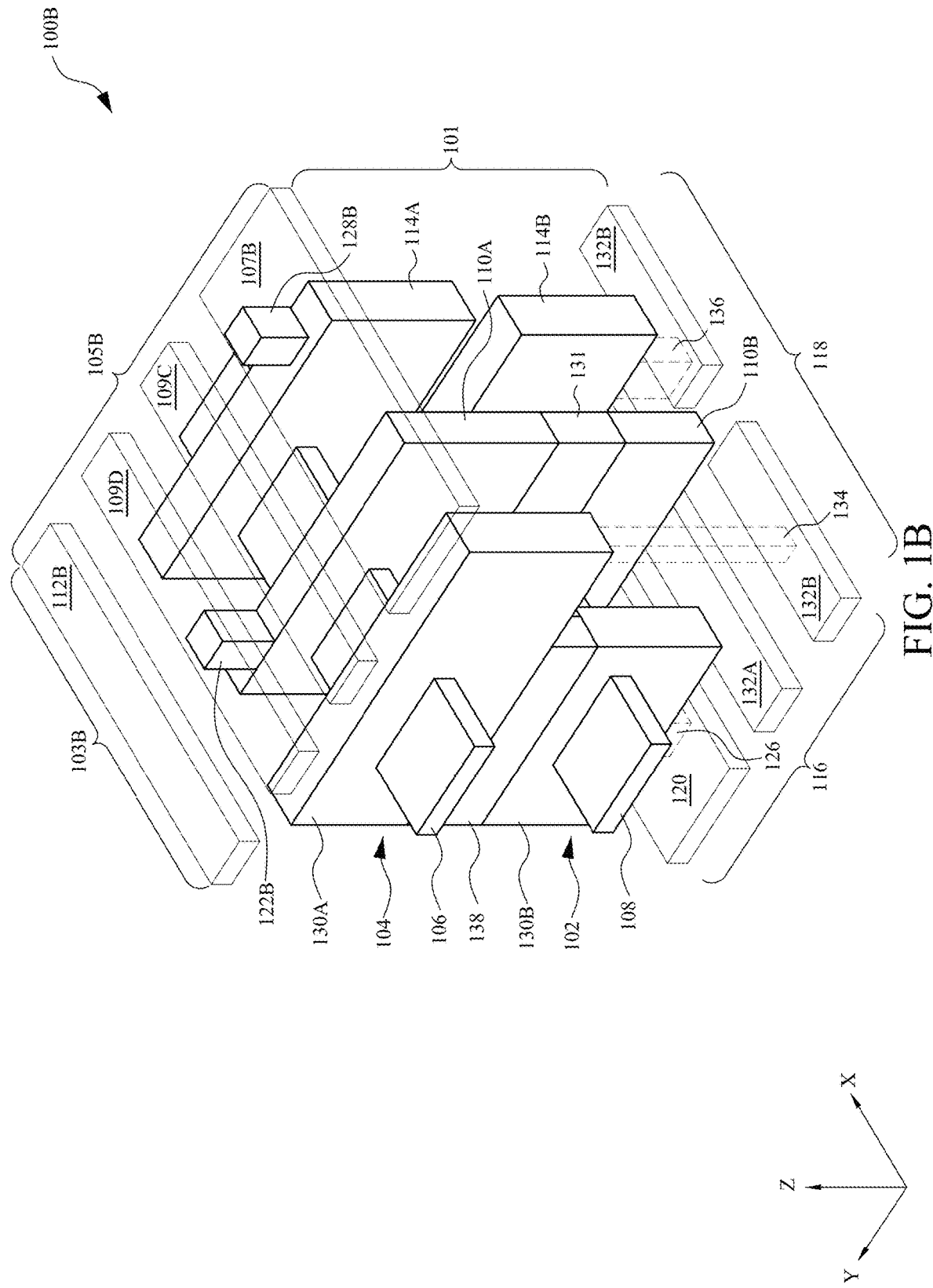
FIG. 1B is a schematic perspective view of a circuit structure, in accordance with some embodiments.

In accordance with some embodiments, FIG. 1B is a schematic perspective view of a circuit structure 100B (also referred to herein as a "cell") having power conductive line 107B, signal conductive lines 109C, 109D, and shielding conductive line 112B in a front-side conductive layer 105B. In some embodiments, a circuit structure 100B includes a substrate (260 FIG. 2C) that includes a first transistor stack 101 over the substrate where a first transistor 102 is a first conductivity type, and a second transistor 104, above first transistor 102, where second transistor 104 is a second conductivity type different from the first conductivity type. Circuit structure 100B also includes a plurality of first conductive lines 103B in a first metal layer 105B above first transistor stack 101. A plurality of first conductive lines 103B over first transistor stack 101 includes a power conductive line 107B configured to route power to first transistor stack 101, one or more signal conductive lines 109C, 109D (hereinafter referred to as signal conductive lines 109E) configured to route signals to first transistor stack 101, and a shielding conductive line 112B configured to shield the routed signals on one or more signal conductive lines 109E, where one or more signal conductive lines 109E are between power conductive line 107B and shielding conductive line 112B.

In some embodiments, circuit structures 100A and 100B are alike in back-side metal layer 116 and transistor stack 101. Compared to circuit structure 100A, circuit structure 100B does not include a via connection from front-side metal layer 105B to drain terminal 130A, via 122B is electrically connected to front-side signal conductive line 109D, and gate terminal 110A and via 128B are electrically connected to front-side power conductive line 107B and source terminal 114A.

In some embodiments, circuit structure 100B is like circuit structure 100A and includes front-side signal conductive lines 109C, 109D in front-side metal layer 105B and also back-side metal layer 116 having back-side signal conductive lines 132 which are asymmetrical to front-side signal conductive lines 109C, 109D. Additionally or alternatively, front-side signal conductive line 109D is conductively connected to gate terminal 110A through top gate via 122B and configured as an input signal conductive line of circuit structure 100B. In some embodiments, back-side signal conductive line 132B is conductively connected to drain terminal 130A through VTB 134 and configured as an output signal conductive line of circuit structure 100B.

In some embodiments, first metal layer 105B including first conductive lines 103B that includes power conductive line 107B, signal conductive lines 109C, 109D, and shielding conductive line 112B, second conductive lines 118 that includes power conductive line 120 and signal conductive lines 132A, 132B (hereinafter referred to as signal conductive lines 132), and vias (122B, 126, 134, 128B, 136) are one or more conductive materials, e.g., a metal such as copper, aluminum, tungsten, titanium, polysilicon, or another material capable of providing a low resistance signal path. In some embodiments, shielding conductive line 112B is a floating conductive line or shielding conductive line 112B is connected to a reference voltage (e.g., VDD, VSS or any voltage on circuit 100B). Additionally or alternatively, shielding conductive line 112B shields, prevents and/or reduces signal interference or signal cross-talk between signals on signal conductive lines 109C, 109D and signals on other neighboring circuit structures or cells.

In some embodiments, circuit structure 100B includes a first transistor 102, an NMOS device, and a second transistor 104, a PMOS device. First transistor 102 is sometimes referred to as "bottom device" or "bottom transistor," and second transistor 104 is sometimes referred to as "top device" or "top transistor." Additionally or alternatively, gate terminals 110B, 110A (hereinafter referred to as gate terminal 110) of first transistor 102 and second transistor 104 are electrically connected together by a gate connection 131, while functioning as an input terminal receiving a signal, through a top gate via 122B (also referred to as via-to-gate, or VG), from signal conductive line 109D. In at least one embodiment, gate connection 131 is omitted. In some embodiments, a bottom VG via (not shown) is provided to couple gate terminal 110B of the bottom device, i.e., first transistor 102, to a signal conductive line 132A, 132B on the metal layer 116. An example of a bottom VG via is described with respect to FIG. 1E.

In some embodiments, drain terminals 130A, 130B (hereinafter referred to as drain terminals 130) of second transistor 104 and first transistor 102 are connected together by an MDLI 138, while functioning as an output terminal outputting a signal, through via 134 (also referred to as VTB, or via top to bottom), to signal conductive line 132B. In at least one embodiment, a similar MDLI is provided between source terminal 114A of second transistor 104 and source terminal 114B of first transistor 102. In one or more embodiments, either or both of the described MDLI is/are omitted. Additionally or alternatively, source terminal 114A of second transistor 104 is maintained at the supply voltage VDD through top VD via 128B electrically connected to power conductive line 107A, and source terminal 114B of first transistor 102 is maintained at the supply voltage VSS through bottom via 140 (not shown in FIG. 1A but indicated in FIG. 1E) electrically connected to power conductive line 120. Source terminals/drain terminals are also referred to as metal-to-device (MD) contact structures. The described "source terminal" and/or "drain terminal" are examples, and can be reversed as "drain terminal" and/or "source terminal" in one or more embodiments.

In some embodiments, circuit structure 100B includes a P-type active-region semiconductor structure 106 and an N-type active-region semiconductor structure 108 extending in the X-direction. Additionally or alternatively, the X-direction, the Y-direction, and the Z-direction, in FIG. 1B and other FIGS. throughout the disclosure are mutually orthogonal to each other and form an orthogonal coordinate frame. In some embodiments, P-type active-region semiconductor structure 106 is stacked with N-type active-region semiconductor structure 108 along the Z-direction. Additionally or alternatively, gate terminal 110 extending in the Y-direction intersects both P-type active-region semiconductor structure 106 and N-type active-region semiconductor structure 108. In some embodiments, gate terminal 110 functions as two stacked gate terminals 110A, 110B, conductively joined together: one gate terminal 110A intersects P-type active-region semiconductor structure 106 at a channel region of second transistor 104, and another gate terminal 110B intersects N-type active-region semiconductor structure 108 at a channel region of first transistor 102. Additionally or alternatively, gate terminal 110A of second transistor 104 is conductively connected to gate terminal 110B of first transistor 102 through gate connection 131. In some embodiments, each of P-type active-region semiconductor structure 106 and N-type active-region semiconductor structure 108 includes one or more nano-sheets, and consequently, each of second transistor 104 and first transistor 102 is a nano-sheet transistor. Additionally or alternatively, each of P-type active-region semiconductor structure 106 and N-type active-region semiconductor structure 108 includes one or more nano-wires, and consequently, each of second transistor 104 and first transistor 102 is a nano-wire transistor.

In some embodiments, circuit structure 100B includes conductive segments including source terminals 114 and drain terminals 130. Additionally or alternatively, each of source terminal 114 and drain terminal 130, extend in the Y-direction and intersect P-type active-region semiconductor structure 106 of second transistor 104. In some embodiments, each of source terminal 114 and drain terminal 130, extend in the Y-direction and intersect N-type active-region semiconductor structure 108 of first transistor 102. Additionally or alternatively, drain terminal 130A and drain terminal 130B are conductively connected through MDLI 138. In some embodiments, source terminal 114A of second transistor 104 is conductively connected to front-side power conductive line 107B through a top via 128B, and source terminal 114B of the first transistor 102 is conductively connected to back-side power conductive line 120 through a bottom via 140 (FIG. 1E). Additionally or alternatively, front-side power conductive line 107B is configured to be held at a first supply voltage VDD, and back-side power conductive line 120 is configured to be held at a second supply voltage VSS.

In some embodiments, front-side power conductive line 107B extends in the X-direction in front-side metal layer 105B. Additionally or alternatively, back-side power conductive line 120 extends in the X-direction in back-side metal layer 116. In some embodiments, each of front-side metal layer 105B and the back-side metal layer 116 is in a plane having the normal vector orientated towards the Z-direction. Additionally or alternatively, front-side metal layer 105B is above both P-type active-region semiconductor structure 106 and N-type active-region semiconductor structure 108. In some embodiments, back-side metal layer 116 is below both P-type active-region semiconductor structure 106 and N-type active-region semiconductor structure 108. Additionally or alternatively, back-side metal layer 116 is fabricated on a substrate (260 FIG. 2C) as a buried conductive layer, and, N-type active-region semiconductor structure 108 is fabricated above the buried conductive layer. In some embodiments, P-type active-region semiconductor structure 106 is fabricated above N-type active-region semiconductor structure 108, and front-side metal layer 105B is fabricated above P-type active-region semiconductor structure 106. Additionally or alternatively, other arrangements of back-side metal layer 116 are also discussed in the disclosure (see, e.g., FIGS. 3A-4D). In some embodiments, conductive lines in front-side metal layer 105B and conductive lines in back-side metal layer 116 are asymmetrical to one another.

In some embodiments, circuit structure 100B includes front-side signal conductive lines 109C, 109D in front-side metal layer 105B and also back-side metal layer 116 includes back-side signal conductive lines 132.

In some embodiments, front-side signal conductive line 109D is conductively connected to gate terminal 110A through a top gate via 122B and configured as an input signal conductive line of circuit structure 100B. Additionally or alternatively, back-side signal conductive lines 132 are configured to route signals between neighboring cells or circuit structures at opposite sides of circuit structure 100B. For example, in some embodiments, through VTB 134 (shown in dotted line as an optional element) connected to drain terminal 130A, an output of transistor stack 101 is routed through signal conductive line 132B. In this structure, as discussed above, drain terminal 130A of second transistor 104 is connected, through VTB 134, to another transistor outside circuit structure 100B, when a gate and/or a source terminal/drain terminal of such another transistor is electrically coupled to the signal conductive line 132B. In another example, additionally or alternatively, via 136 (shown in dotted line as an optional element—also referred to as bottom VD) electrically connects source terminal 114B to signal conductive line 132B. In this structure, source terminal 114B of first transistor 102 is connected, through bottom VD via 136 and signal conductive line 132B, to another transistor outside circuit structure 100B. In yet another example, additionally or alternatively, bottom VD via 126 (shown in dotted line as an optional element) electrically connects drain terminal 130B to power conductive line 120 to receive, e.g., a VSS voltage.

In the example configuration in FIG. 1B, signal conductive line 132B includes two disconnected sections aligned along the X direction. However, in at least one embodiment, the two sections are continuous and signal conductive line 132B extends continuously from under drain terminal 130A to under source terminal 114B. In at least one embodiment, drain terminal 130A is electrically coupled to source terminal 114B through VTB 134, continuous signal conductive line 132B, and bottom VD via 136. In some embodiments, one or more other signal conductive lines described herein (e.g., 109C, 109D, 132A) comprises aligned but disconnected sections as exemplarily illustrated for signal conductive line 132B in FIG. 1B.

Figures 1C, 1D:
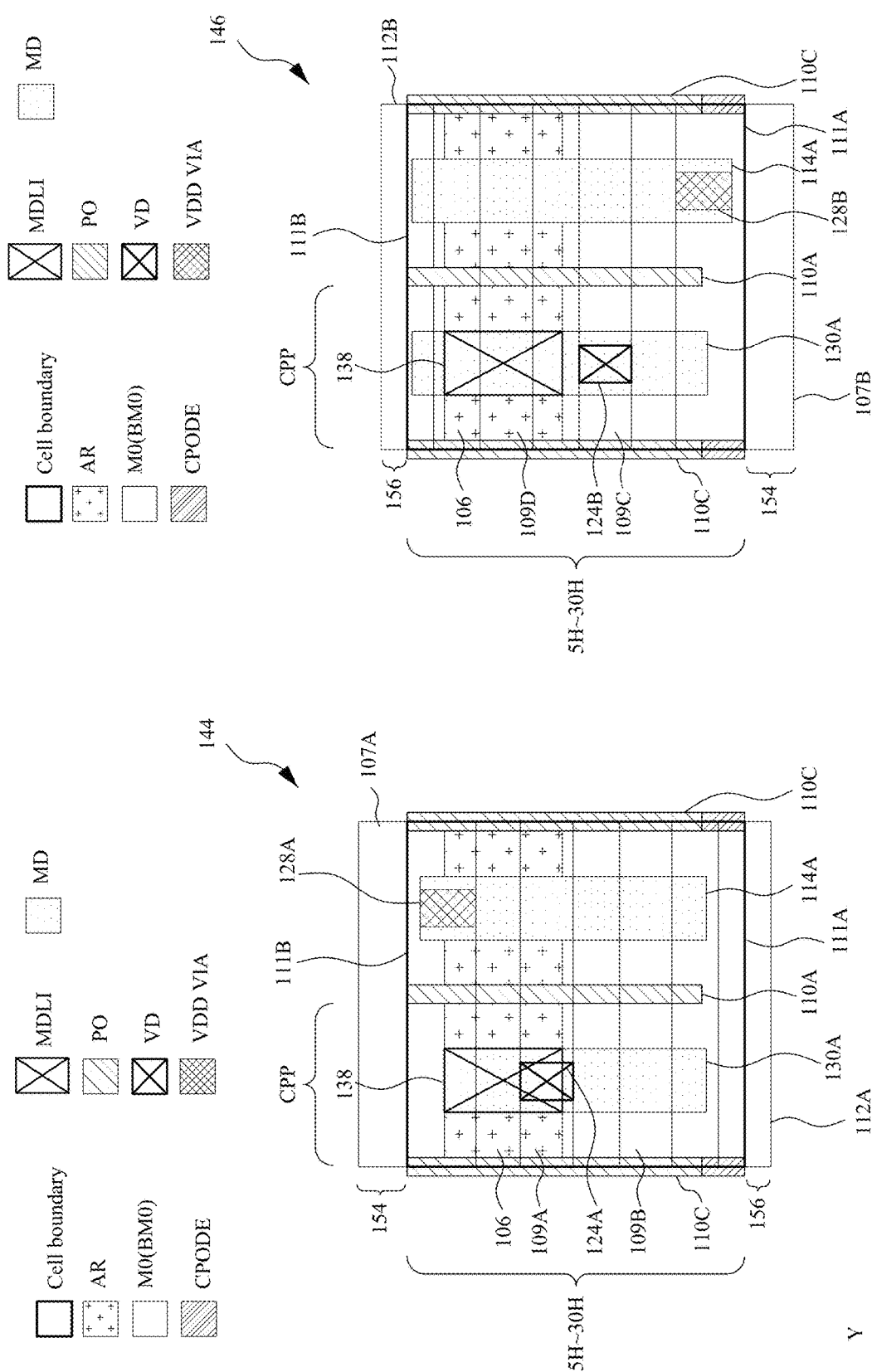
FIGS. 1C, 1D, and 1E are layout diagrams of circuit structures, in accordance with some embodiments.
Figure 1E:
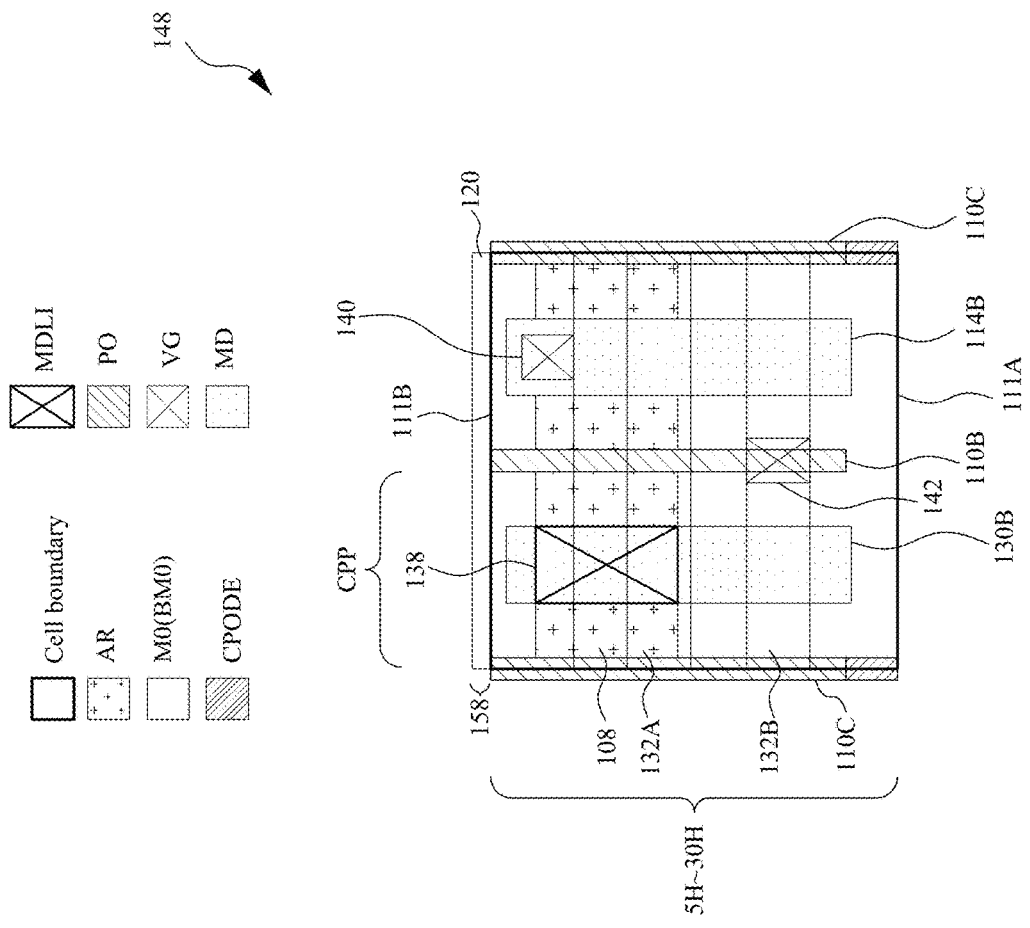

In accordance with some embodiments, FIGS. 1C, 1D, and 1E are layout diagrams of circuit structures configured as inverter circuit structures. In some embodiments, FIG. 1C is a layout diagram of circuit structure 100A, specifically front-side metal layer 105A and second transistor 104 in the Z-direction. In some embodiments, FIG. 1D is a layout diagram of circuit structure 100B, specifically front-side metal layer 105B and second transistor 104 in the Z-direction. In some embodiments, FIG. 1E is a layout diagram of either circuit structure 100A or circuit structure 100B, specifically back-side metal layer 116 and first transistor 102 in the Z-direction, as the back-side metal layer and first transistor do not change between circuit structures 100A and 100B.

In some embodiments, layout diagrams 144, 146, and 148 are inverter circuit structures with a 2 CPP. In some embodiments, CPP is an abbreviation of the term 'contact poly pitch'. In some embodiments, CPP is the center-to-center distance between adjacent gate patterns corresponding to gate terminals (electrodes) in a semiconductor device produced by a process technology node associated with layout diagrams such as layout diagrams 144, 146, and 148. Additionally or alternatively, H is represented as the height of each of active-region semiconductor structures 106, 108 along the Z-direction as described with respect to FIG. 2C. In some embodiments, a cell height, represented as the distance between cell boundary 111A and 111B, along the Y direction in each of layout diagrams 144, 146 and 148 is between 5H and 30H. Additionally or alternatively, cell boundary lines 111A and 111B, together with dummy gate-strip patterns 110C (discussed below), act as edges of a cell boundary (also referred to as "place-and-route boundary") that are placed in abutment with edges of the cell boundaries of neighboring cells. Layout diagrams 144, 146, and 148 as well circuit structures 100A, 100B correspond to cells which have, along the Y direction, one stack of active-region semiconductor structures 106, 108 and are referred to as single cell height cells. Other examples of single cell height cells are described with respect to FIGS. 3A-3F. Examples of double cell height cells are described with respect to FIGS. 2A-2C, 4A-4D, 5A-5B which describe cells with two stacks of active-region semiconductor structures along the Y direction.

In some embodiments, the layout diagram in FIG. 1C includes a layout diagram 144 for a top portion or top device of circuit structure 100A, including P-type active-region semiconductor structure 106, gate terminal 110A, drain terminal 130A and source terminal 114A, front-side signal conductive lines 109A and 109B, front-side power conductive line 107A, shielding conductive line 112A and various vias 124A and 128A.

In some embodiments, the layout diagram in FIG. 1D includes a layout diagram 146 for a top portion or top device of circuit structure 100B, including P-type active-region semiconductor structure 106, gate terminal 110A, drain terminal 130A and source terminal 114A, the front-side signal conductive lines 109C and 109D, front-side power conductive line 107B, shielding conductive line 112B and various vias 124B and 128B.

In some embodiments, the layout diagram in FIG. 1E includes layout diagram 148 for a bottom portion or bottom device of circuit structure 100A or 100B, including N-type active-region semiconductor structure 108, gate terminal 130B, source terminal 114B, drain terminal 130B, back-side power conductive line 120, signal conductive lines 132A, 132B, MDLI 138, and various vias, VSS via 140 and gate via 142. The gate via 142 is a bottom VG via functionally corresponding to VG via 122A in FIG. 1A. In some embodiments, one VG via (either VG 122A in FIG. 1A or bottom VG 142 in FIG. 1E) is sufficient to electrically couple both gate terminals 110A, 110B to an input of the inverter, because gate terminals 110A, 110B are already connected together by gate connection 131.

In some embodiments, each of P-type active-region semiconductor structure 106, N-type active-region semiconductor structure 108, front-side signal conductive lines 109, 109E, and front-side power conductive line 107A, 107B, front-side shielding conductive line 112A, 112B, back-side signal conductive lines 132, and back-side power conductive line 120 are extending in the X-direction. Additionally or alternatively, gate terminal 110 extends in the Y-direction and intersects P-type active-region semiconductor structure 106 at a channel region of second transistor 104. In some embodiments, source terminal 114 extends in the Y-direction and intersects P-type active-region semiconductor structure 106 at a channel region of second transistor 104. Additionally or alternatively, drain terminal 130 extends in the Y-direction and intersects P-type active-region semiconductor structure 106 at a channel region of second transistor 104.

In some embodiments, via 128A, 128B electrically connects corresponding source terminal 114A and front-side power conductive line 107A, 107B. Additionally or alternatively, via 142 electrically connects gate terminal 110B and back-side signal conductive line 132B.

In some embodiments, each of N-type active-region semi-conductor structure 108, the back-side signal conductive lines 132, and back-side power conductive line 120 extend in the X-direction. Additionally or alternatively, gate terminal 110 extends in the Y-direction and intersects N-type active-region semiconductor structure 108 at a channel region of first transistor 102. In some embodiments, source terminal 114B extends in the Y-direction and intersects N-type active-region semiconductor structure 108. Additionally or alternatively, drain terminal 130B extends in the Y-direction and intersects N-type active-region semiconductor structure 108 at a channel region of first transistor 102. In some embodiments, via 140 provides electrical connection between source terminal 114B and back-side power conductive line 120.

In some embodiments, FIGS. 1C, 1D, and 1E also include dummy gate-strip patterns 110C at the edges of layout diagrams 144, 146, 148. In some embodiments, the intersections between dummy gate-strip patterns 110C and the layout diagram of P-type active-region semiconductor structure 106 are for isolating P-type active-region semiconductor structure 106 from active-regions in neighboring cells. Additionally or alternatively, the intersections between dummy gate-strip patterns 110C and the layout diagram of N-type active-region semiconductor structure 108 isolate N-type active-region semiconductor structure 108 from active-regions in neighboring cells. In some embodiments, the isolation regions in active-region semiconductor structures 106, 108 are created based on the poly on oxide definition edge (PODE) technology or based on the continuous poly on oxide definition edge (CPODE) technology. Additionally or alternatively, other suitable technologies for generating the isolation regions in active-region semiconductor structures 106, 108 are also within the contemplated scope of present disclosure.

In some embodiments, the cell height of layout diagrams 144, 146, and 148 does not change with the addition of shielding conductive line 112A, 112B. Additionally or alternatively, shielding conductive line 112A, 112B is added to front-side conductive layer 105A, 105B. Additionally or alternatively, a wide power conductive line lowers resistance and Joule heating. In some embodiments, a wide power conductive line allows for a merged or shared power conductive line with abutting stacked cells. Additionally or alternatively, a single shielding conductive line is shared with adjacent stacked cells.

In some embodiments, as is discussed below in greater detail, when vertical abutting (i.e., abutting along the Y-direction) of stacked transistor cells is implemented, sharing a common power conductive line and/or a common shielding conductive line is achieved between top transistors of abutting cells. Additionally or alternatively, in FIGS. 1C and 1D, each of power conductive line 107A and 107B has a length of overhang 154 that extends outside of layout diagrams 144 and 146. In some embodiments, layout diagrams 144 and 146 have a certain amount of overhang 156 from shielding conductive lines 112A and 112B. Additionally or alternatively, each of overhangs 154 and 156 provides for electrical connections to adjoining cells for the sharing of power conductive lines 107A, 107B or shielding conductive lines 112A, 112B. In some embodiments, the aspect of a common power conductive line or a common shielding conductive line are discussed in greater detail below. Additionally or alternatively, power conductive line 120 in FIG. 1E additionally has a back-side overhang 158. In some embodiments, back-side overhang 158 is used to couple power to one or more other first/bottom transistors of one or more adjoining/abutting cells.

Figure 2A:
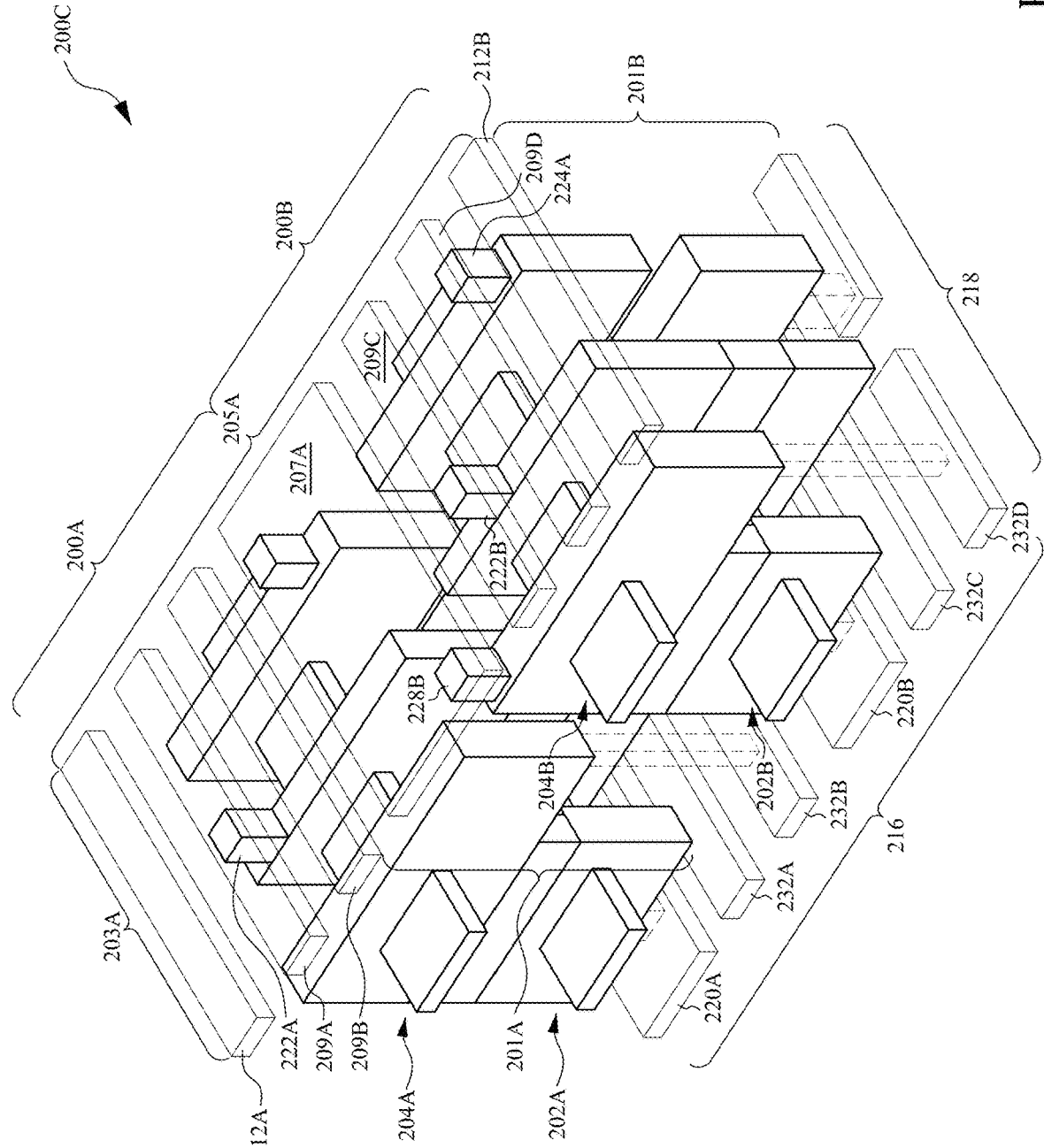
FIG. 2A is a schematic perspective view of a circuit structure, in accordance with some embodiments.

In accordance with some embodiments, FIG. 2A is a schematic perspective view of a circuit structure 200C that combines a top cell circuit structure 200A and a bottom cell circuit structure 200B at a common power conductive line 207A. Additionally or alternatively, power conductive line 207A of first transistor stack 201A extends partially over second transistor stack 201B and is configured to route power to both first transistor stack 201A and second transistor stack 201B. Circuit structure 200A abuts or adjoins circuit structure 200B in the Y-direction. Circuit structure 200A is arranged further towards a positive orientation of the Y direction than circuit structure 200B, and is referred to as "top cell" or "top cell circuit structure." Thus, circuit structure 200B is referred to as "bottom cell" or "bottom cell circuit structure." In some embodiments, circuit structure 200C corresponds to a double cell height cell.

In some embodiments, a circuit structure 200C includes a substrate (260 FIG. 2C) that includes a first transistor stack 201A and a second transistor stack 201B over the substrate where first transistors 202A, 202B are a first conductivity type, and second transistors 204A, 204B are above corresponding first transistors 202A, 202B, where second transistors 204A, 204B are a second conductivity type different from the first conductivity type. Circuit structure 200C also includes a plurality of first conductive lines 203A in a first metal layer 205A above transistor stacks 201A, 201B. A plurality of first conductive lines 203A over transistor stacks 201A, 201B includes a power conductive line 207A configured to route power to transistor stacks 201A, 201B, one or more signal conductive lines 209A, 209B, 209C, 209D (hereinafter referred to as signal conductive lines 209) configured to route signals to transistor stacks 201A, 201B, and one or more shielding conductive lines 212A, 212B configured to shield the routed signals on one or more signal conductive lines 209, where one or more signal conductive lines 209 are between power conductive line 207A and shielding conductive lines 212A, 212B.

In some embodiments, circuit structures 200A, 200B with transistor stacks 201A, 201B are like circuit structures 100A and 100B with transistor stacks 101. Additionally or alternatively, circuit structure 200C represents a combination of circuit structures 200A and 200B where circuit structures 200A and 200B are like circuit structures 100A and 100B and share a common power conductive line 207A that is like power conductive lines 107A or 107B.

In some embodiments, first metal layer 205A including first conductive lines 203A that includes power conductive line 207A, signal conductive lines 209, and shielding conductive lines 212A, 212B, second conductive lines 218 that includes power conductive lines 220A, 220B and signal conductive lines 232A, 232B, 232C, 232D (hereinafter referred to as signal conductive lines 232), and vias (222A, 222B, 224A, 228A, 228B) are one or more conductive materials, e.g., a metal such as copper, aluminum, tungsten, titanium, polysilicon, or another material capable of providing a low resistance signal path. In some embodiments, shielding conductive lines 212A, 212B is a floating conductive line or shielding conductive lines 212A, 212B is connected to a reference voltage (e.g., VDD, VSS or any voltage on circuit 200C). Additionally or alternatively, shielding conductive lines 212A, 212B shields, prevents and/or reduces signal interference or signal cross-talk between signals on signal conductive lines 209 and signals on other neighboring circuit structures or cells.

In some embodiments, circuit structure 200C includes first transistors 202A, 202B, an NMOS device, and second transistors 204A, 204B, a PMOS device. First transistors 202A, 202B is sometimes referred to as "bottom device" or "bottom transistor," and second transistor 204A, 204B is sometimes referred to as "top device" or "top transistor."

Figure 2B:
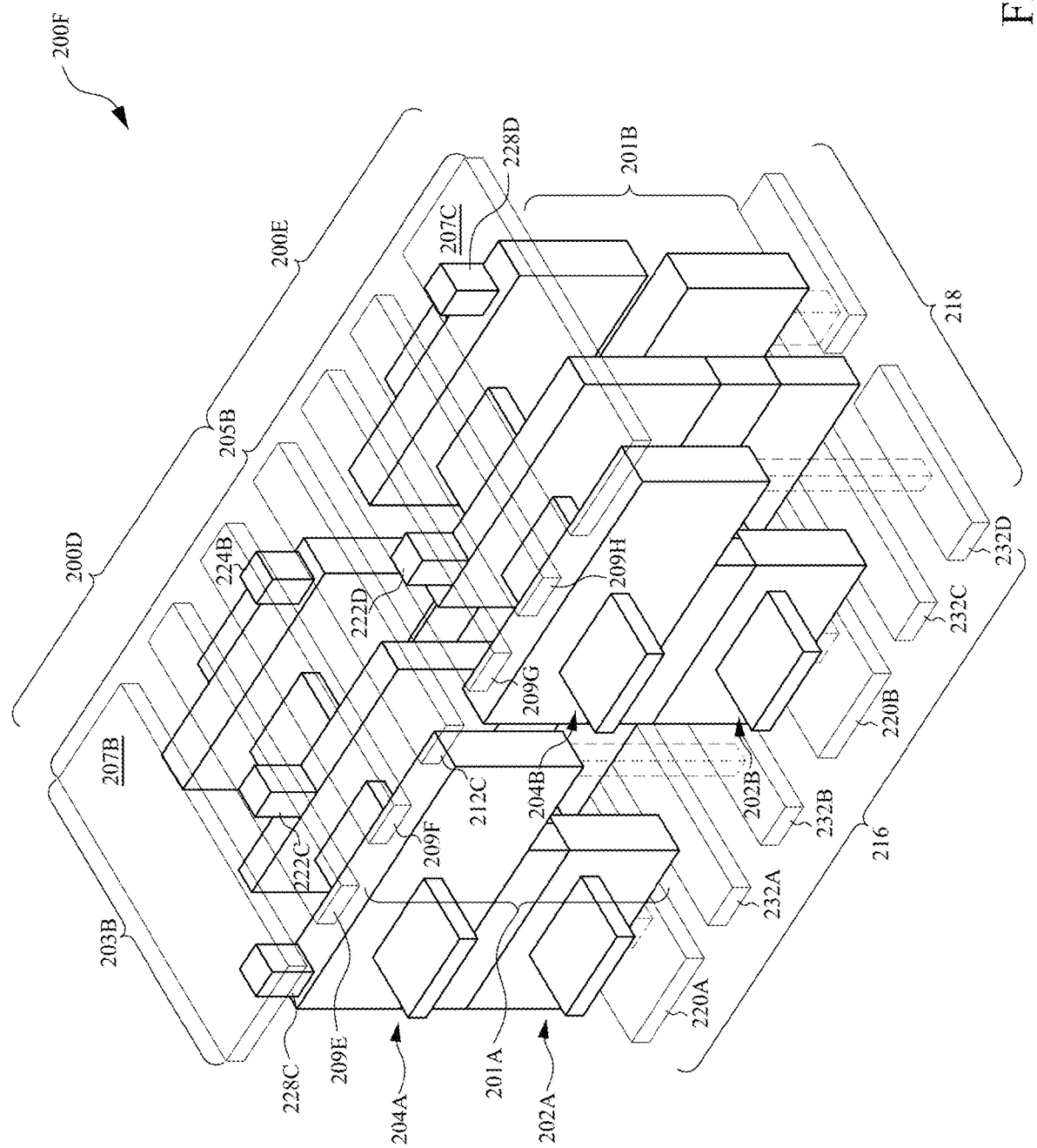
FIG. 2B is a schematic perspective view of a circuit structure, in accordance with some embodiments.

In accordance with some embodiments, FIG. 2B is a schematic perspective view of a circuit structure 200F that combines a top cell circuit structure 200D and a bottom cell circuit structure 200E at a common shielding conductive line 212C. Circuit structure 200D abuts or adjoins circuit structure 200E in the Y-direction. Circuit structure 200D is arranged further towards a positive orientation of the Y direction than circuit structure 200E, and is referred to as "top cell" or "top cell circuit structure." Thus, circuit structure 200E is referred to as "bottom cell" or "bottom cell circuit structure." In some embodiments, circuit structure 200F corresponds to a double cell height cell.

In some embodiments, circuit structures 200D, 200E with transistor stacks 201A, 201B are like circuit structures 100A and 100B with transistor stack 101. Additionally or alternatively, circuit structure 200F represents a combination of circuit structures 200D and 200E that are like each of circuit structures 100A and 100B and share a common shielding conductive line 212C that is like shielding conductive line 112A or 112B.

In some embodiments, circuit structure 200F includes a substrate (260 FIG. 2C) that includes a first transistor stack 201A and a second transistor stack 201B over the substrate where first transistors 202A, 202B are a first conductivity type. Second transistors 204A, 204B are above corresponding first transistors 202A, 202B, where second transistors 204A, 204B are a second conductivity type different from the first conductivity type. Circuit structure 200F also includes a plurality of first conductive lines 203B in a first metal layer 205B above transistor stacks 201A, 201B. Plurality of first conductive lines 203B over transistor stacks 201A, 201B includes power conductive lines 207B, 207C configured to route power to transistor stacks 201A, and 201B. One or more signal conductive lines 209E, 209F, 209G, 209H (hereinafter referred to as signal conductive lines 209I) configured to route signals to transistor stacks 201A, 201B; and one common shielding conductive line 212C configured to shield the routed signals on one or more signal conductive lines 209I, where one or more signal conductive lines 209I are between power conductive lines 207B, 207C and shielding conductive line 212C.

In some embodiments, first metal layer 205B including first conductive lines 203B that includes power conductive lines 207B, 207C, signal conductive lines 209I, and shielding conductive line 212C, second conductive lines 218 that includes power conductive lines 220A, 220B and signal conductive lines 232A, 232B, 232C, 232D (hereinafter referred to as signal conductive lines 232), and vias (222C, 222D, 224B, 228C, 228D) are one or more conductive materials, e.g., a metal such as copper, aluminum, tungsten, titanium, polysilicon, or another material capable of providing a low resistance signal path. In some embodiments, shielding conductive line 212C is a floating conductive line or shielding conductive line 212C is connected to a reference voltage (e.g., VDD, VSS or any voltage on circuit 200F). Additionally or alternatively, shielding conductive line 212C shields, prevents and/or reduces signal interference or signal cross-talk between signals on signal conductive lines 209I and signals on other neighboring circuit structures or cells.

In some embodiments, in a double cell height cell like circuit structure 200F, shielding conductive line 212C is configured as an internal signal conductive line for routing signals inside the cell. For example, shielding conductive line 212C is disconnected at the cell boundary so that signals on shielding conductive line 212C stay internal within the cell.

In some embodiments, circuit structure 200F includes first transistors 202A, 202B, an NMOS device, and second transistors 204A, 204B, a PMOS device. First transistors 202A, 202B is sometimes referred to as "bottom device" or "bottom transistor," and second transistor 204A, 204B is sometimes referred to as "top device" or "top transistor."

Figure 2C:
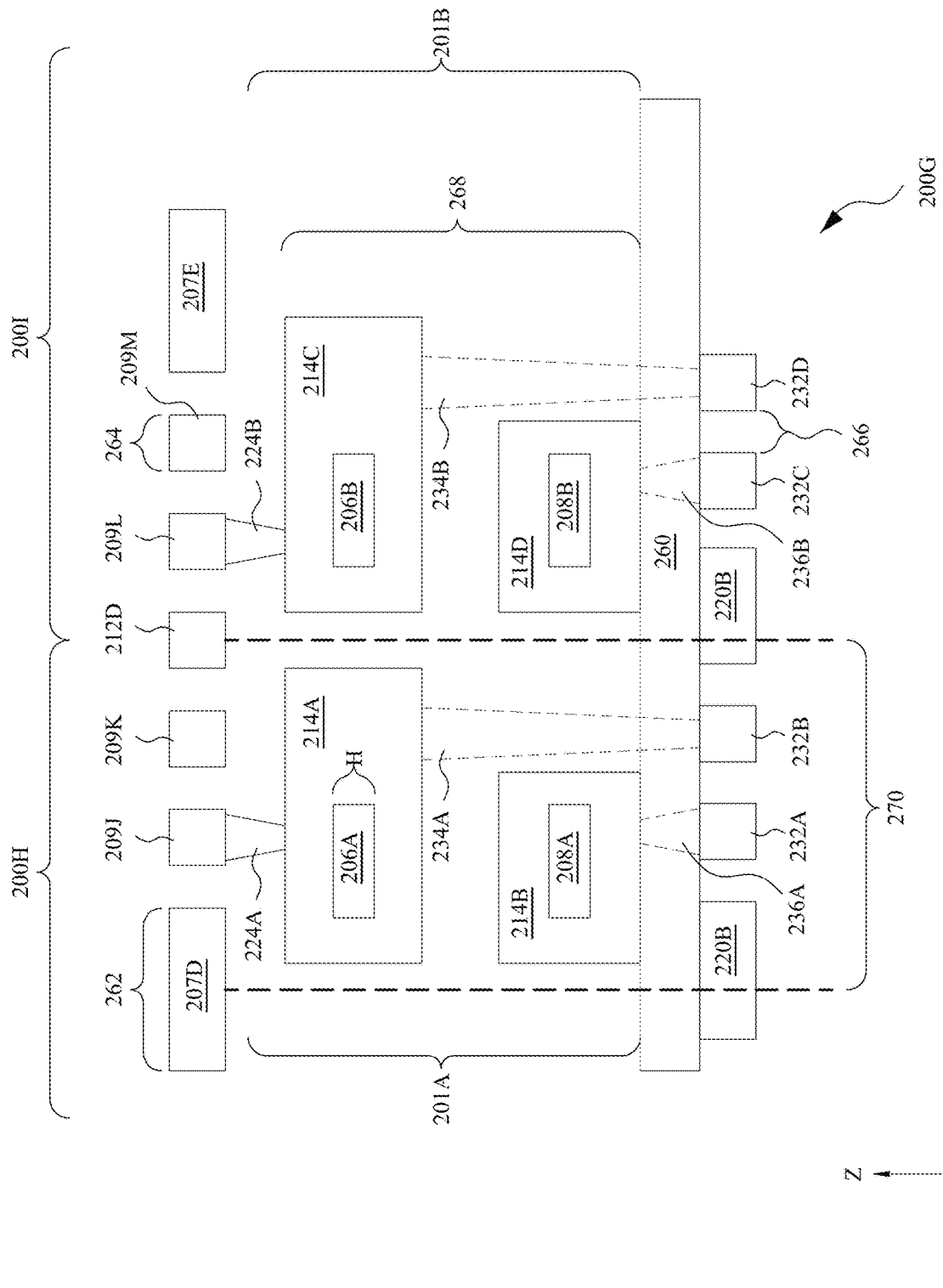
FIG. 2C is a schematic cross-sectional view of a circuit structure, in accordance with some embodiments.

In accordance with some embodiments, FIG. 2C is a schematic cross-sectional view of circuit structure 200G. In some embodiments, circuit structure 200G includes a substrate 260 that includes a first transistor stack 201A and a second transistor stack 201B over substrate 260.

In some embodiments, circuit structures 200H, 200I with transistor stacks 201A, 201B are like circuit structures 100A and 100B with transistor stack 101. Additionally or alternatively, circuit structure 200G represents a combination of circuit structures 200H and 200I that are like each of circuit structures 100A and 100B and share a common shielding conductive line 212D that is like shielding conductive line 112A or 112B.

In some embodiments, power conductive lines 207D, 207E have a width 262 of from 3H to 7H where H is represented as the height of active-region semiconductor structures 206A, 206B, 208A, 208B in the Z-direction. Additionally or alternatively, width 262 of power conductive lines 207D, 207E reduces the resistance of power conductive lines 207D, 207E and thus reduces Joule heating within power conductive lines 207D, 207E. In some embodiments, resistance within a conductor decreases proportionally as the cross-sectional area increases. Additionally or alternatively, Joule heating decreases as resistance decreases.

In some embodiments, signal conductive line 209M has a width 264 of from 0.5H and 3H, and the distance 266 between signal conductive lines 232C and 232D is from 0.5H and 3H. Additionally or alternatively, transistor stack height 268 is from 10H and 50H, and cell width 270 is from 5H and 30H.

In some embodiments, circuit structure 200G includes conductive segments including source terminals 214A, 214B, 214C and 214D and drain terminals (not shown). Additionally or alternatively, each of source terminal 214A, 214B, 214C and 214D and the drain terminal, extend in the Y-direction and intersect P-type active-region semiconductor structures 206A, 206B, of second transistors 204A, 204B. In some embodiments, each of source terminal 214A, 214B, 214C and 214D and the drain terminal, extend in the Y-direction and intersect N-type active-region semiconductor structure 208A, 208B of first transistors 202A, 202B. In some embodiments, source terminal 214A of second transistor 204A is conductively connected to front-side signal conductive line 209J through a top via 224A, and source terminal 214B of the first transistor 202A is conductively connected to back-side signal conductive line 232A through a bottom via 236A.

In some embodiments, top devices (or top transistors 204A, 204B) in abutted cells, such as in circuit structures 200H, 200I, have front-end features and VTBs (234A, 234B) that are stackable (or the same), and have back-end features with a mirror structure. In some embodiments, bottom devices (or bottom transistors 202A, 202B) in abutted cells, such as in circuit structure 200H, 200I, have both front-end features and back-end features that are stackable (or the same).

Front-end features include features manufactured in front-end-of-line (FEOL) fabrication, and back-end features include features manufactured in back-end-of-line (BEOL) fabrication. Examples of front-end features include PO, CPO, MD and OD features. Examples of back-end features include M0, BM0, VG, VD and CMD features. PO features correspond to where gates are formed, and CPO (cut-PO) features correspond to where gates are disconnected. MD features or MD contact structures correspond to where source terminal/drain terminals as described herein are formed, and CMD (cut-MD) features correspond to where MD contact structures are disconnected. OD features correspond to active regions (or active-region semiconductor structures). M0 features correspond to conductive patterns in a metal zero (M0) layer. In at least one embodiment, the conductive lines 207D, 209J, 209K, 212D, 209L, 209M and 107E over transistor stacks 201A, 201B are conductive patterns in the M0 layer. BM0 features correspond to conductive patterns in a backside metal zero (BM0) layer. In at least one embodiment, the conductive lines 220B, 232A, 232B, 220B, 232C, and 232D under transistor stacks 201A, 201B are conductive patterns in the BM0 layer. VG, VB (224A, 224B, 236A, 236B), and VD features correspond to various VG, VB and VD vias described herein.

In some embodiments, the front-end features and VTBs of the top transistors, e.g., 204A, 204B in FIGS. 2A-2B, are stackable (or the same), whereas the back-end features of the top transistors, e.g., 204A, 204B in FIGS. 2A-2B, have a mirror structure. For example, the conductive lines 203B over the top transistor 204A and the conductive lines 203B over the top transistor 204B are symmetrical to one another across a center line of common shielding conductive line 212C, as shown in FIGS. 2B-2C.

In some embodiments, the front-end features and back-end features of the bottom transistors, e.g., 202A, 202B in FIGS. 2A-2B, are stackable (or the same). For example, the conductive lines 216 under the bottom transistor 202A and the conductive lines 216 under the bottom transistor 202B are the same, as shown in FIGS. 2B-2C.

Figure 3A:
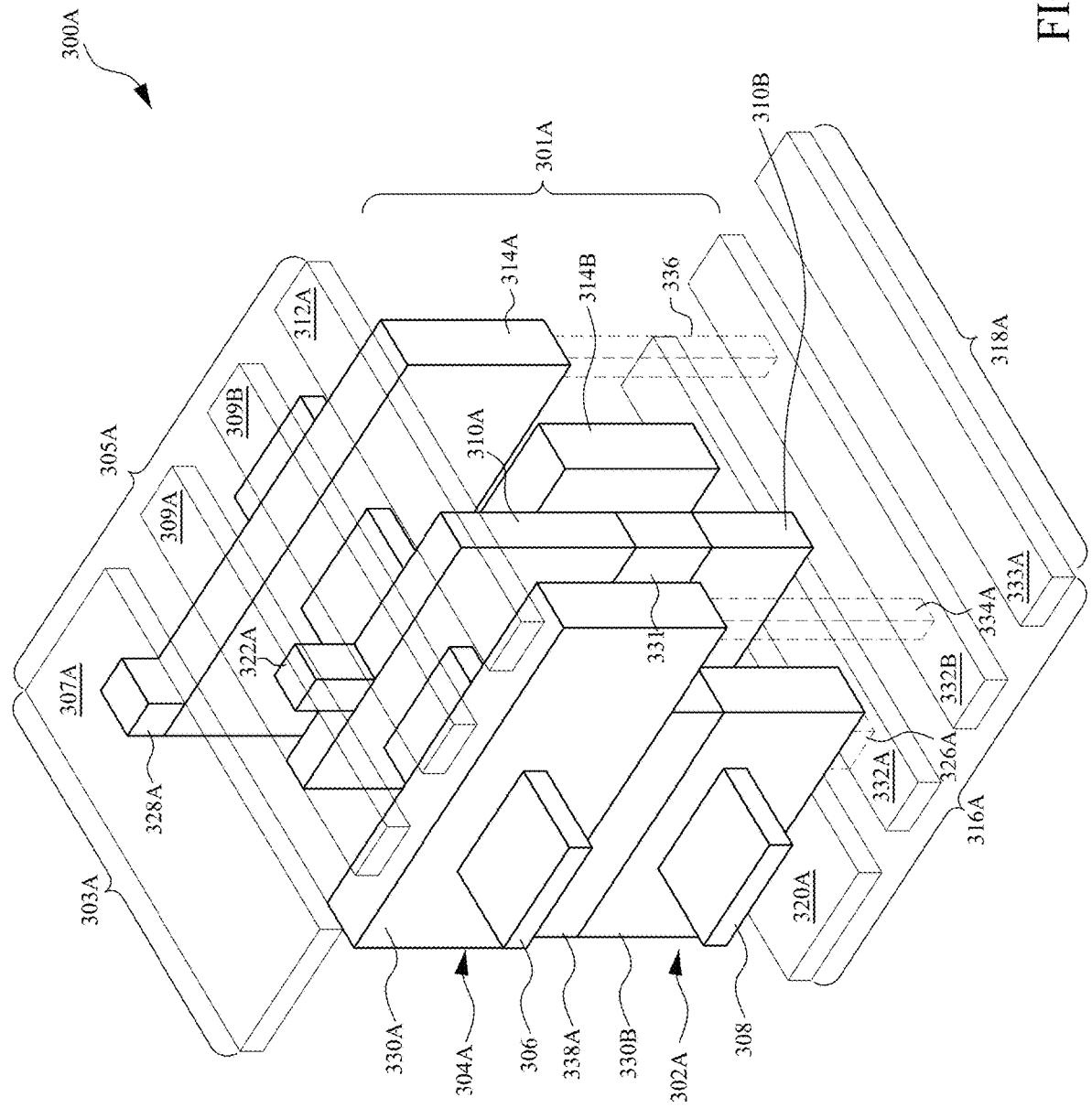
FIG. 3A is a schematic perspective view of a circuit structure, in accordance with some embodiments.

In accordance with some embodiments, FIG. 3A is a schematic perspective view of a circuit structure 300A (also referred to herein as a "cell"), implemented with a CFET, that includes power conductive line 307A, signal conductive lines 309A, 309B (hereinafter referred to as signal conductive line 309), and a shielding conductive line 312A in a front-side conductive layer 305A. Additionally or alternatively, circuit structure 300A includes a substrate (not shown in FIG. 3A, but corresponding to, e.g., 460 in FIG. 4C) and a first transistor stack 301A over the substrate. The first transistor stack 301A includes: a first transistor 302A where first transistor 302A is a first conductivity type; and a second transistor 304A, that is above the first transistor 302A, where second transistor 304A is a second conductivity type different from the first conductivity type. Circuit structure 300A also includes a plurality of first conductive lines 303A in a first metal layer 305A above first transistor stack 301A, a plurality of first conductive lines 303A electrically connected to first transistor stack 301A. Circuit structure 300A also includes a plurality of second conductive lines 318A in a second metal layer 316A below the substrate and underneath first transistor stack 301A, a plurality of second conductive lines 318A electrically connected to first transistor stack 301A. The plurality of first conductive lines 303A are configured asymmetrically with respect to the plurality of second conductive lines 318A.

In some embodiments, circuit structure 300A with front side conductive layer 305A, first conductive lines 303A, first transistor stack 301A, first transistor 302A and second transistor 304A are like circuit structure 100A with front side conductive layer 105A, first conductive lines 103A, first transistor stack 101, first transistor 102 and second transistor 104. Additionally or alternatively, circuit structure 300A includes an additional back-side shielding conductive line 333A. In some embodiments, additional shielding conductive line 333A is the main difference between circuit structure 300A and 100A. Additionally or alternatively, shielding conductive line 333A is a floating line or is connected to a reference voltage (e.g., VDD, VSS or any other voltage in between) to shield/prevent/reduce signal interference or cross talk between signals on 332A, 332B and signals on signal conductive lines of other/neighboring circuit structures/cells.

In some embodiments, circuit structure 300A includes a first transistor 302A, an NMOS device, and a second transistor 304A, a PMOS device. First transistor 302A is sometimes referred to as "bottom device" or "bottom transistor," and second transistor 304A is sometimes referred to as "top device" or "top transistor." Additionally or alternatively, gate terminals 310B, 310A (hereinafter referred to as gate terminal 310) of first transistor 302A and second transistor 304A are electrically connected together by a gate connection 331 while functioning as an input terminal receiving a signal, through a top gate via 322A (also referred to as via-to-gate, or VG) from signal conductive line 309A. In some embodiments, drain terminals 330A, 330B (hereinafter referred to as drain terminals 330) of second transistor 304A and first transistor 302A are connected together while functioning as an output terminal, through via 334A to signal conductive line 332B or through via 326A to signal conductive line 332A. Additionally or alternatively, source terminal 314A of second transistor 304A is maintained at the supply voltage VDD through via 328A electrically connected to power conductive line 307A and source terminal 314B of first transistor 304A is maintained at the supply voltage VSS through via 340A (FIG. 3E) electrically connected to power conductive line 320A. In at least one embodiment, gate connection 331 is omitted. In some embodiments, a bottom VG via (not shown) is provided to couple gate terminal 310B of the bottom device, i.e., first transistor 302A, to a signal conductive line 332A, 332B on the back-side metal layer 316A. An example of a bottom VG via is described with respect to FIGS. 3E-3F.

In some embodiments, drain terminals 330A, 330B (hereinafter referred to as drain terminals 330) of second transistor 304A and first transistor 302A are connected together by an MDLI 138, while functioning as an output terminal outputting a signal, through via 334A (also referred to as top via-top-to-bottom, or top VTB), to signal conductive line 332B. In at least one embodiment, a similar MDLI is provided between source terminal 314A of second transistor 304A and source terminal 314B of first transistor 302A. In one or more embodiments, either or both of the described MDLI is/are omitted. Additionally or alternatively, source terminal 314A of second transistor 304A is maintained at the supply voltage VDD through top VD via 328A electrically connected to power conductive line 307A, and source terminal 314B of first transistor 302A is maintained at the supply voltage VSS through via 340A (not shown in FIG. 3A but indicated in FIG. 3E) electrically connected to power conductive line 320A. Source terminals/drain terminals are also referred to as metal-to-device (MD) contact structures. The described "source terminal" and/or "drain terminal" are examples, and can be reversed as "drain terminal" and/or "source terminal" in one or more embodiments.

In some embodiments, circuit structure 300A includes a P-type active-region semiconductor structure 306 and an N-type active-region semiconductor structure 308 extending in the X-direction. In some embodiments, P-type active-region semiconductor structure 306 is stacked with N-type active-region semiconductor structure 308 along the Z-direction. Additionally or alternatively, gate terminal 310 extending in the Y-direction intersects both P-type active-region semiconductor structure 306 and N-type active-region semiconductor structure 308. In some embodiments, gate terminal 310 functions as two stacked gate terminals 310A, 310B, conductively joined together: one gate terminal 310A intersects P-type active-region semiconductor structure 306 at a channel region of second transistor 304A, and another gate terminal 310B intersects N-type active-region semiconductor structure 308 at a channel region of first transistor 302A. Additionally or alternatively, gate terminal 310A of second transistor 304A is conductively connected to gate terminal 310B of first transistor 302A through gate connection 331. In some embodiments, each of P-type active-region semiconductor structure 306 and N-type active-region semiconductor structure 308 includes one or more nano-sheets, and consequently, each of second transistor 304A and first transistor 302A is a nano-sheet transistor. Additionally or alternatively, each of P-type active-region semiconductor structure 306 and N-type active-region semiconductor structure 308 includes one or more nano-wires, and consequently, each of second transistor 304A and first transistor 302A is a nano-wire transistor.

In some embodiments, circuit structure 300A includes conductive segments including source terminals 314 and drain terminals 330. Additionally or alternatively, each of source terminal 314 and drain terminal 330, extend in the Y-direction and intersect P-type active-region semiconductor structure 306 of second transistor 304A. In some embodiments, each of source terminal 314 and drain terminal 330, extend in the Y-direction and intersect N-type active-region semiconductor structure 308 of first transistor 302A. Additionally or alternatively, drain terminal 330A and drain terminal 330B are conductively connected through MDLI 338A. In some embodiments, source terminal 314A of second transistor 304A is conductively connected to front-side power conductive line 307A through a top via 328A, and source terminal 314B of the first transistor 302A is conductively connected to back-side power conductive line 320A through a bottom via 340A (FIG. 3E). Additionally or alternatively, front-side power conductive line 307A is configured to be held at a first supply voltage VDD, and back-side power conductive line 320A is configured to be held at a second supply voltage VSS.

In some embodiments, front-side power conductive line 307A extends in the X-direction in front-side metal layer 305A. Additionally or alternatively, back-side power conductive line 320A extends in the X-direction in back-side metal layer 316A. In some embodiments, each of front-side metal layer 305A and the back-side metal layer 316A is in a plane having the normal vector orientated towards the Z-direction. Additionally or alternatively, front-side metal layer 305A is above both P-type active-region semiconductor structure 306 and N-type active-region semiconductor structure 308. In some embodiments, back-side metal layer 316A is below both P-type active-region semiconductor structure 306 and N-type active-region semiconductor structure 308. Additionally or alternatively, back-side metal layer 316A is fabricated on a substrate (460 FIG. 4C) as a buried conductive layer, and, N-type active-region semiconductor structure 308 is fabricated above the buried conductive layer. In some embodiments, P-type active-region semiconductor structure 306 is fabricated above N-type active-region semiconductor structure 308, and front-side metal layer 305A is fabricated above P-type active-region semiconductor structure 306. Additionally or alternatively, conductive lines in front-side metal layer 305A and conductive lines in back-side metal layer 316A are asymmetrical to one another.

In some embodiments, circuit structure 300A includes front-side signal conductive lines 309 in front-side metal layer 305A and also back-side metal layer 316A includes back-side signal conductive lines 332 and shielding conductive line 333A. Additionally or alternatively, front-side signal conductive line 309A is an input signal conductive line for providing an input to gate terminal 310A.

In some embodiments, front-side signal conductive line 309A is conductively connected to gate terminal 310A through a top gate via 322A and configured as an input signal conductive line of circuit structure 300A. In some embodiments, back-side signal conductive line 332B is conductively connected to drain terminal 330A through via 334A and configured as an output signal conductive line of circuit structure 300A. Additionally or alternatively, back-side signal conductive lines 332A is conductively connected to drain terminal 330B through via 326A and configured as an output signal conductive line of circuit structure 300A.

Additionally or alternatively, back-side signal conductive lines 332 are configured to route signals between neighboring cells or circuit structures at opposite sides of circuit structure 300A. For example, in some embodiments, through VTB 334A (shown in dotted line as an optional element) connected to drain terminal 330A, an output of transistor stack 301A is routed through signal conductive line 332B. In this structure, as discussed above, drain terminal 330A of second transistor 304A is connected, through VTB 334A, to another transistor outside circuit structure 300A, when a gate terminal and/or a source terminal/drain terminal of such another transistor is electrically coupled to the signal conductive line 332B. In another example, additionally or alternatively, via 336 (shown in dotted line as an optional element—also referred to as VTB) electrically connects source terminal 314A to signal conductive line 332B. In this structure, source terminal 314A of first transistor 302A is connected, through via 336 and signal conductive line 332B, to another transistor outside circuit structure 300A. In yet another example, additionally or alternatively, bottom VD via 326A (shown in dotted line as an optional element) electrically connects drain terminal 330B to signal conductive line 332A.

In the example configuration in FIG. 3A, signal conductive line 332B is a continuous signal conductive line 132B and extends from under drain terminal 330A to under source terminal 314A. Additionally or alternatively, conductive line 332B includes two disconnected sections aligned along the X direction. In at least one embodiment, drain terminal 330A is electrically coupled to source terminal 314A through VTB 334A, continuous signal conductive line 332B, and VTB via 336. In some embodiments, one or more other signal conductive lines described herein (e.g., 309A, 309B, 332A, 332B) comprises aligned but disconnected sections.

Figure 3B:
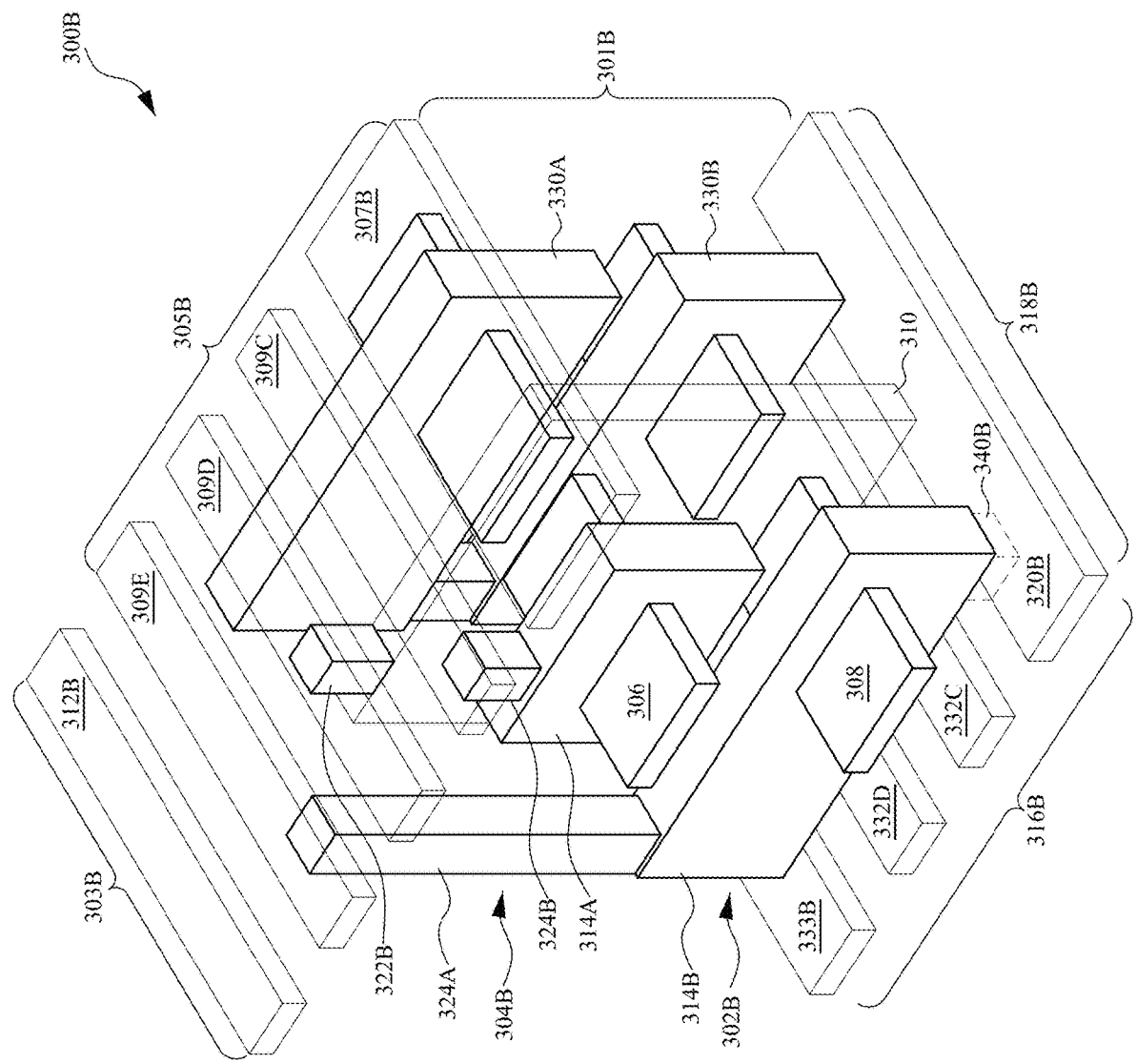
FIG. 3B is a schematic perspective view of a circuit structure, in accordance with some embodiments.

In accordance with some embodiments, FIG. 3B is a schematic perspective view of a circuit structure 300B (also referred to herein as a "cell") having power conductive line 307B, signal conductive lines 309C, 309D, 309E (hereinafter referred to as signal conductive line 309F) and shielding conductive line 312B in a front-side conductive layer 305B. Additionally or alternatively, circuit structure 300B includes a substrate (460 FIG. 4C) that includes a first transistor stack 301B over the substrate that includes a first transistor 302B where first transistor 302B is a first conductivity type. A second transistor 304B is above the first transistor 302B, where second transistor 304B is a second conductivity type different from the first conductivity type. Circuit structure 300B also includes a plurality of first conductive lines 303B in a first metal layer 305B above first transistor stack 301B, plurality of first conductive lines 303B electrically connected to first transistor stack 301B. Circuit structure 300B also includes a plurality of second conductive lines 318B in a second metal layer 316B below the substrate and underneath first transistor stack 301B, plurality of second conductive lines 318B electrically connected to first transistor stack 301B. Plurality of first conductive lines 303B are configured asymmetrically with respect to plurality of second conductive lines 318B. For simplicity, gate terminals of first transistor 302B and second transistor 304B are shown as a common gate terminal 310. This gate terminal 310, in one or more embodiments, includes a gate connection similar to gate connection 331 in FIG. 3A. In some embodiments, a gate connection is omitted from gate terminal 310 in FIG. 3B, and first transistor 302B and second transistor 304B have gate terminals which are disconnected from each other.

In some embodiments, circuit structure 300B with front side conductive layer 305B, first conductive lines 303B, first transistor stack 301B, first transistor 302B and second transistor 304B are like circuit structure 100B with front side conductive layer 105B, first conductive lines 103B, first transistor stack 101, first transistor 102 and second transistor 104. Additionally or alternatively, circuit structure 300B includes an additional back-side shielding conductive line 333B and additional signal conductive line 309E. In some embodiments, additional shielding conductive line 333B and additional signal conductive line 309E are the main difference between circuit structure 300B and 100B.

In some embodiments, circuit structure 300A and 300B are alike in that back-side metal layer 316B is like back-side metal layer 316A rotated 180 degrees and transistor stack 301A and transistor stack 301B are both transistor stacks, another IC device or the like. Additionally or alternatively, circuit structure 300B does not include via 328A, via 322B is electrically connected to front-side signal conductive line 309D, source terminal 314A and via 324B are electrically connected to front-side signal conductive line 309C, and source terminal 314B and via 324A (also referred to herein as "via-bottom-to-top" or "VBT") are electrically connected to front-side signal conductive line 309E. In some embodiments, one or more VBT(s) (not shown) is/are included in circuit structure 300A.

In some embodiments, circuit structure 300B includes front-side signal conductive line 309C, 309D, and 309E in front-side metal layer 305B and also back-side metal layer 316B having back-side signal conductive lines 332C and 332D which are asymmetrical to front-side signal conductive lines 309C, 309D, and 309E. Additionally or alternatively, back-side metal layer 318B includes a shielding conductive line 333B that serves as a shielding conductive line for signal conductive lines 332C, 332D between power conductive line 320B and shielding conductive line 333B.

In some embodiments, first metal layer 305B including first conductive lines 303B that includes power conductive line 307B, signal conductive lines 309C, 309D, 309E and shielding conductive line 312B, second conductive lines 318B that includes power conductive line 320 and signal conductive lines 332C, 332D, and vias (322B, 324A, 324B, 340B) are one or more conductive materials, e.g., a metal such as copper, aluminum, tungsten, titanium, polysilicon, or another material capable of providing a low resistance signal path. In some embodiments, shielding conductive lines 312B and 333B are a floating conductive line or shielding conductive lines 312B and 333B are connected to a reference voltage (e.g., VDD, VSS or any voltage on circuit 300B). Additionally or alternatively, shielding conductive lines 312B and 333B shield, prevent and/or reduce signal interference or signal cross-talk between signals on signal conductive lines 309C, 309D, 309E, 332C, 332D and signals on other neighboring circuit structures or cells.

In some embodiments, circuit structure 300B includes a first transistor 302B, an NMOS device, and a second transistor 304B, a PMOS device. First transistor 302B is sometimes referred to as "bottom device" or "bottom transistor," and second transistor 304B is sometimes referred to as "top device" or "top transistor." Additionally or alternatively, gate terminal 310 functions as an input terminal receiving a signal, through a top gate via 322B (also referred to as via-to-gate, or VG), from signal conductive line 309D. In some embodiments, a bottom VG via (not shown) is provided to couple gate terminal 310 to a signal conductive line 332C, 332D on metal layer 316B.

In some embodiments, drain terminals 330A, 330B (hereinafter referred to as drain terminals 330) of second transistor 304B and first transistor 302B are connected together by an MDLI 338B (FIG. 3C), while functioning as an output terminal outputting a signal, through via 334B (also referred to as VTB, or via top to bottom), to signal conductive line 332C. In at least one embodiment, a similar MDLI is provided between source terminal 314A of second transistor 304B and source terminal 314B of first transistor 302B. In one or more embodiments, either or both of the described MDLI is/are omitted. Additionally or alternatively, source terminal 314B of first transistor 302B is maintained at the supply voltage VSS through bottom VSS via 340B electrically connected to power conductive line 320B. Source terminal/drain terminals are also referred to as metal-to-device (MD) contact structures. The described "source terminal" and/or "drain terminal" are examples, and can be reversed as "drain terminal" and/or "source terminal" in one or more embodiments.

In some embodiments, circuit structure 300B includes a P-type active-region semiconductor structure 306 and an N-type active-region semiconductor structure 308 extending in the X-direction. Additionally or alternatively, the X-direction, the Y-direction, and the Z-direction, in FIG. 3B and other FIGS. throughout the disclosure are mutually orthogonal to each other and form an orthogonal coordinate frame. In some embodiments, P-type active-region semiconductor structure 306 is stacked with N-type active-region semiconductor structure 308 along the Z-direction. Additionally or alternatively, gate terminal 310 extending in the Y-direction intersects both P-type active-region semiconductor structure 306 and N-type active-region semiconductor structure 308. In some embodiments, gate terminal 310 functions as two stacked gate terminals, conductively joined together: one gate terminal intersects P-type active-region semiconductor structure 306 at a channel region of second transistor 304B, and another gate terminal intersects N-type active-region semiconductor structure 308 at a channel region of first transistor 302B. In some embodiments, each of P-type active-region semiconductor structure 306 and N-type active-region semiconductor structure 308 includes one or more nano-sheets, and consequently, each of second transistor 304B and first transistor 302B is a nano-sheet transistor. Additionally or alternatively, each of P-type active-region semiconductor structure 306 and N-type active-region semiconductor structure 308 includes one or more nano-wires, and consequently, each of second transistor 304B and first transistor 302B is a nano-wire transistor.

In some embodiments, circuit structure 300B includes conductive segments including source terminals 314 and drain terminals 330. Additionally or alternatively, each of source terminal 314 and drain terminal 330, extend in the Y-direction and intersect P-type active-region semiconductor structure 306 of second transistor 304A. In some embodiments, each of source terminal 314 and drain terminal 330, extend in the Y-direction and intersect N-type active-region semiconductor structure 308 of first transistor 302B. Additionally or alternatively, drain terminal 330A and drain terminal 330B are conductively connected through MDLI 338B. In some embodiments, source terminal 314A of second transistor 304B is conductively connected to front-side signal conductive line 309C through a top via 324B, and source terminal 314B of the first transistor 302B is conductively connected to back-side power conductive line 320B through a bottom via 340B. Additionally or alternatively, front-side power conductive line 307B is configured to be held at a first supply voltage VDD, and back-side power conductive line 320B is configured to be held at a second supply voltage VSS.

In some embodiments, front-side power conductive line 307B extends in the X-direction in front-side metal layer 305B. Additionally or alternatively, back-side power conductive line 320B extends in the X-direction in back-side metal layer 316B. In some embodiments, each of front-side metal layer 305B and the back-side metal layer 316B is in a plane having the normal vector orientated towards the Z-direction. Additionally or alternatively, front-side metal layer 305B is above both P-type active-region semiconductor structure 306 and N-type active-region semiconductor structure 308. In some embodiments, back-side metal layer 316B is below both P-type active-region semiconductor structure 306 and N-type active-region semiconductor structure 308. Additionally or alternatively, back-side metal layer 316B is fabricated on a substrate (460 FIG. 4C) as a buried conductive layer, and, N-type active-region semiconductor structure 308 is fabricated above the buried conductive layer. In some embodiments, P-type active-region semiconductor structure 306 is fabricated above N-type active-region semiconductor structure 308, and front-side metal layer 305B is fabricated above P-type active-region semiconductor structure 306. In some embodiments, conductive lines in front-side metal layer 305B and conductive lines in back-side metal layer 316B are asymmetrical to one another.

In some embodiments, circuit structure 300B includes front-side signal conductive lines 309C, 309D, 309E in front-side metal layer 305B and also back-side metal layer 316B includes back-side signal conductive lines 332C, 332D.

In some embodiments, front-side signal conductive line 309D is conductively connected to gate terminal 310 through a top gate via 322B and configured as an input signal conductive line of circuit structure 300B. Additionally or alternatively, back-side signal conductive lines 332 are configured to route signals between neighboring cells or circuit structures at opposite sides of circuit structure 300B. For example, in some embodiments, through VTB 334B (FIG. 3F) connected to drain terminal 330A, an output of transistor stack 301B is routed through signal conductive line 332C. In this structure, as discussed above, drain terminal 330A of second transistor 304B is connected, through VTB 334B, to another transistor outside circuit structure 300B, when a gate and/or a source terminal/drain terminal of such another transistor is electrically coupled to the signal conductive line 332C.

Compared to circuit structures 100A, 100B, circuit structures 300A, 300B include an additional conductive line in M0 layer and/or an additional conductive line in BM0 layer, without increasing the cell height along the Y direction. In at least one embodiment, circuit structures 300A, 300B include one or more VBT(s) (e.g., 324A in FIG. 3B) not included in circuit structures 100A, 100B. As a result, additional routing resources are provided and/or routing flexibility is increased, in one or more embodiments.

In some embodiments, circuit structures 100A, 100B have mirror arrangements of conductive lines in M0 layer, and the same arrangement of conductive lines in BM0 layer. In some embodiments, circuit structures 300A, 300B have mirror arrangements of conductive lines in M0 layer, and the same arrangement of conductive lines in BM0 layer.

In some embodiments, each of circuit structures 100A, 100B, 300A, 300B has asymmetrical arrangements of conductive lines in M0 layer and BM0 layer. For example, in each of circuit structures 100A, 100B, 300A, 300B, the arrangement of conductive lines in M0 layer is not a mirror image of (i.e., is asymmetrical to) the arrangement of conductive lines in BM0 layer. This is different from other approaches where the arrangement of conductive lines in M0 layer is a mirror image of (i.e., is symmetrical to) the arrangement of conductive lines in BM0 layer. Compared to the other approaches, circuit structures 100A, 100B, 300A, 300B include an additional conductive line in M0 layer and/or an additional conductive line in BM0 layer, without increasing the cell height along the Y direction. As a result, compared to the other approaches, additional routing resources are provided and/or routing flexibility is increased, in one or more embodiments.

Figures 3C, 3D:
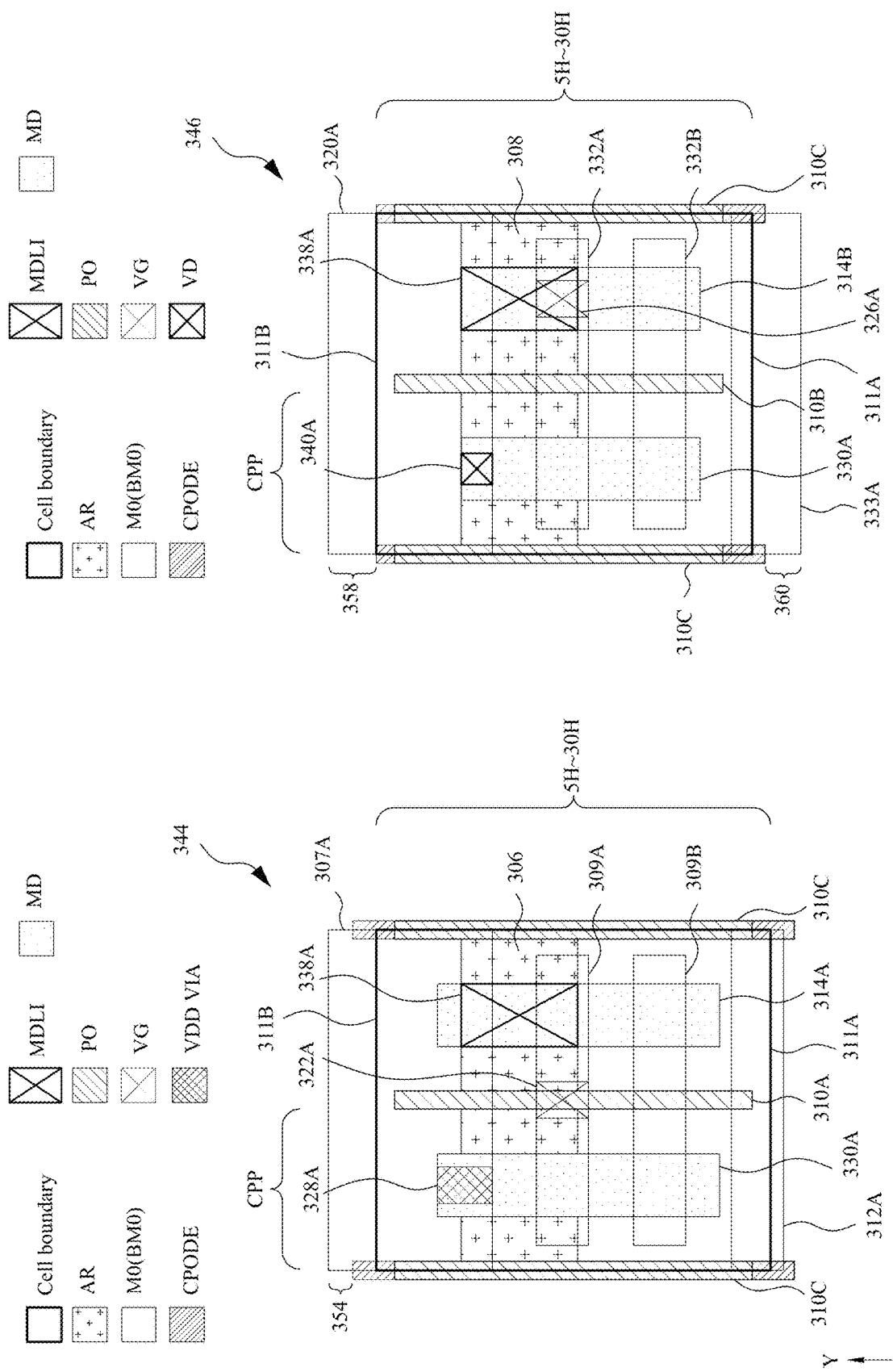
FIGS. 3C, 3D, 3E, and 3F are layout diagrams of circuit structures, in accordance with some embodiments.
Figures 3E, 3F:
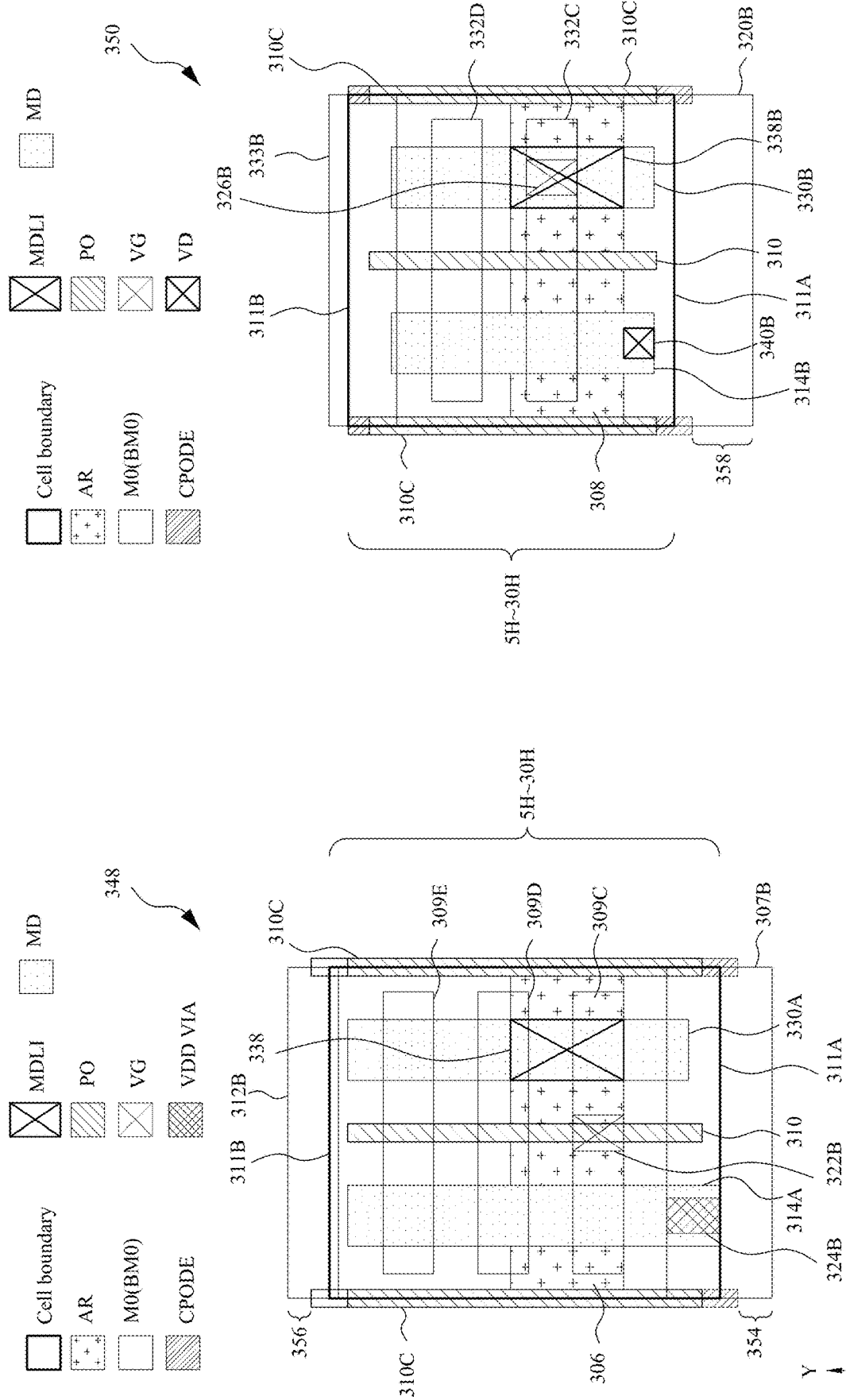

In accordance with some embodiments, FIGS. 3C, 3D, 3E, and 3F are layout diagrams of circuit structures 300A and 300B in FIGS. 3A and 3B. In some embodiments, FIG. 3C is a layout diagram of circuit structure 300A, specifically front-side metal layer 305A and second transistor 304A in the Z-direction. In some embodiments, FIG. 3D is a layout diagram of circuit structure 300A, specifically back-side metal layer 316A and first transistor 302A in the Z-direction. In some embodiments, FIG. 3E is a layout diagram of circuit structure 300B, specifically front-side metal layer 305B and second transistor 304B in the Z-direction. In some embodiments, FIG. 3F is a layout diagram of circuit structure 300B, specifically back-side metal layer 316B and first transistor 302B in the Z-direction.

In some embodiments, layout diagrams 344, 346, 348 and 350 are circuit structures with a 2 CPP. Additionally or alternatively, H is represented as the height of active-region semiconductor structures 306 and 308. In some embodiments, layout diagrams 344, 346, 348, and 350 have a height of from 5H and 30H. In some embodiments, a cell height, represented as the distance between cell boundary 311A and 311B, along the Y direction in each of layout diagrams 344, 346, 348, and 350 is from 5H and 30H. Additionally or alternatively, cell boundary lines 311A and 311B, together with dummy gate-strip patterns 310C (discussed below), act as edges of a cell boundary (also referred to as "place-and-route boundary") that are placed in abutment with edges of the cell boundaries of neighboring cells.

In some embodiments, the layout diagram in FIG. 3C includes a layout diagram 344 for a top portion or top device of circuit structure 300A, including P-type active-region semiconductor structure 306, gate terminal 310A, drain terminal 330A and source terminal 314A, front-side signal conductive lines 309A and 309B, front-side power conductive line 307A, shielding conductive line 312A and various vias 322A and 328A.

In some embodiments, the layout diagram in FIG. 3D includes layout diagram 346 for a bottom portion or bottom device of circuit structure 300A, including N-type active-region semiconductor structure 308, gate terminal 310B, source terminal 314B, drain terminal 330B, back-side power conductive line 320A, signal conductive lines 332A, 332B, shielding conductive line 333A, MDLI 338A, and vias 340A, 326A.

In some embodiments, the layout diagram in FIG. 3E includes a layout diagram 348 for a top portion or top device of circuit structure 300B, including P-type active-region semiconductor structure 306, gate terminal 310, drain terminal 330A and source terminal 314A, the front-side signal conductive lines 309C, 309D, and 309E, front-side power conductive line 307B, shielding conductive line 312B and various vias 322B and 324B.

In some embodiments, the layout diagram in FIG. 3F includes layout diagram 350 for a bottom portion or bottom device of circuit structure 300B, including N-type active-region semiconductor structure 308, gate terminal 310, source terminal 314B, drain terminal 330B, back-side power conductive line 320B, signal conductive lines 332C, 332D, shielding conductive line 333B, MDLI 338B, and drain via 326B and VSS via 340B.

In some embodiments, each of P-type active-region semiconductor structure 306, N-type active-region semiconductor structure 308, front-side signal conductive lines 309A, 309B, 309C, 309D, and 309E, and front-side power conductive line 307A, 307B, front-side shielding conductive line 312A, 312B, back-side signal conductive lines 332A, 332B, 332C, and 332D, back-side shielding conductive lines 333A, 333B and back-side power conductive lines 320A, 320B are extending in the X-direction. Additionally or alternatively, gate terminal 310 extends in the Y-direction and intersects P-type active-region semiconductor structure 306 at a channel region of second transistor 304A, 304B. In some embodiments, source terminal 314 extends in the Y-direction and intersects P-type active-region semiconductor structure 306 at a channel region of second transistor 304A, 304B. Additionally or alternatively, drain terminal 330 extends in the Y-direction and intersects P-type active-region semiconductor structure 306 at a channel region of second transistor 304A, 304B.

In some embodiments, via 328A electrically connects source terminal 314A and front-side power conductive line 307A. Additionally or alternatively, via 322A, 322B electrically connect gate terminal 310 and front-side signal conductive lines 309A, 309C respectively.

In some embodiments, each of N-type active-region semiconductor structure 308, the back-side signal conductive lines 332A, 332B, 332C, and 332D, back-side power conductive line 320A, 320B, and back-side shielding conductive line 333A, 333B extend in the X-direction. Additionally or alternatively, gate terminal 310 extends in the Y-direction and intersects N-type active-region semiconductor structure 308 at a channel region of first transistor 302A, 302B. In some embodiments, source terminal 314B extends in the Y-direction and intersects N-type active-region semiconductor structure 308. Additionally or alternatively, drain terminal 330B extends in the Y-direction and intersects N-type active-region semiconductor structure 308 at a channel region of first transistor 302A, 302B. In some embodiments, via 340B provides electrical connection between source terminal 314B and back-side power conductive line 320B.

In some embodiments, FIGS. 3C, 3D, 3E, and 3F also include dummy gate-strip patterns 310C at the edges of layout diagrams 344, 346, 348 and 350. In some embodiments, the intersections between dummy gate-strip patterns 310C and the layout diagram of P-type active-region semiconductor structure 306 are for isolating P-type active-region semiconductor structure 306 from active-regions in neighboring cells. Additionally or alternatively, the intersections between dummy gate-strip patterns 310C and the layout diagram of N-type active-region semiconductor structure 308 isolate N-type active-region semiconductor structure 308 from active-regions in neighboring cells. In some embodiments, the isolation regions in active-region semiconductor structures 306, 308 are created based on the poly on oxide definition edge (PODE) technology or based on the continuous poly on oxide definition edge (CPODE) technology. Additionally or alternatively, other suitable technologies for generating the isolation regions in active-region semiconductor structures 306, 308 are also within the contemplated scope of present disclosure.

In some embodiments, the cell height of layout diagrams 344, 346, 348 and 350 do not change with the addition of back-side shielding conductive line 333A, 333B or front-side signal conductive line 309E. Additionally or alternatively, a wide power conductive line lowers resistance and Joule heating. In some embodiments, a wide power conductive line allows for a merged or shared power conductive line with abutting stacked cells. Additionally or alternatively, a single shielding conductive line is used to share with adjacent stacked cells. In some embodiments, in vertical abutting of single cells (see FIGS. 4A-4D), common power conductive line and common shielding conductive line are able to be implemented. Additionally or alternatively, in double height cells, an additional shielding conductive line, such as 309E provide additional signal conductive line shielding. In some embodiments, in double height cells, drain terminal 330B extends further away from power conductive lines 320A, 320B and electrically connects to a drain via on shielding conductive line 333A, or 333B.

In some embodiments, as is discussed below in greater detail, when vertical abutting (i.e., abutting along the Y-direction) of stacked transistor cells is implemented, sharing a common power conductive line and/or a common shielding conductive line is achieved between top transistors of abutting cells. Additionally or alternatively, in FIGS. 3C and 3D each of power conductive line 307A and 307B has a length of overhang 354 that extends outside of layout diagrams 344 and 346. In some embodiments, layout diagram 348 has a certain amount of overhang 356 from shielding conductive line 312B. Additionally or alternatively, each of overhang 354 and 356 provide for electrical connections to adjoining cells for the sharing of power conductive lines 307A, 307B or shielding conductive lines 312A, 312B. In some embodiments, the aspect of a common power conductive line or a common shielding conductive line are discussed in greater detail below. Additionally or alternatively, power conductive lines 320A, 320B in FIGS. 3D and 3F additionally has an overhang 358. In some embodiments, back-side overhang 358 is used to couple power to one or more other first/bottom transistors of one or more adjoining/abutting cells. In some embodiments, shielding conductive line 333A has an overhang 360, FIG. 3D, that is used to couple and/or shield signal conductive lines 332 of adjoining cells.

Figure 4A:
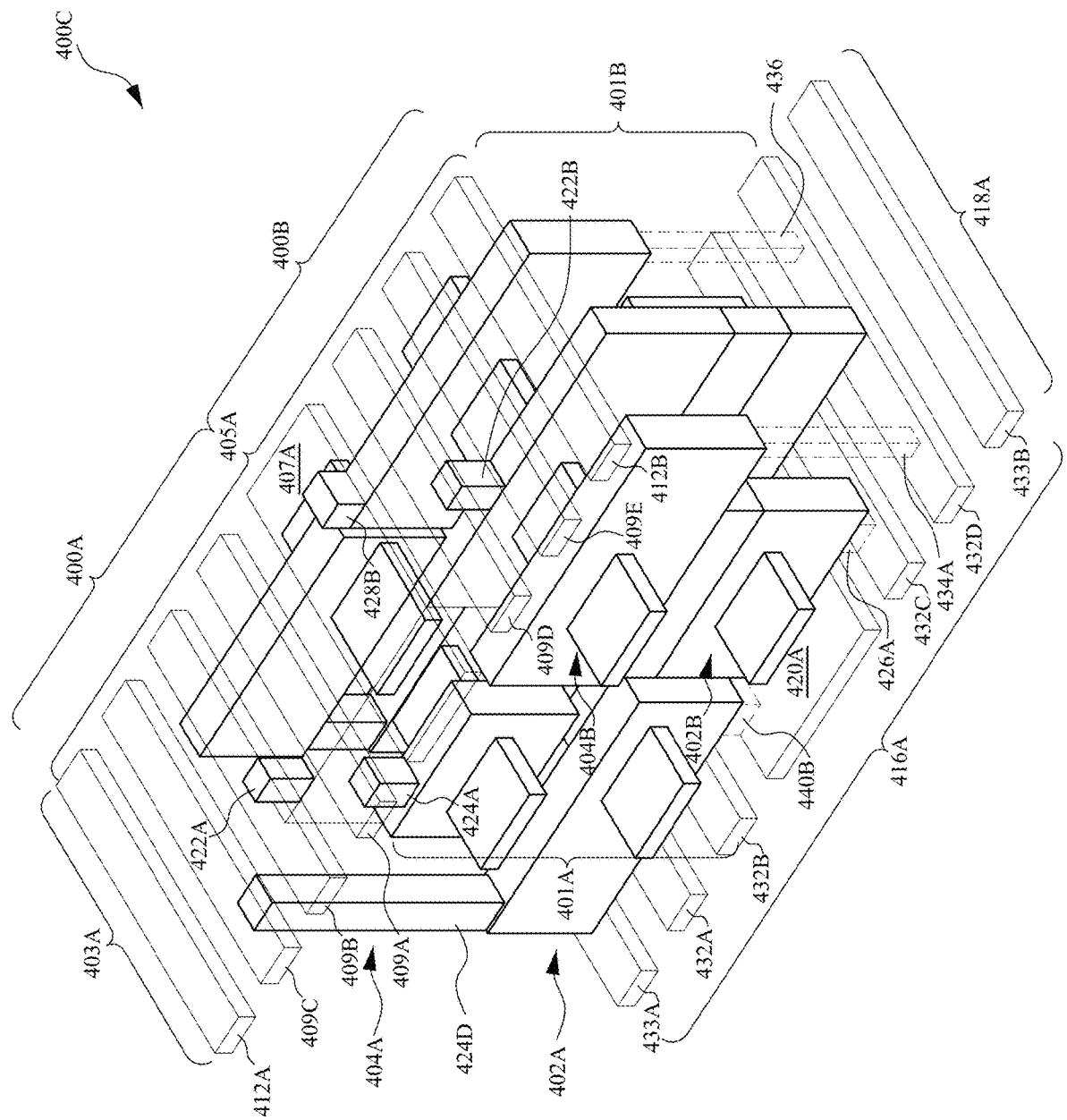
FIG. 4A is a schematic perspective view of a circuit structure, in accordance with some embodiments.

In accordance with some embodiments, FIG. 4A is a schematic perspective view of a circuit structure 400C that combines a top cell circuit structure 400A and a bottom cell circuit structure 400B at a common power conductive line 407A. Circuit structure 400A abuts or adjoins circuit structure 400B in the Y-direction. Circuit structure 400A is arranged further towards a positive orientation of the Y direction than circuit structure 400B, and is referred to as "top cell" or "top cell circuit structure." Thus, circuit structure 400B is referred to as "bottom cell" or "bottom cell circuit structure."

In some embodiments, a circuit structure 400C includes a substrate (FIG. 4C) that includes a first transistor stack 401A and a second transistor stack 401B over the substrate where first transistors 402A, 402B are a first conductivity type; and second transistors 404A, 404B are above first transistors 402A, 402B respectively, where second transistors 404A, 404B are a second conductivity type different from the first conductivity type. Circuit structure 400C also includes a plurality of first conductive lines 403A in a first metal layer 405A above transistor stacks 401A, 401B. A plurality of first conductive lines 403A over transistor stacks 401A, 401B includes a power conductive line 407A configured to route power to transistor stacks 401A, 401B; one or more signal conductive lines 409A, 409B, 409C, 409D, and 409E (hereinafter referred to as signal conductive lines 409) configured to route signals to transistor stacks 401A, 401B; and one or more shielding conductive line 412A, 412B configured to shield the routed signals on one or more signal conductive lines 409, where one or more signal conductive lines 409 are between power conductive line 407A and shielding conductive lines 412A, 412B.

Additionally or alternatively, circuit structure 400A includes a substrate (460 FIG. 4C) that includes a first transistor stacks 401A and 401B over the substrate that includes: first transistors 402A, 402B where first transistors 402A and 402B are a first conductivity type; and a second transistor 404, above the first transistor 402A and 402B, where second transistor 404 is a second conductivity type different from the first conductivity type. Circuit structure 400A also includes a plurality of first conductive lines 403A in a first metal layer 405A above first transistor stacks 401A and 401B, a plurality of first conductive lines 403A electrically connected to first transistor stacks 401A and 401B. Circuit structure 400A also includes a plurality of second conductive lines 418A in a second metal layer 416A below the substrate and underneath first transistor stacks 401A and 401B, a plurality of second conductive lines 418A electrically connected to first transistor stacks 401A and 401B. The plurality of first conductive lines 403A are configured asymmetrically with respect to the plurality of second conductive lines 418A.

In some embodiments, circuit structures 400A, 400B with transistor stacks 401A, 401B are like circuit structures 300B and 300A with transistor stacks 301B and 301A. Additionally or alternatively, circuit structure 400C represents a combination of circuit structures 400A and 400B that are like circuit structures 300B and 300A where each of circuit structure 300B and 300A shares a common front-side power conductive line 407A and a common back-side power conductive line 420A.

In some embodiments, first metal layer 405A including first conductive lines 403A that includes power conductive line 407A, signal conductive lines 409A, 409B, 409C, 409D, 409E, and shielding conductive lines 412A, 412B, second conductive lines 418A that includes power conductive lines 420A and signal conductive lines 432A, 432B, 432C, 432D (hereinafter referred to as signal conductive lines 432), and vias (422A, 422B, 424A, 426A, 428B, 434A, 436) are one or more conductive materials, e.g., a metal such as copper, aluminum, tungsten, titanium, polysilicon, or another material capable of providing a low resistance signal path. In some embodiments, shielding conductive lines 412A, 412B is a floating conductive line or shielding conductive lines 412A, 412B is connected to a reference voltage (e.g., VDD, VSS or any voltage on circuit 400C). Additionally or alternatively, shielding conductive lines 412A, 412B shields, prevents and/or reduces signal interference or signal cross-talk between signals on signal conductive lines 409A, 409B, 409C, 409D, 409E and signals on other neighboring circuit structures or cells.

In some embodiments, circuit structure 400C includes first transistors 402A, 402B, an NMOS device, and second transistors 404A, 404B, a PMOS device. First transistors 402A, 402B is sometimes referred to as "bottom device" or "bottom transistor," and second transistor 204A, 204B is sometimes referred to as "top device" or "top transistor."

Figure 4B:
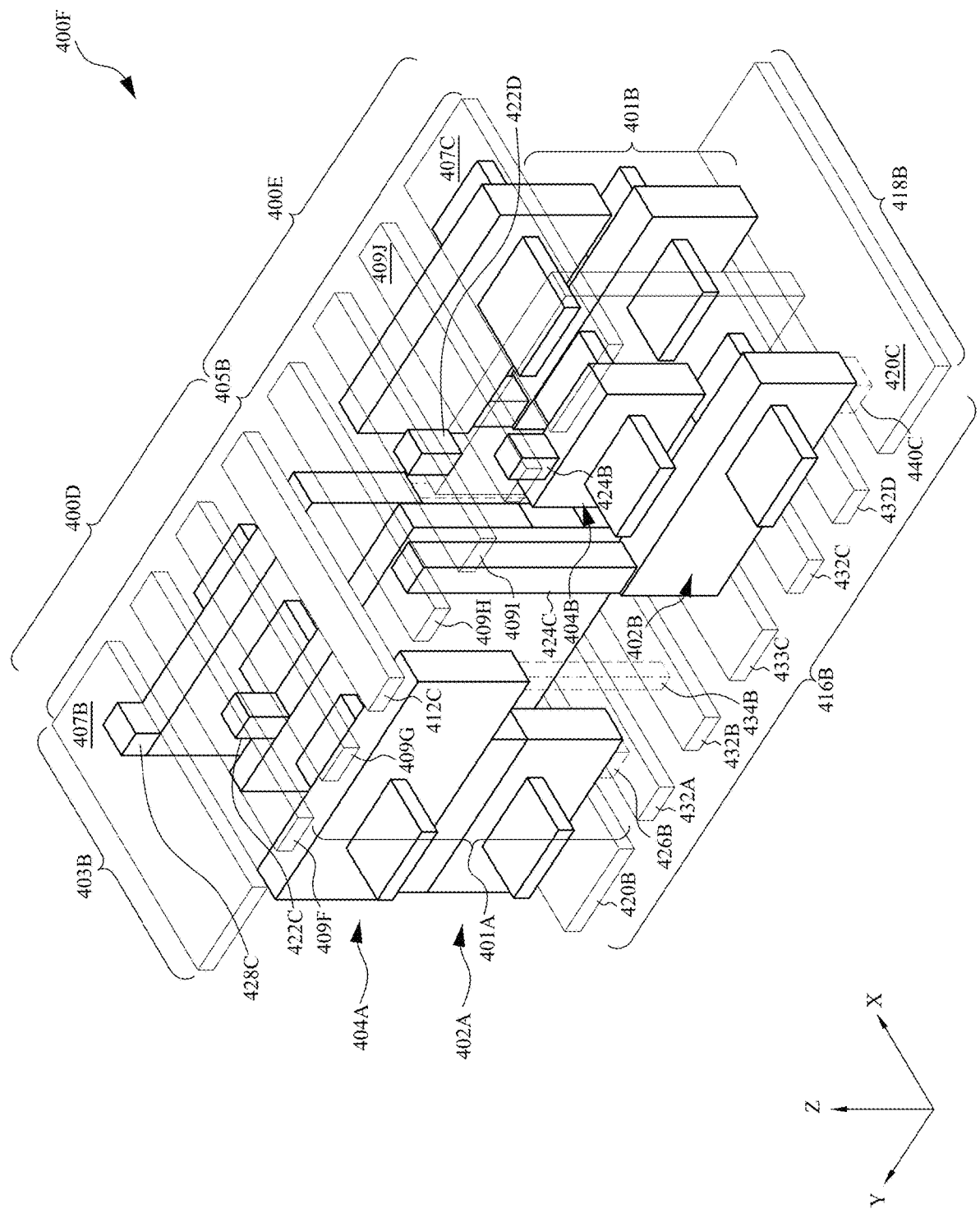
FIG. 4B is a schematic perspective view of a circuit structure, in accordance with some embodiments.

In accordance with some embodiments, FIG. 4B is a schematic perspective view of a circuit structure 400F that combines a top cell circuit structure 400D and a bottom cell circuit structure 400E at a common shielding conductive line 412C. Circuit structure 400D abuts or adjoins circuit structure 400E in the Y-direction. Circuit structure 400D is arranged further towards a positive orientation of the Y direction than circuit structure 400E, and is referred to as "top cell" or "top cell circuit structure." Thus, circuit structure 400E is referred to as "bottom cell" or "bottom cell circuit structure."

In some embodiments, circuit structures 400D, 400E with transistor stacks 401A, 401B are like circuit structures 300A and 300B with transistor stacks 301A and 301B. Additionally or alternatively, circuit structure 400F represents a combination of circuit structures 400D and 400E where each of circuit structure 400D and 400E shares a common front-side shielding conductive line 412C and a common back-side shielding conductive line 433C.

In some embodiments, circuit structure 400F includes a substrate (460 FIG. 4C) that includes first transistor stacks 401A and 401B over the substrate. First transistor stacks 401A and 401B include first transistors 402A, 402B where first transistors 402A, 402B is a first conductivity type. Second transistors 404A, 404B, are above the first transistors 402A, 402B, where second transistors 404A, 404B are a second conductivity type different from the first conductivity type. Circuit structure 400F also includes a plurality of first conductive lines 403B in a first metal layer 405B above first transistor stacks 401A and 401B, a plurality of first conductive lines 403B electrically connected to first transistor stacks 401A and 401B. Circuit structure 400F also includes a plurality of second conductive lines 418B in a second metal layer 416B below the substrate and underneath first transistor stacks 401A and 401B, a plurality of second conductive lines 418B electrically connected to first transistor stacks 401A and 401B. The plurality of first conductive lines 403B are configured asymmetrically with respect to the plurality of second conductive lines 418B.

In some embodiments, first metal layer 405B including first conductive lines 403B that includes power conductive lines 407B, 407C, signal conductive lines 409F, 409G, 409H, 409I, 409J, and shielding conductive line 412C, second conductive lines 418B that includes power conductive lines 420B, 420C and signal conductive lines 432A, 432B, 432C, 432D (hereinafter referred to as signal conductive lines 432), and vias (422C, 422D, 424B, 424C, 426B, 428C, 434B, 440C) are one or more conductive materials, e.g., a metal such as copper, aluminum, tungsten, titanium, polysilicon, or another material capable of providing a low resistance signal path. In some embodiments, shielding conductive line 412C is a floating conductive line or shielding conductive line 412C is connected to a reference voltage (e.g., VDD, VSS or any voltage on circuit 400F). Additionally or alternatively, shielding conductive line 412C shields, prevents and/or reduces signal interference or signal cross-talk between signals on signal conductive lines 409F, 409G, 409H, 409I, 409J and signals on other neighboring circuit structures or cells.

In some embodiments, in a double cell height cell like circuit structure 400F, shielding conductive line 412C is configured as an internal signal conductive line for routing signals inside the cell. For example, shielding conductive line 412C is disconnected at the cell boundary so that signals on shielding conductive line 412C stay internal within the cell.

In some embodiments, circuit structure 400F includes first transistors 402A, 402B, an NMOS device, and second transistors 404A, 404B, a PMOS device. First transistors 402A, 402B is sometimes referred to as "bottom device" or "bottom transistor," and second transistor 404A, 404B is sometimes referred to as "top device" or "top transistor."

Figure 4C:
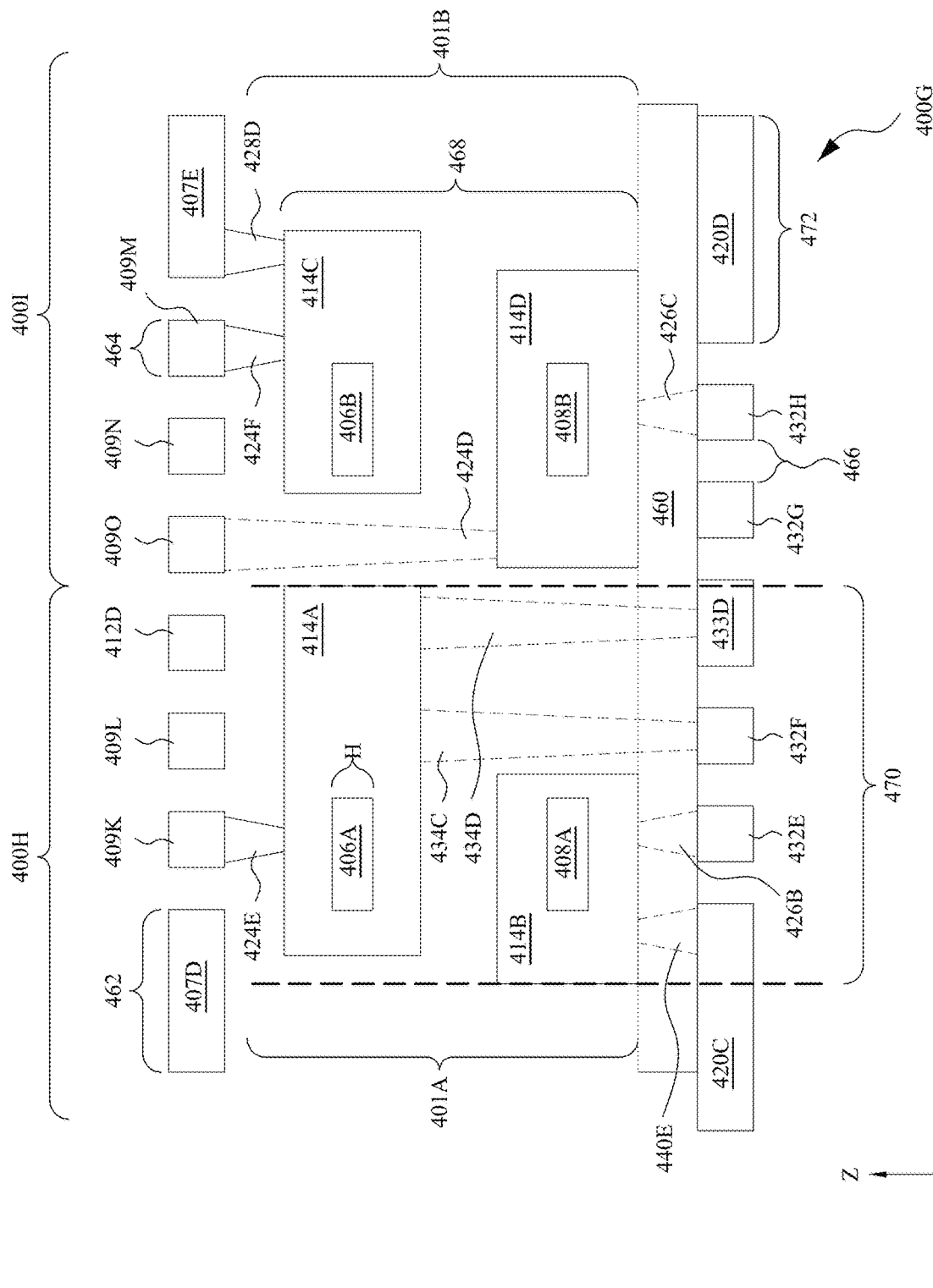
FIG. 4C is a schematic perspective view of a circuit structure, in accordance with some embodiments.

In accordance with some embodiments, FIG. 4C is a schematic cross-sectional view of circuit structure 400G with a common front-side shielding conductive line 412D and common back-side shielding conductive line 433D. In some embodiments, circuit structure 400G includes a plurality of first conductive lines that includes power conductive lines 407D, 407E configured to route power to transistor stacks 401A, 401B; one or more signal conductive lines 409K, 409L, 409M, 409N, and 409O configured to route signals to transistor stacks 401A, 401B; and one front-side common shielding conductive line 412D configured to shield the routed signals on one or more signal conductive lines 409K, 409L, 409M, 409N, and 409O, where one or more signal conductive lines 409K, 409L, 409M, 409N, and 409O are between power conductive lines 407D, 407E and shielding conductive line 412D.

In some embodiments, circuit structures 400H, 400I with transistor stacks 401A, 401B are like circuit structures 300A and 300B with transistor stack 301A and 301B. Additionally or alternatively, circuit structure 400G represents a combination of circuit structures 400H and 400I that are like each of circuit structures 300A and 300B and share a common shielding conductive line 412D that is like shielding conductive line 312A or 312B.

In some embodiments, circuit structure 400G includes a plurality of second conductive lines that includes power conductive lines 420C, 420D configured to route power to first transistors in transistor stacks 401A, 401B through via 440E; one or more signal conductive lines 432E, 432F, 432G, and 432H configured to route signals to transistor stacks 401A, 401B through vias 426B and 426C; and one back-side common shielding conductive line 433D configured to shield the routed signals on one or more signal conductive lines 432E, 432F, 432G, and 432H, where one or more signal conductive lines 432E, 432F, 432G, and 432H are between power conductive lines 420C, 420D and shielding conductive line 433D.

In some embodiments, power conductive lines 407D, 407E have a width 462 of from 3H and 7H where H is represented as the height of active-region semiconductor structures 406A, 406B, 408A, 408B in the Z-direction. Additionally or alternatively, back-side power conductive lines 420C, 420D have a width 472 of from 6H and 9H. Additionally or alternatively, width 462 of front-side power conductive lines 407D, 407E and width 472 of back-side power conductive lines 420C, 420D reduce the resistance of power conductive lines 407D, 407E, 420C, 420D and thus reduce Joule heating.

In some embodiments, signal conductive lines 409K, 409L, 409M, 409N, and 409O have a width 464 of from 0.5H and 3H and the distance 466 between conductive lines 409K, 409L, 409M, 409N, and 409O is from 0.5H and 3H. Additionally or alternatively, transistor stack height 468 is between 10H and 50H and cell width 470 is from 5H and 30H.

In some embodiments, circuit structure 400G includes conductive segments including source terminals 414A, 414B, 414C, and 414D and drain terminals (not shown). Additionally or alternatively, each of source terminal 414A, 414B, 414C and 414D and the drain terminal, extend in the Y-direction and intersect P-type active-region semiconductor structures 406A, 406B, of second transistors 404A, 404B. In some embodiments, each of source terminal 414A, 414B, 414C and 414D and the drain terminal, extend in the Y-direction and intersect N-type active-region semiconductor structure 408A, 408B of first transistors 402A, 402B. In some embodiments, source terminal 414A of second transistor 404A is conductively connected to back-side signal conductive line 432F through VTB 434C, source terminal 414A of the second transistor 404A is conductively connected to back-side shielding conductive line 433D through a VTB 434D, source terminal 414D of the first transistor 402B is conductively connected to front-side signal conductive line 409O through a VTB 434D, source terminal 414A of the second transistor 404A is conductively connected to front-side signal conductive line 409K through a via 424E, source terminal 414C of the second transistor 404B is conductively connected to front-side signal conductive lines 409M through a via 424F, source terminal 414C of the second transistor 404B is conductively connected to front-side power conductive lines 407E through a via 428D. In some embodiments, VTBs 434C and 434D are optional, i.e., circuit structure 400G includes none of VTB s 434C and 434D, either 434C or 434D, or both 434C and 434D.

In some embodiments, top devices (or top transistors 404A, 404B) in abutted cells, such as in circuit structures 400H, 400I, have front-end features and VTB s (434C, 434D) that are stackable (or the same), and have back-end features with a mirror structure. In some embodiments, bottom devices (or bottom transistors 402A, 402B) in abutted cells, such as in circuit structure 400H, 400I, have both front-end features and back-end features that are stackable (or the same).

Front-end features include features manufactured in front-end-of-line (FEOL) fabrication, and back-end features include features manufactured in back-end-of-line (BEOL) fabrication. Examples of front-end features include PO, CPO, MD and OD features. Examples of back-end features include M0, BM0, VG, VD and CMD features. PO features correspond to where gates are formed, and CPO (cut-PO) features correspond to where gates are disconnected. MD features or MD contact structures correspond to where source terminal/drain terminals as described herein are formed, and CMD (cut-MD) features correspond to where MD contact structures are disconnected. OD features correspond to active regions (or active-region semiconductor structures). M0 features correspond to conductive patterns in a metal zero (M0) layer. In at least one embodiment, the conductive lines 407D, 409K, 409L, 412D, 409O, 409N, 409M and 407E over transistor stacks 401A, 401B are conductive patterns in the M0 layer. BM0 features correspond to conductive patterns in a backside metal zero (BM0) layer. In at least one embodiment, the conductive lines 420C, 432E, 432F, 433D, 420D, 432G, and 432H under transistor stacks 401A, 401B are conductive patterns in the BM0 layer. VG, VB (424E, 424D, 424F, 428D, 434C, 434D), and VD features correspond to various VG, VB and VD vias described herein.

In some embodiments, the front-end features and VTBs of the top transistors, e.g., 404A, 404B in FIGS. 4A-4B, are stackable (or the same), whereas the back-end features of the top transistors, e.g., 404A, 404B in FIGS. 4A-4B, have a mirror structure. For example, the conductive lines 403B over the top transistor 404A and the conductive lines 403B over the top transistor 404B are symmetrical to one another across a center line of common shielding conductive line 412C, as shown in FIGS. 4B-4C.

In some embodiments, the front-end features and back-end features of the bottom transistors, e.g., 402A, 402B in FIGS. 4A-4B, are stackable (or the same). For example, the conductive lines 418B under the bottom transistor 402A and the conductive lines 418B under the bottom transistor 402B are the same, as shown in FIGS. 4B-4C.

Figure 4D:
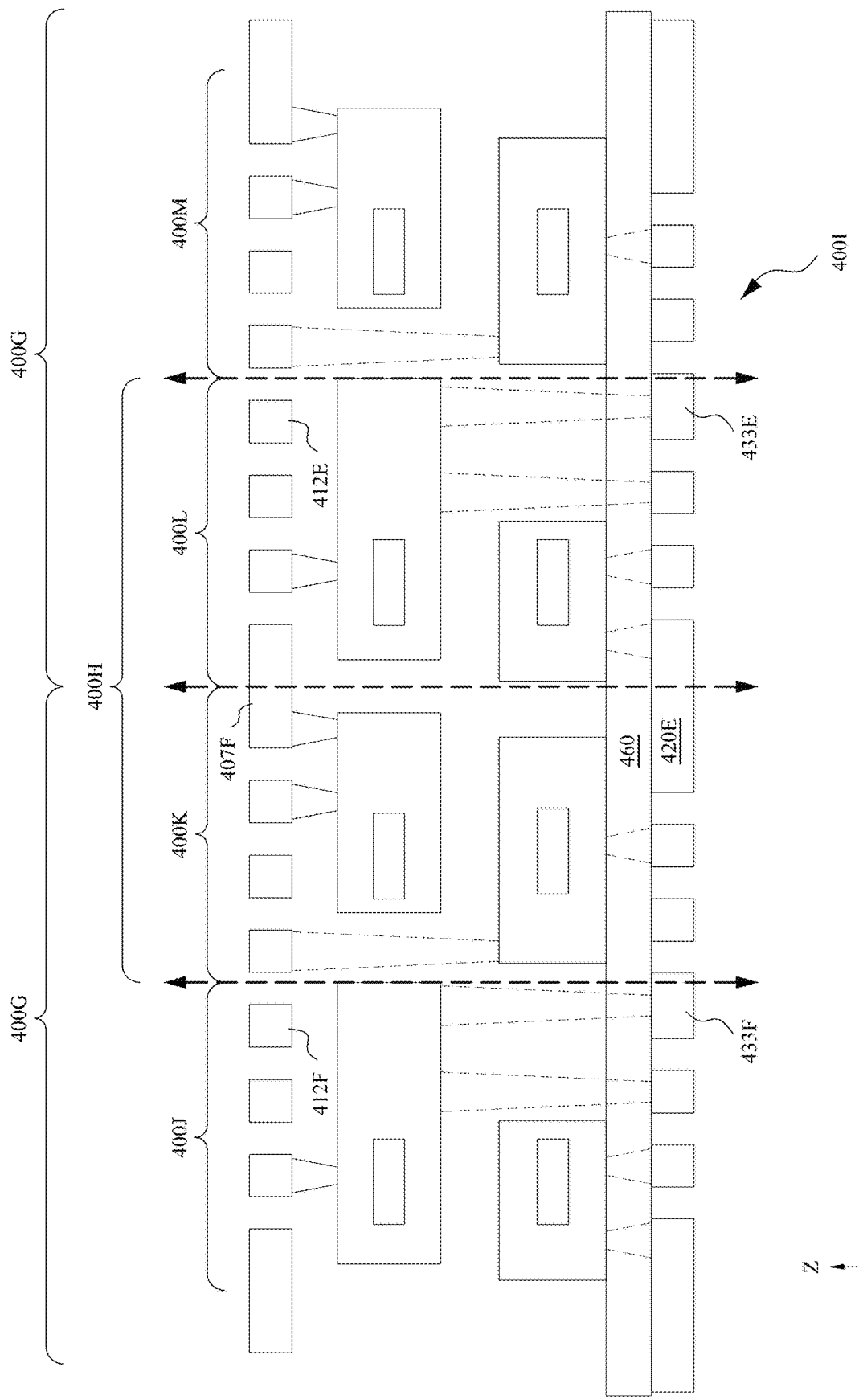
FIG. 4D is a schematic perspective view of a circuit structure, in accordance with some embodiments.

In accordance with some embodiments, FIG. 4D is a schematic perspective cross-sectional view of circuit structures 400J, 400K, 400L, and 400M with common power circuit structure 400H and common shielding circuit structures 400G. Additionally or alternatively, circuit structures 400J and 400L are like circuit structures 300A and circuit structures 400K and 400M are like circuit structures 300B. In some embodiments, circuit structure 400H is like circuit structure 400A and circuit structures 400G are like circuit structure 400F. To abut the two circuit structures 400G in FIG. 4D, power conductive lines 407D and 420C (see FIG. 4C) of the circuit structure 400G on the right in FIG. 4D are merged correspondingly with power conductive lines 407E and 420D (see FIG. 4C) of the circuit structure 400G on the left in FIG. 4D. In some embodiments, circuit structure 400G corresponds to circuit structure 400F and/or circuit structure 400H corresponds to circuit structure 400C.

In some embodiments, circuit structure 400I includes one or more common power circuit structures 400H and one or more common shielding circuit structures 400G. Additionally or alternatively, circuit structure 400H includes circuit structures 400K and 400L that share a front-side common power conductive line 407F and a back-side common power conductive line 420E. In some embodiments, right side circuit structure 400G includes circuit structures 400L and 400M that share an front-side common shielding conductive line 412E and a back-side common shielding conductive line 433E. Additionally or alternatively, left side circuit structure 400G includes circuit structures 400J and 400K that share a front-side common shielding conductive line 412F and a back-side common shielding conductive line 433F.

Figure 5A:
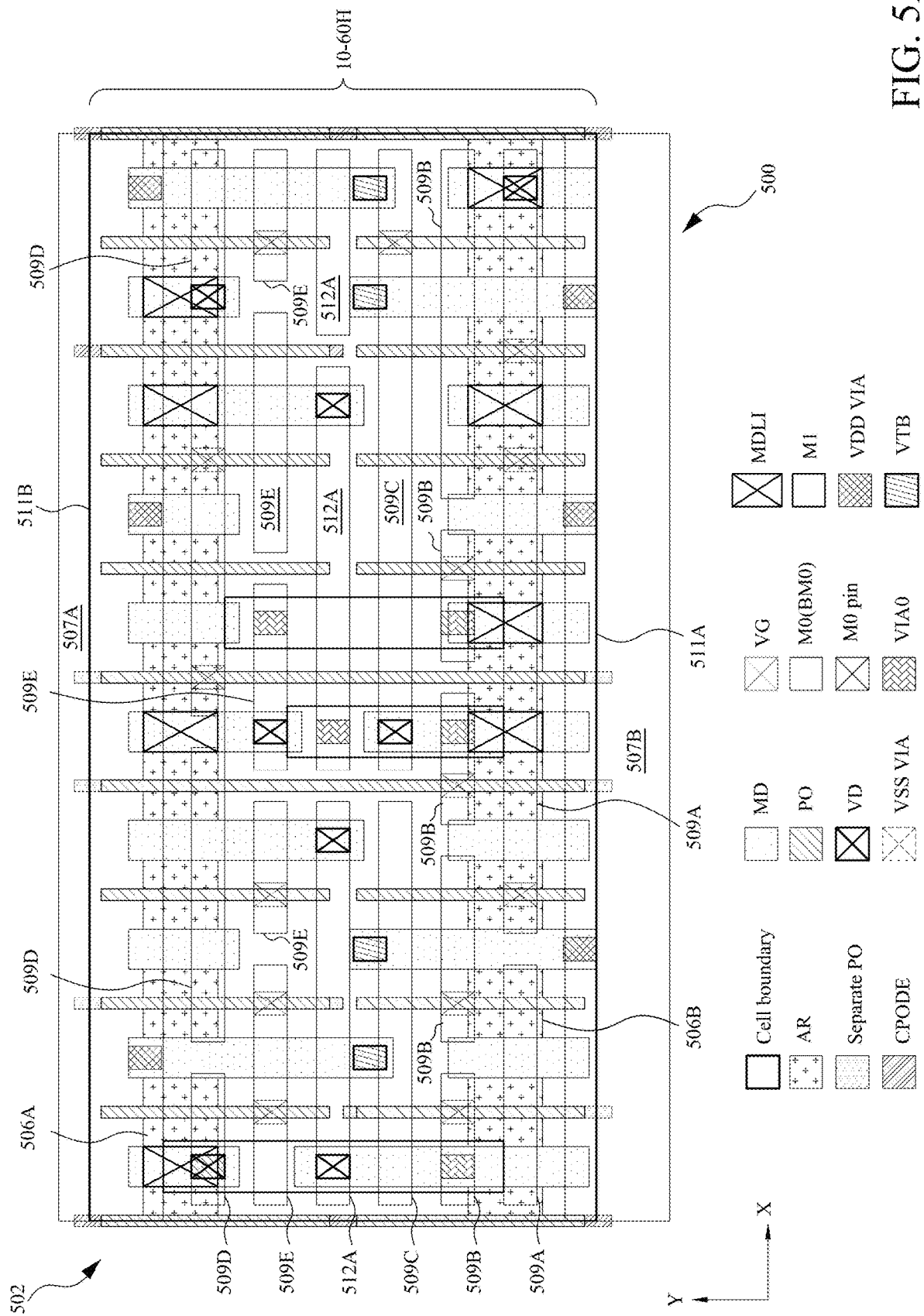
FIG. 5A is a layout diagram of an upper or top portion of a Scan D Flip-flop (SDF) circuit, in accordance with some embodiments.
Figure 5B:
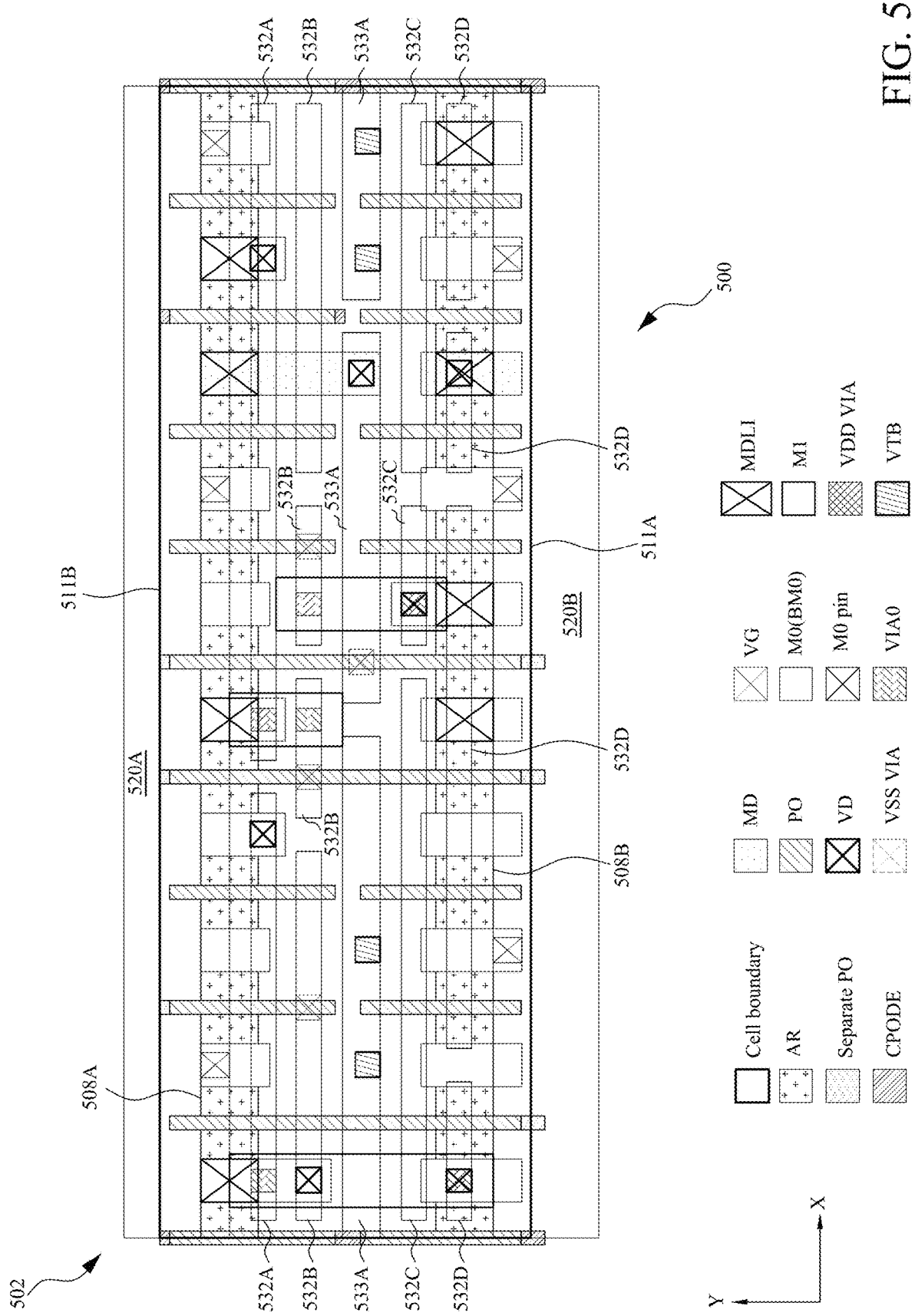
FIG. 5B is a layout diagram of a lower or bottom portion of the SDF circuit, in accordance with some embodiments.

In accordance with some embodiments, FIG. 5A is a layout diagram of an upper or top portion of a Scan D Flip-flop (SDF) circuit 500. In some embodiments, FIG. 5B is a layout diagram of a lower or bottom portion of the SDF circuit 500. Additionally or alternatively, circuit structure 500 includes at least one common shielding conductive line structure like circuit structure 400G or 400F. In some embodiments, SDF circuit 500 has a CPP of 20 (10 CPPs in the upper portion in FIG. 5A, and another 10 CPPs in the lower portion in FIG. 5B). In at least one embodiment, SDF circuit 500 with 20 CPPs provides an improvement over other approaches which require at least 22 CPPs to achieve an SDF circuit. Additionally or alternatively, SDF circuit 500 has a height of from 10H and 60H. In some embodiments, a cell height, represented as the distance between cell boundary 511A and 511B, along the Y direction in layout diagram 500 is from 10H and 60H. Additionally or alternatively, cell boundary lines 511A and 511B, together with dummy gate-strip patterns, act as edges of a cell boundary (also referred to as "place-and-route boundary") that are placed in abutment with edges of the cell boundaries of neighboring cells.

In some embodiments, various elements for forming the SDF circuit 500 are specified by the corresponding layout diagrams. Additionally or alternatively, FIG. 5A includes an upper portion (or top devices) of layout diagram 502, and FIG. 5B includes a lower portion (or bottom devices) of layout diagram 502. In some embodiments, elements specified in FIG. 5A include a first P-type active-region semiconductor structure 506A and a second P-type active-region semiconductor structure 506B. Additionally or alternatively, elements specified FIG. 5B includes a first N-type active-region semiconductor structure 508A and a second N-type active-region semiconductor structure 508B.

In some embodiments, a circuit structure 500 includes power conductive lines 507A and 507B configured to route power to transistor stacks; signal conductive lines 509A, 509B, 509C, 509D, and 509E (hereinafter referred to as signal conductive lines 509); and shielding conductive line 512A configured to shield the routed signals on one or more signal conductive lines 509, where one or more signal conductive lines 509 are between power conductive line 507A and 507B and shielding conductive line 512A.

Additionally or alternatively, circuit structure 500 includes back-side power conductive lines 520A and 520B, signal conductive lines 532A, 532B, 532C, and 532D, and shielding conductive line 533A. In some embodiments, for double-height cells (e.g., FIGS. 5A and 5B) power conductive lines 507A, 507B, 520A and 520B serve as natural shielding conductive lines between different cells and there is no line intended only for shielding since line 533A is inside the cell and can be used for routing. Additionally or alternatively, however, for single height cells, line 533A is intended only for shielding since it should be at the boundary of the cell.

Figure 6A:
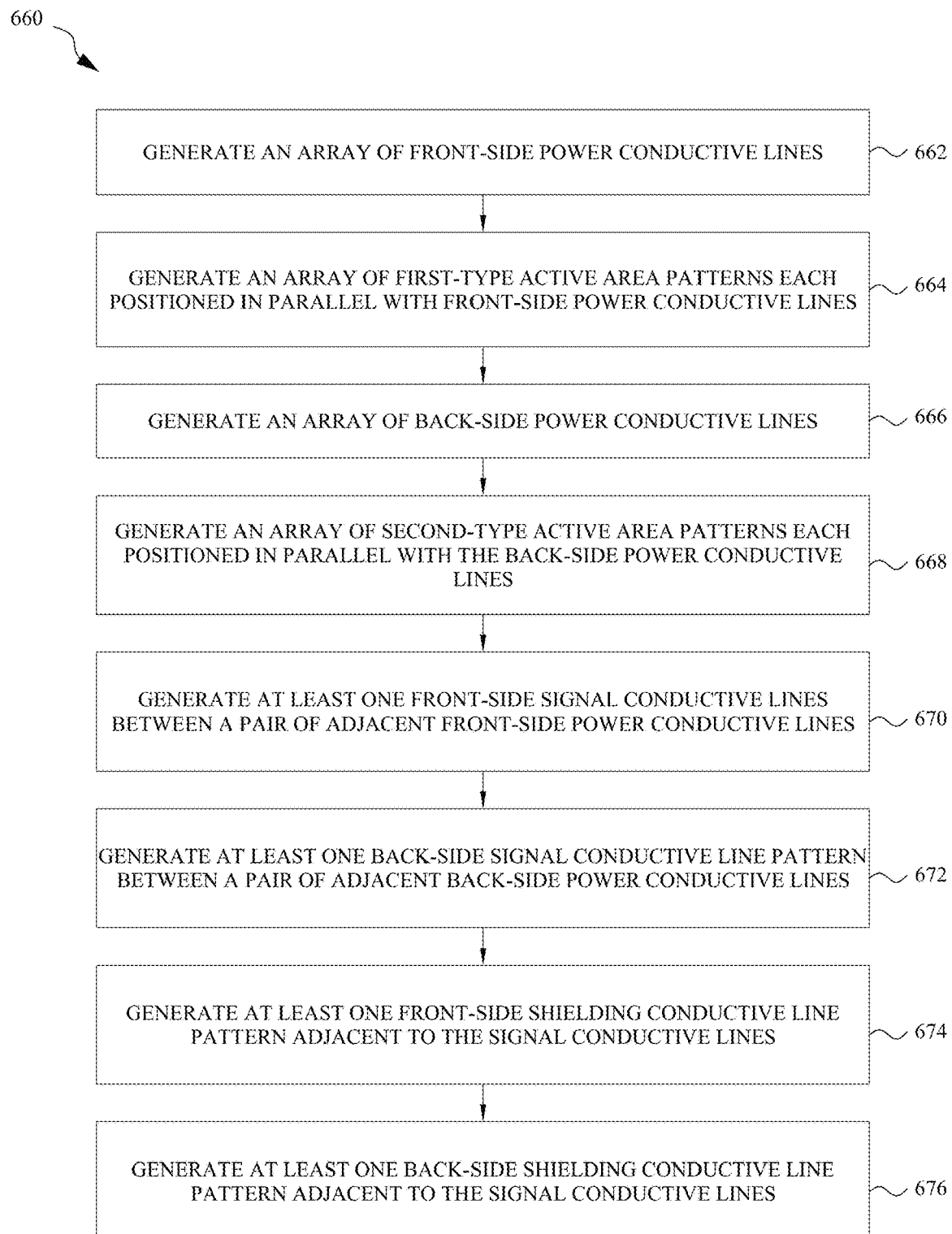
FIG. 6A is a flowchart of a method of generating an integrated circuit (IC) layout diagram, in accordance with some embodiments.
Figure 6B:
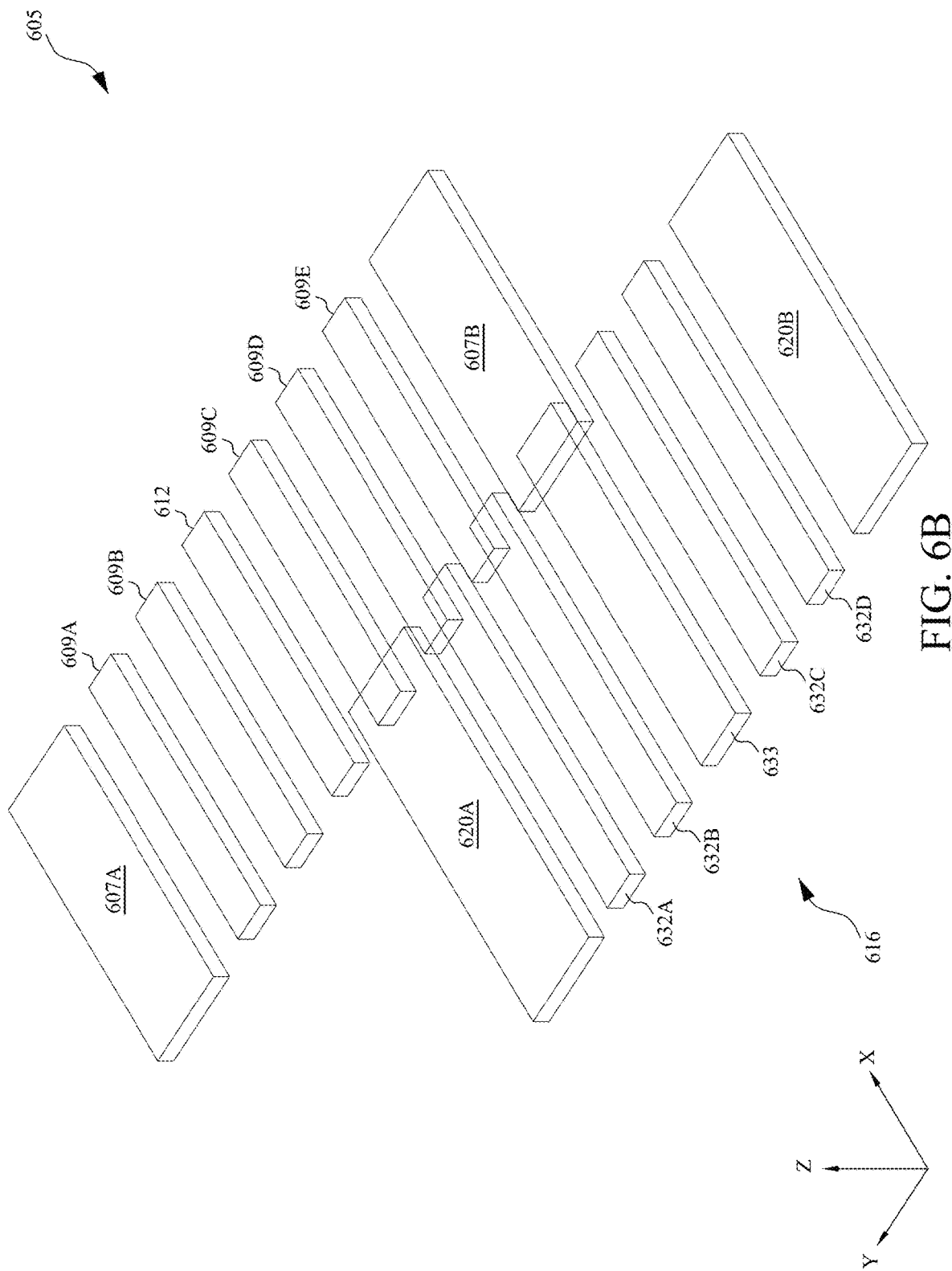
FIGS. 6B-6G are various schematic perspective views of an IC at various layers or portions, in accordance with some embodiments.
Figure 6C:
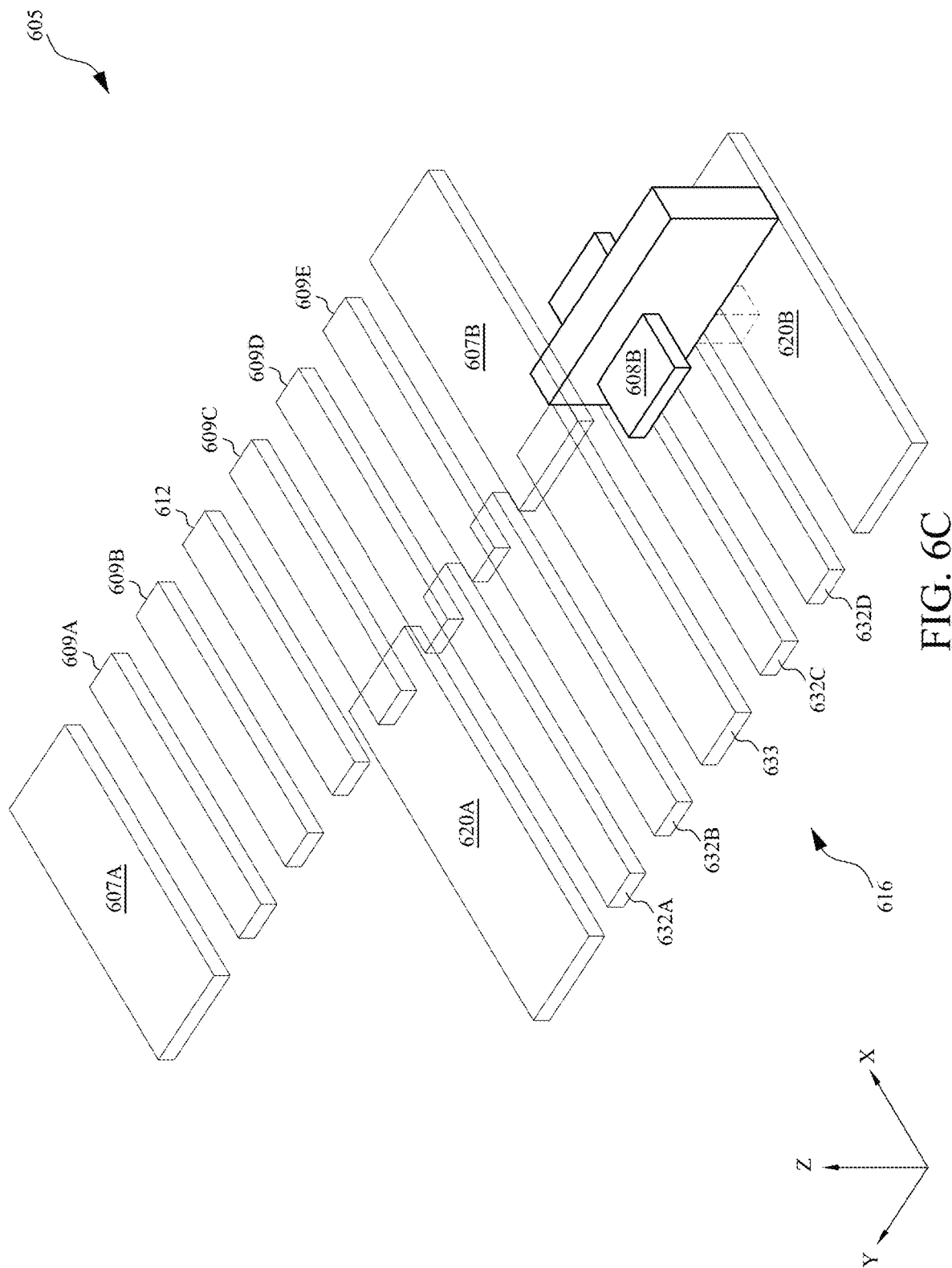
Figure 6D:
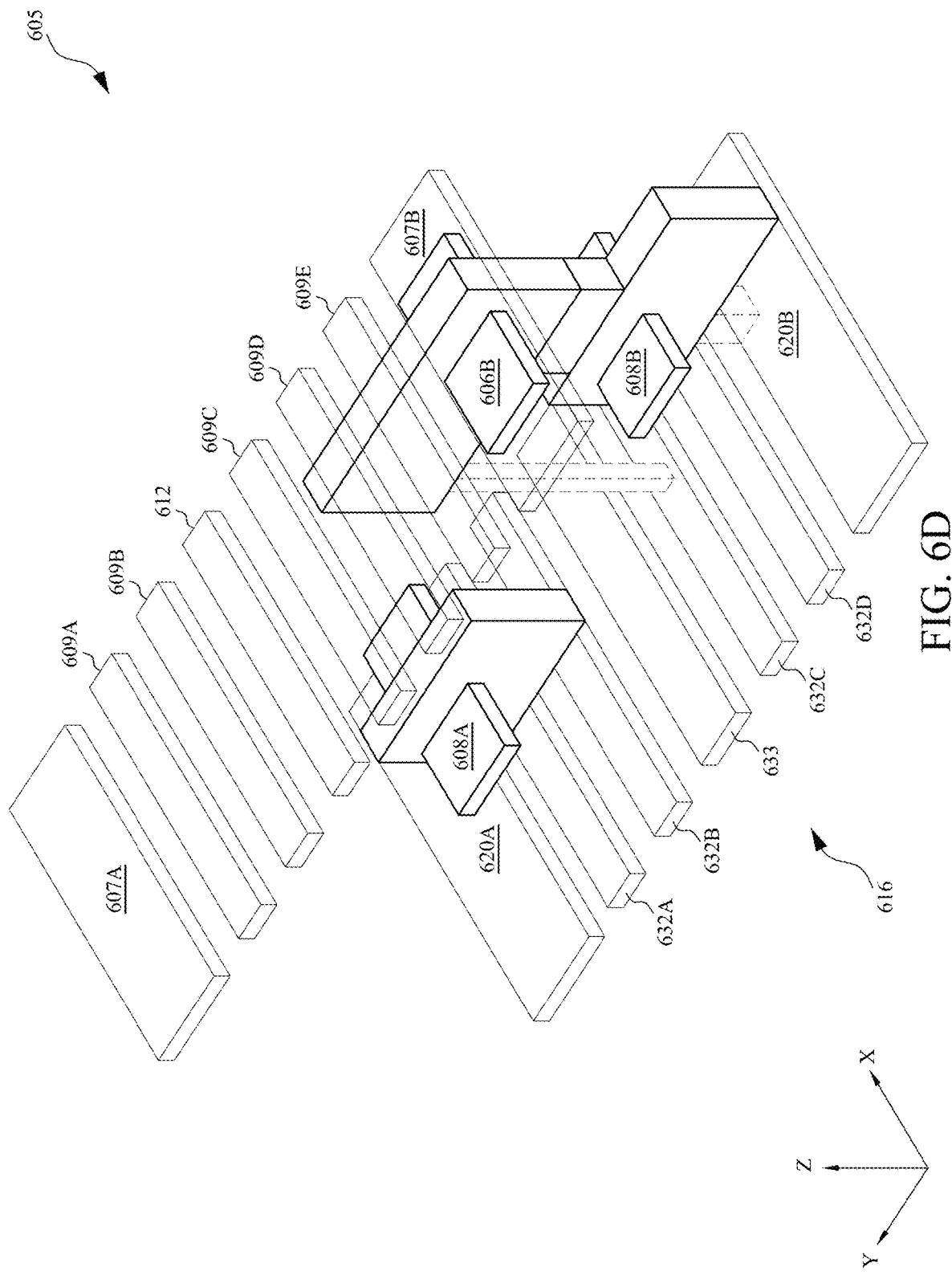

In accordance with some embodiments, FIG. 6A is a flowchart of a method 660 of generating an integrated circuit (IC) layout diagram. Additionally or alternatively, additional operations are performed before, during, and/or after the method 660 depicted in FIG. 6A, and that some other processes are only be briefly described herein. In some embodiments, the method 660 is usable to generate one or more layout diagrams, such as the layout diagrams in FIGS. 1C, 1D, 1E, 3C, 3D, 3E, 3F or FIGS. 5A-5B. Additionally or alternatively, the method 660 is usable to form integrated circuits having similar structural relationships as one or more of the semiconductor structures formed based on the layout diagrams in FIGS. 1C, 1D, 1E, 3C, 3D, 3E, 3F or FIGS. 5A-5B. In some embodiments, method 660 is performed by a processing device (e.g., processor 802 in FIG. 8) configured to execute instructions for generating one or more layout diagrams, such as the layout diagrams in FIGS. 1C, 1D, 1E, 3C, 3D, 3E, 3F or FIGS. 5A-5B.

In some embodiments, in operation 662 of method 660, an array of front-side power conductive lines is generated. Additionally or alternatively, each of the front-side power conductive lines specifies a front-side conductive line in a front-side conductive layer. In the example designs of FIGS. 6B-6G, front side conductive layer 605 includes front-side power conductive lines 607A and 607B.

In some embodiments, in operation 664 of method 660, an array of first-type active-region semiconductor structures is generated. Additionally or alternatively, the first-type active-region semiconductor structures are positioned in parallel with the front-side power conductive lines. In some embodiments, each of the first-type active-region semiconductor structures specifies a first-type active-region semiconductor structure. In the example designs of FIGS. 6B-6G, the array of first-type active-region semiconductor structures includes the layout diagrams for P-type active-region semiconductor structures 606A, 606B, 606C, and 606D. The layout diagrams for P-type active-region semiconductor structures 606A, 606B, 606C, and 606D are positioned in parallel between the layout diagrams for front-side power conductive lines 607A and 607B.

In some embodiments, in operation 666 of method 660, an array of back-side power conductive lines is generated. Additionally or alternatively, each back-side power conductive line specifies a back-side power conductive line in a back-side conductive layer. In the example layout diagrams of FIGS. 6B-6G, back-side conductive layer 616 includes back-side power conductive lines 620A and 620B.

In some embodiments, in operation 668 of method 660, an array of second-type active-region semiconductor structures is generated. Additionally or alternatively, the second-type active-region semiconductor structures are positioned in parallel with back-side power conductive lines 620A and 620B. In some embodiments, each of the second-type active-region semiconductor structures specifies a second-type active-region semiconductor structure 608 that is stacked with a corresponding first-type active-region semiconductor structure 606. In the example layout diagrams of FIGS. 6B-6G, the array of second-type active-region semiconductor structures includes the layout diagrams for N-type active-region semiconductor structures 608A, 608B, 608C, and 608D. In some embodiments, in the integrated circuit fabricated according to the layout diagrams of FIGS. 6B-6G, N-type active-region semiconductor structures 608A, 608B, 608C, and 608D is staked with the P-type active-region semiconductor structures 606A, 606B, 606C, and 606D respectively.

In some embodiments, in operation 670 of method 660, at least one front-side signal conductive line pattern is generated between a pair of adjacent front-side power conductive lines. Additionally or alternatively, the at least one front-side signal conductive line pattern specifies a front-side signal conductive line in the front-side conductive layer above both the first-type active-region semiconductor structure and the second-type active-region semiconductor structure. In the example layout diagrams of FIGS. 6B-6G, the layout diagrams for front-side signal conductive lines 609A, 609B, 609C, 609D, and 609E are positioned between the layout diagrams for front-side power conductive lines 607A and 607B.

In some embodiments, in operation 672 of method 660, at least one back-side signal conductive line pattern is generated between a pair of adjacent back-side power conductive lines. Additionally or alternatively, back-side signal conductive lines 632A, 632B, 632C, and 632D in back-side conductive layer 616 are below both first-type active-region semiconductor structures 606A, 606B, 606C, and 606D and second-type active-region semiconductor structures 608A, 608B, 608C and 608D. In the example layout diagrams of FIGS. 6B-6G, the layout diagrams for back-side signal conductive lines 632A, 632B, 632C, and 632D are positioned between the layout diagrams for back-side conductive lines 620A and 620B.

In some embodiments, in operation 674 of method 660, at least one front-side shielding conductive line pattern is generated adjacent to front-side signal conductive lines 609B and 609C. Additionally or alternatively, front-side shielding conductive line 612 specifies a front-side shielding conductive line 612 in front-side conductive layer 605 above both first-type active-region semiconductor structures 606A and 606B and second-type active-region semiconductor structures 608A and 608B. In the example layout diagrams of FIGS. 6B-6G, the layout diagrams for front-side shielding conductive lines 612 is positioned between the layout diagrams for front-side signal conductive lines 609B and 609C.

In some embodiments, in operation 676 of method 660, at least one back-side shielding conductive line pattern 633 is generated between a pair of adjacent back-side signal conductive lines. Additionally or alternatively, back-side shielding conductive line 633 is in back-side conductive layer 616 are below both first-type active-region semiconductor structures 606A, 606B, 606C, and 606D and second-type active-region semiconductor structures 608A, 608B, 608C and 608D. In the example layout diagrams of FIGS. 6B-6G, the layout diagrams for back-side shielding conductive line 633 is positioned between the layout diagrams for back-side signal conductive lines 632B and 632C.

Figure 6E:
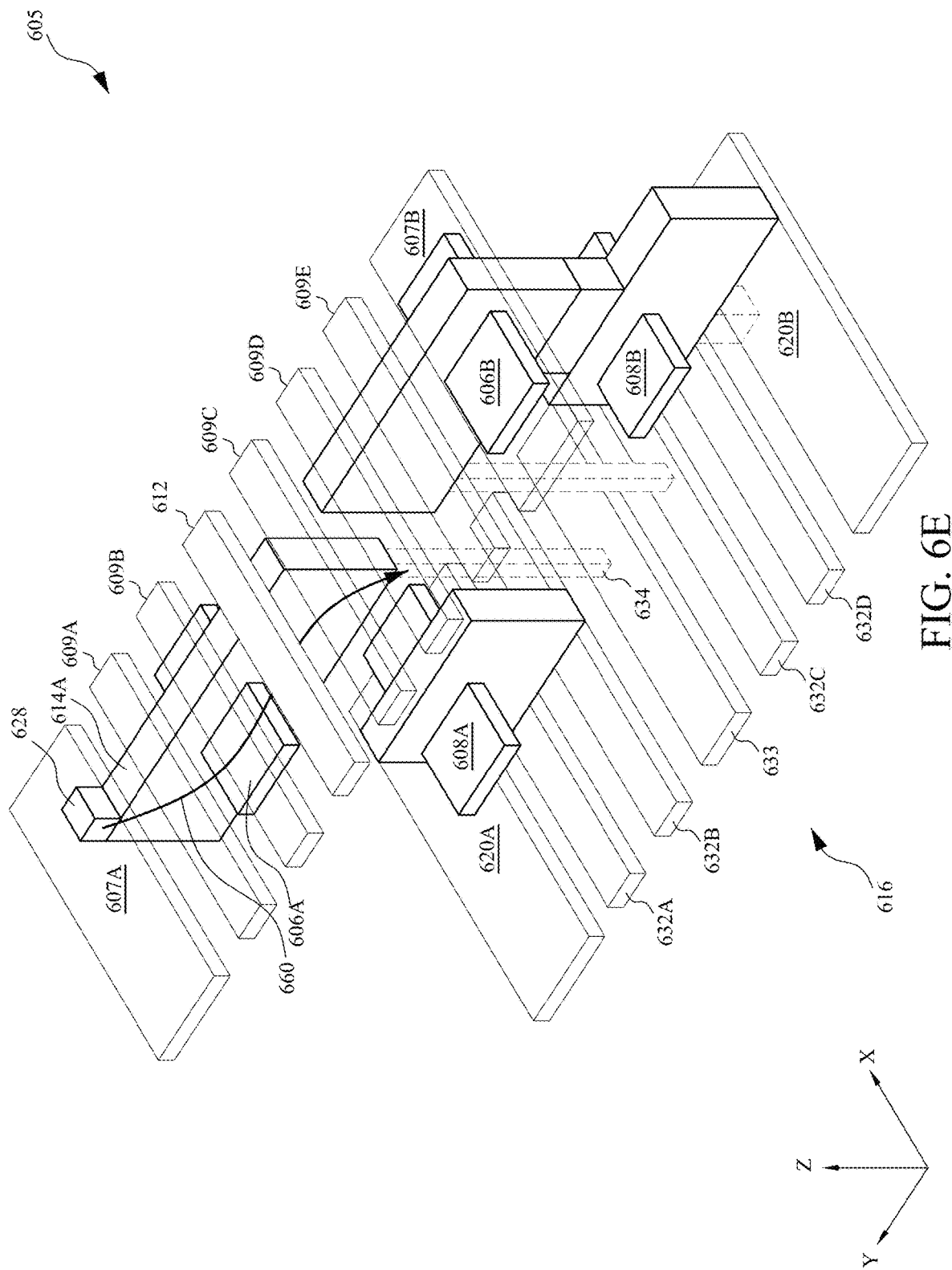
Figure 6F:
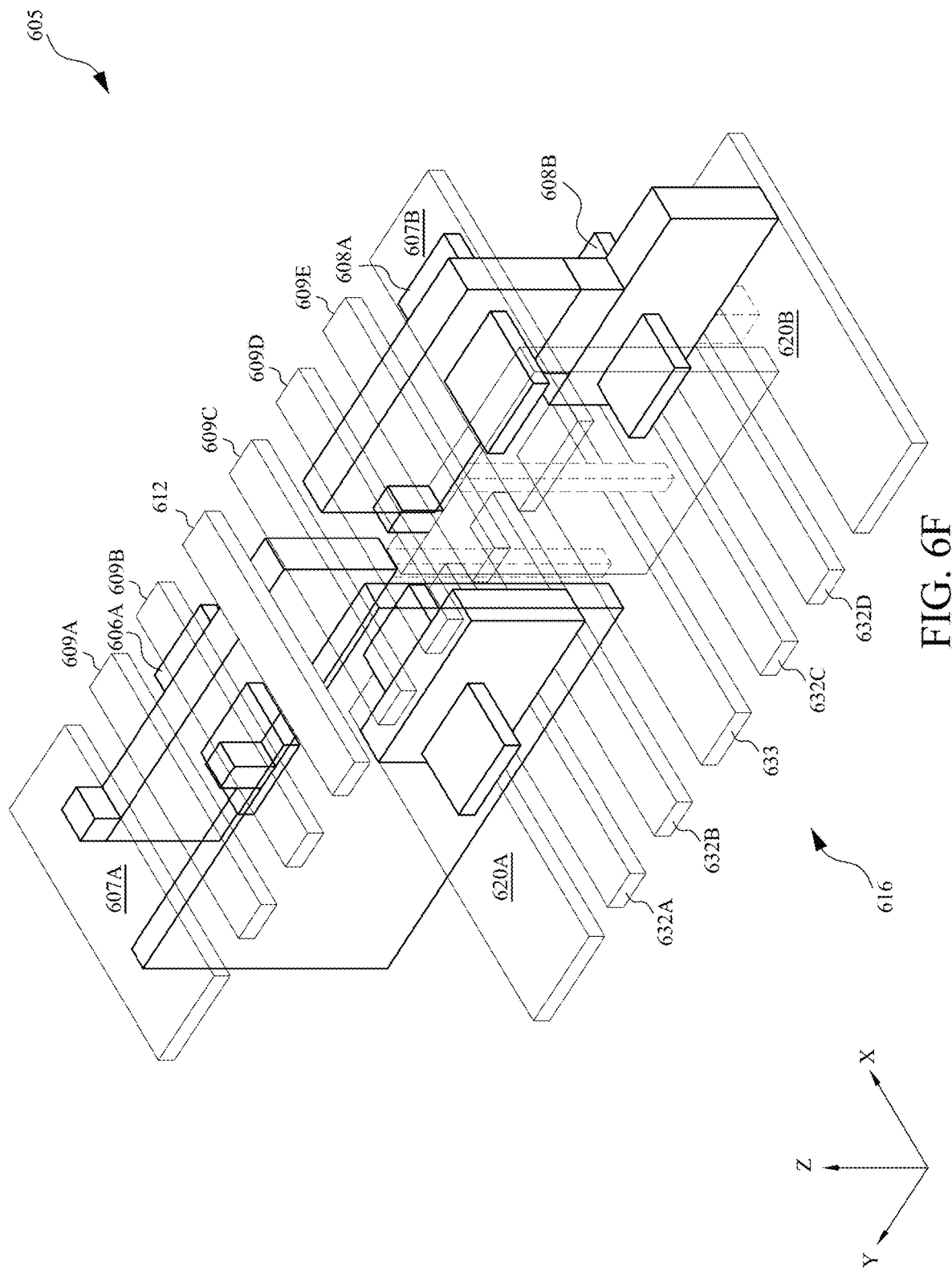
Figure 6G:
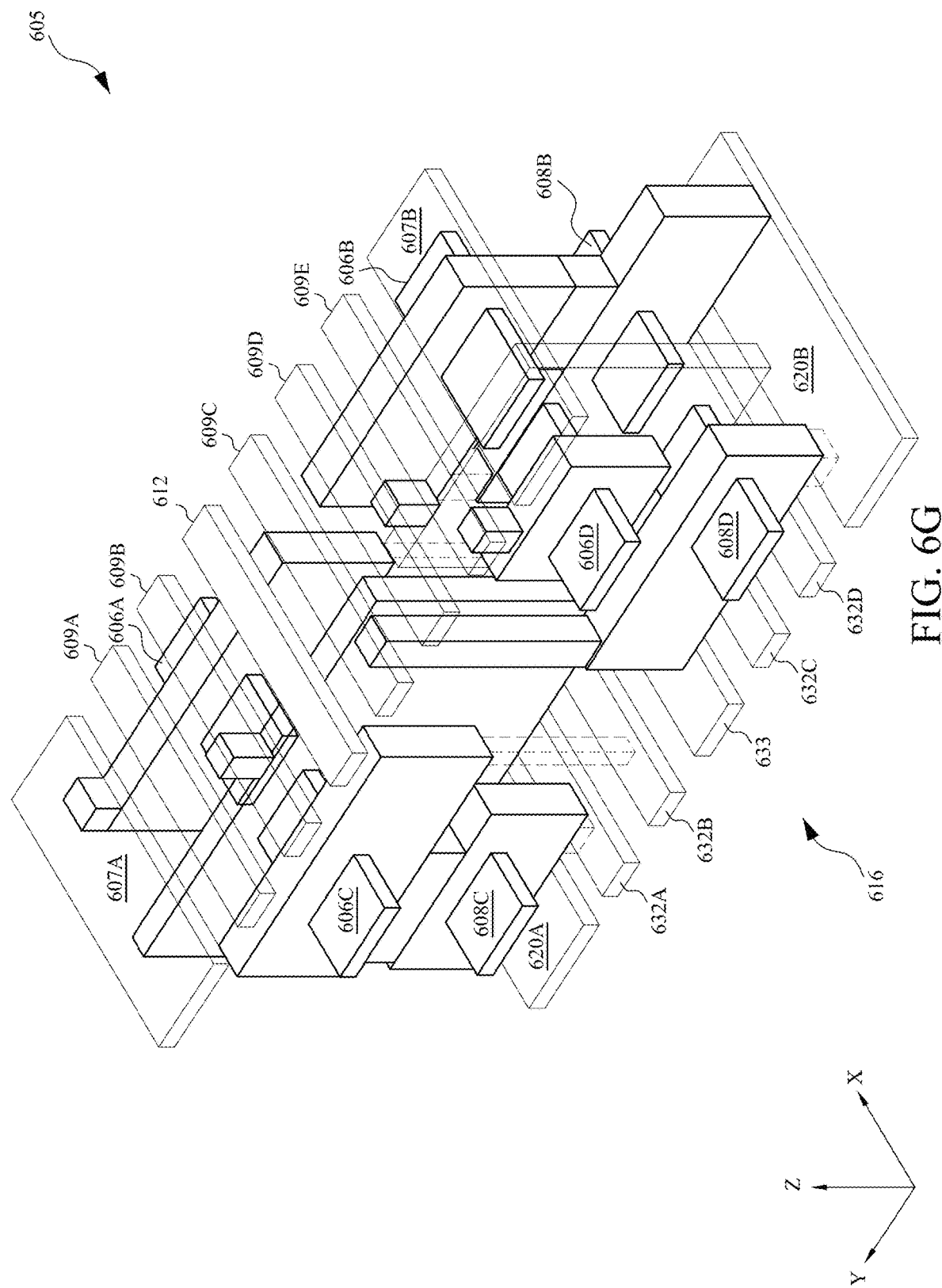

In some embodiments, FIG. 6E includes curved arrow 660 that represents power routed from VDD through power conductive line 607A, via 628, source terminal 614A, VTB 634, and to shielding conductive line 633, so that shielding conductive line 633 can shield signal cross talk between signal conductive lines 632A, 632B and signal conductive lines 632C and 632D. Additionally or alternatively, power is connected to bottom devices through VTB 634. In at least one embodiment where VDD may be available only at a front-side metal layer (e.g., M0) and VSS may be available only at a back-side metal layer (e.g., BM0), by routing VDD from M0 layer to a conductive line, e.g., 633, in BM0 layer, it is possible to configure conductive line 633 as a shielding conductive line, or as an additional VDD power conductive line for supplying VDD to one or more circuit elements from an otherwise VSS-only BM0 layer. In at least one embodiment, this arrangement increases routing resources and/or flexibility.

Figure 7A:
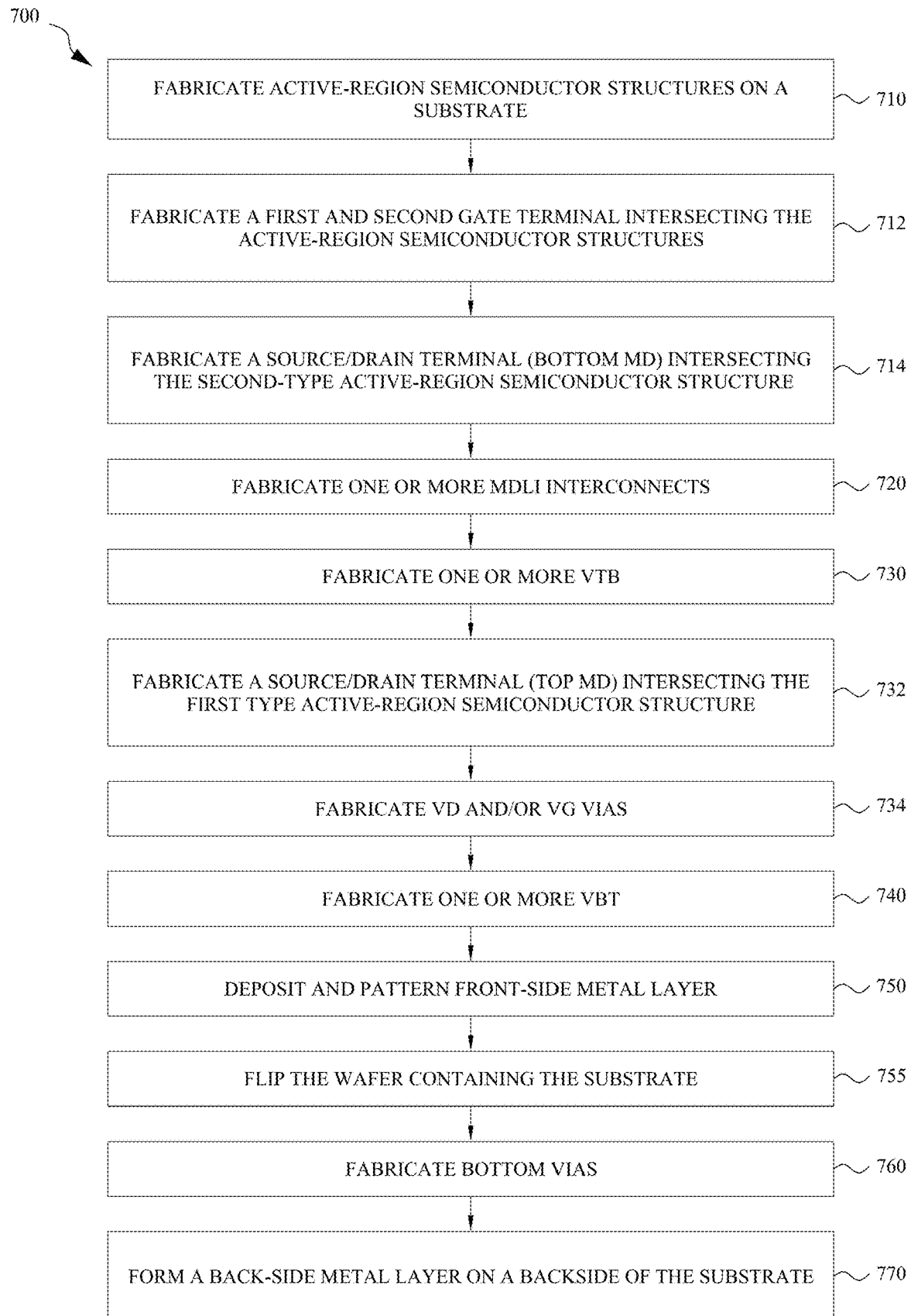
FIG. 7A is a flowchart of a method of manufacturing an integrated circuit (IC), in accordance with some embodiments.

In accordance with some embodiments, FIG. 7A is a flowchart of a method 700 of manufacturing an IC. Additionally or alternatively, additional operations are performed before, during, and/or after method 700 depicted in FIG. 7A, and that some other processes are only briefly described herein.

In some embodiments, in operation 710 of method 700, first and second-type active-region semiconductor structures are fabricated on a substrate. Additionally or alternatively, the first and second-type active-region semiconductor structures are fabricated atop a layer of dielectric material. In some embodiments, as a non-limiting example, in the embodiments as shown in FIG. 1A and FIGS. 1C-1E, P-type active-region semiconductor structure 106 is fabricated atop the layer of dielectric material which is above N-type active-region semiconductor structure 108.

In some embodiments, then, in operation 712 of method 700, a first and a second gate terminals are fabricated. Additionally or alternatively, the first and second gate terminals intersect the first and second-type active-region semiconductor structures. In some embodiments, as a non-limiting example, in the embodiments as shown in FIG. 1A and FIGS. 1C-1E, gate terminals 110A and 110B are fabricated in operation 712, and gate terminal 110B intersects N-type active-region semiconductor structure 108, and gate terminal 110A intersects P-type active region semiconductor structure 106. In some embodiments, gate connection 131 is fabricated together with gate terminals 110A and 110B, resulting in a continuous gate structure extending around the stacked active-region semiconductor structures 106, 108. In at least one embodiment, where gate terminals 110A and 110B are not to be interconnected, gate connection 131 is not fabricated, or is fabricated and then removed.

In some embodiments, a source terminal and a drain terminal of a bottom device (referred to herein as bottom MDs) are fabricated in operation 714. In some embodiments, the source terminal and drain terminal of the bottom device intersects the second-type active-region semiconductor structure. In some embodiments, as a non-limiting example, in the embodiments as shown in FIG. 1A and FIGS. 1C-1E, source terminal 114B and drain terminal 130B are fabricated, and source terminal 114B and drain terminal 130B intersect N-type active-region semiconductor structure 108 and form the source terminal and drain terminal of first transistor 102 (bottom device).

In some embodiments, in operation 720 of method 700, an MDLI interconnect is fabricated. In some embodiments, as a non-limiting example, in the embodiments as shown in FIG. 1A and FIGS. 1C-1E, MDLI 138 that will connected drain terminals 130B and 130A is fabricated.

In some embodiments, then, in operation 730 of method 700, one or more VTB (via-top-to-bottom) are fabricated to electrically connect a back-side conductive line with a source terminal or drain terminal of the top device. In some embodiments, as a non-limiting example, in the embodiments as shown in FIG. 1A and FIGS. 1C-1E, VTB 134 that will connect drain terminal 130A and signal conductive line 132B is fabricated.

In some embodiments, in operation 732 of method 700, a source terminal and a drain terminal of a top device (referred to herein as top MDs) are fabricated. In some embodiments, the source terminal and drain terminal of the top device intersect the first-type active-region semiconductor structure. In some embodiments, as a non-limiting example, in the embodiments as shown in FIG. 1A and FIGS. 1C-1E, source terminal 114A and drain terminal 130A are fabricated, and source terminal 114A and drain terminal 130A intersect P-type active-region semiconductor structure 106 and form the source terminal and drain terminal of second transistor 104 (top device).

In some embodiments, then, in operation 734 of method 700, one or more VD and/or VG vias are fabricated to electrically connect front-side conductive lines (to be formed later) with the source terminal, drain terminal and/or gate terminal of the top device. In some embodiments, as a non-limiting example, in the embodiments as shown in FIG. 1A and FIGS. 1C-1E, via 128A that will connect drain terminal 130A and signal conductive line 132B, via 122A that will connect gate terminal 110A to signal conductive line 109A, and via 124A that will connect source terminal 114A to signal conductive line 109B are fabricated.

In some embodiments, then, in operation 740 of method 700, one or more VBT (via-bottom-to-top) are fabricated to electrically connect a front-side conductive line with a bottom MD, i.e., a source terminal or a drain terminal of a bottom device. In some embodiments, as a non-limiting example, in the embodiments as shown in FIG. 3B, VBT 324A that will connect source terminal 314B and signal conductive line 309E is fabricated.

In some embodiments, a first insulating material is deposited and covers the gate terminal, drain terminal and source terminal of the top device, as well as one or more VD, VG, VBT vias that have been fabricated. Additionally or alternatively, after operation 740, in operation 750 of method 700, a front-side metal layer is deposited over the first insulating material. In some embodiments, the front-side metal layer is patterned to form a front-side power conductive line, one or more front-side signal conductive lines, and a front-side shielding conductive line which are in electrical contact with corresponding VD, VG, and/or VBT vias. In some embodiments, as a non-limiting example, in the embodiments as shown in FIG. 1A and FIGS. 1C-1E, front-side power conductive line 107A, front-side signal conductive lines (109A and 109B), and front-side shielding conductive line 112A are fabricated in front-side metal layer 105A overlying the insulating material covering gate terminal 110A, drain terminal 130A and source terminal 114A. Additionally or alternatively, front-side power conductive line 107A is conductively connected to drain terminal 130A through a top VD via 128A, and front-side signal conductive line 109A is conductively connected to gate terminal 110A through a top VG via 122A.

In some embodiments, after operations 740 and 750, the wafer containing the substrate is flipped in operation 755. Additionally or alternatively, then, the process flow proceeds to 760. In some embodiments, then, in operation 760 of method 700, one or more bottom vias are fabricated to electrically connect back-side conductive lines (to be formed later) with the source terminal, drain terminal and/or gate terminal of the bottom device. In some embodiments, as a non-limiting example, in the embodiments as shown in FIG. 1A and FIGS. 1C-1E, one or more of bottom VD via 126 that will connect drain terminal 130B and power conductive line 120, bottom VD via 136 that will connect source terminal 114B to signal conductive line 132B, bottom VD via 140 that will connect source terminal 114B to power conductive line 120, and bottom VG via 142 that will connect gate terminal 110B to signal conductive line 132B, are fabricated.

In operation 770 of method 700, a back-side metal layer is formed on a backside of the substrate. In some embodiments, the back-side metal layer is patterned to form a back-side power conductive line, one or more back-side signal conductive line, and/or a back-side shielding conductive line which are in electrical contact with corresponding bottom vias. In some embodiments, as a non-limiting example, in the embodiments as shown in FIG. 3A and FIGS. 3C-3F, the back-side power conductive line 320A, one or more back-side signal conductive lines (332A and 332B), and back-side shielding conductive line 333A are fabricated in back-side metal layer 316A at the backside of the substrate. Additionally or alternatively, back-side power conductive line 320A is conductively connected to source terminal 314B through a bottom VD via 340A.

Figure 7B:
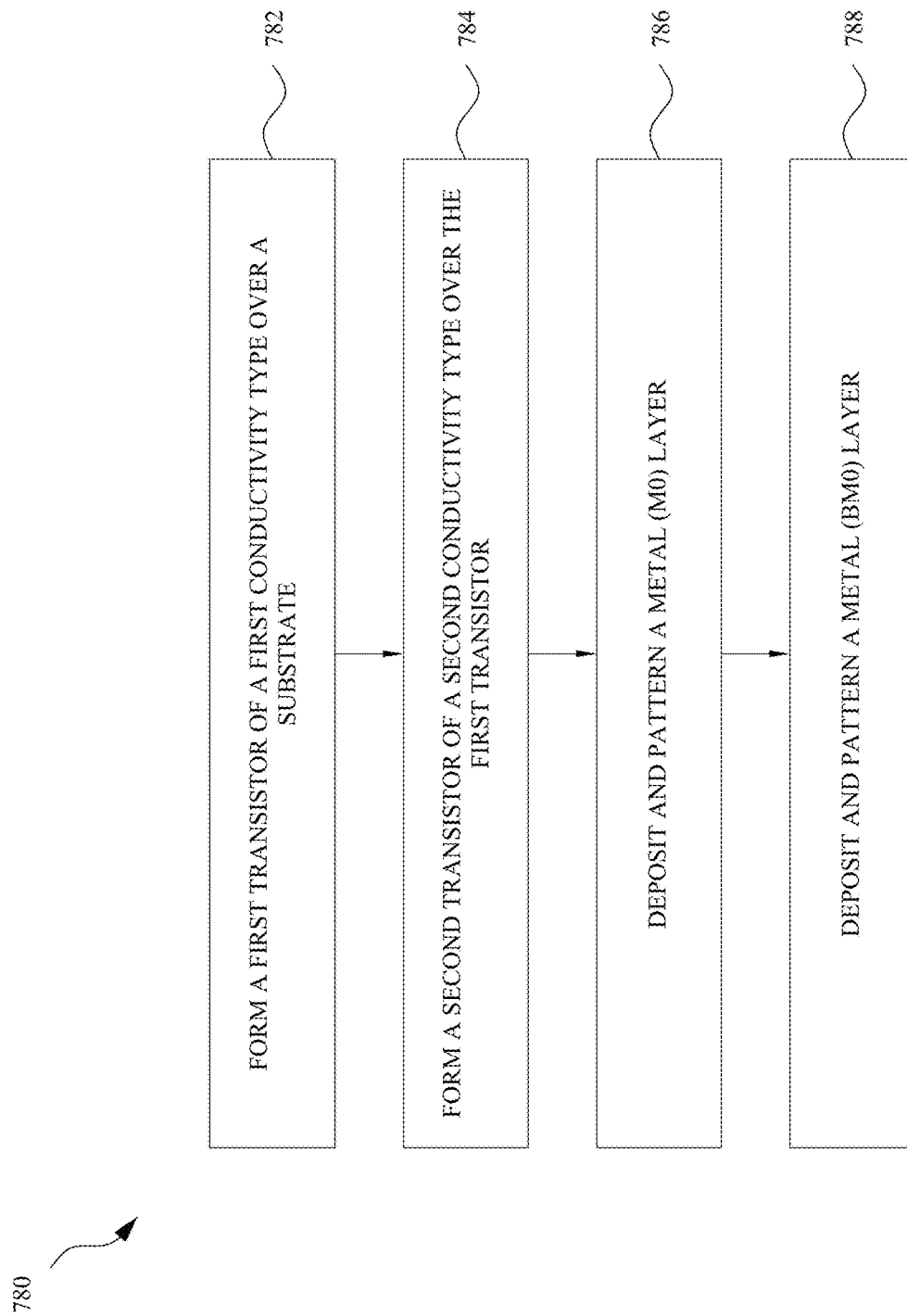
FIG. 7B is a flowchart of a method of manufacturing an integrated circuit (IC), in accordance with some embodiments.

In accordance with some embodiments, FIG. 7B is a flowchart of a method 780 of manufacturing an IC. Additionally or alternatively, additional operations are performed before, during, and/or after method 780 depicted in FIG. 7B, and that some other processes are only briefly described herein.

In some embodiments, in operation 782 of method 780, a first transistor of a first conductivity type is formed over a substrate. In some embodiments, as a non-limiting example, in the embodiments as shown in FIG. 1A, FIGS. 1C-1E, and FIG. 2C first transistor 102 is formed over substrate 260.

In some embodiments, in operation 784 of method 780, a second transistor of a second conductivity type, where the second conductivity type is different from the first conductivity type, is formed over the first transistor to obtain a transistor stack. In some embodiments, as a non-limiting example, in the embodiments as shown in FIG. 1A, FIGS. 1C-1E, and FIG. 2C second transistor 104 is formed over first transistor 102.

In some embodiments, in operation 786 of method 780, a metal zero (M0) layer is deposited and patterned over the transistor stack. Additionally or alternatively, the metal zero (M0) layer includes a power conductive line to route power to the transistor stack, one or more signal conductive lines to route signals to the transistor stack, and a shielding conductive line to shield the routed signals on the one or more signal conductive lines. In some embodiments, the one or more signal conductive lines are between the power conductive line and the shielding conductive line. In some embodiments, as a non-limiting example, in the embodiments as shown in FIG. 1A, FIGS. 1C-1E, and FIG. 2C metal layer 116 is formed under first transistor 102 and second transistor 104. The metal layer 105 includes a power conductive line 107, one or more signal conductive lines 109A, 109B and shielding conductive line 112.

In some embodiments, in operation 788 of method 780, a backside metal zero (M0) layer is deposited and patterned below the substrate and underneath the transistor stack. Additionally or alternatively, the back-side metal zero (BM0) layer includes a power conductive line to route power to the transistor stack and one or more signal conductive lines to route signals to the transistor stack. In some embodiments, as a non-limiting example, in the embodiments as shown in FIG. 1A, FIGS. 1C-1E, and FIG. 2C metal layer 116 is formed under first transistor 102 and second transistor 104. The metal layer 116 includes a power conductive line 120 and one or more signal conductive lines 132A, 132B.

Figure 8:
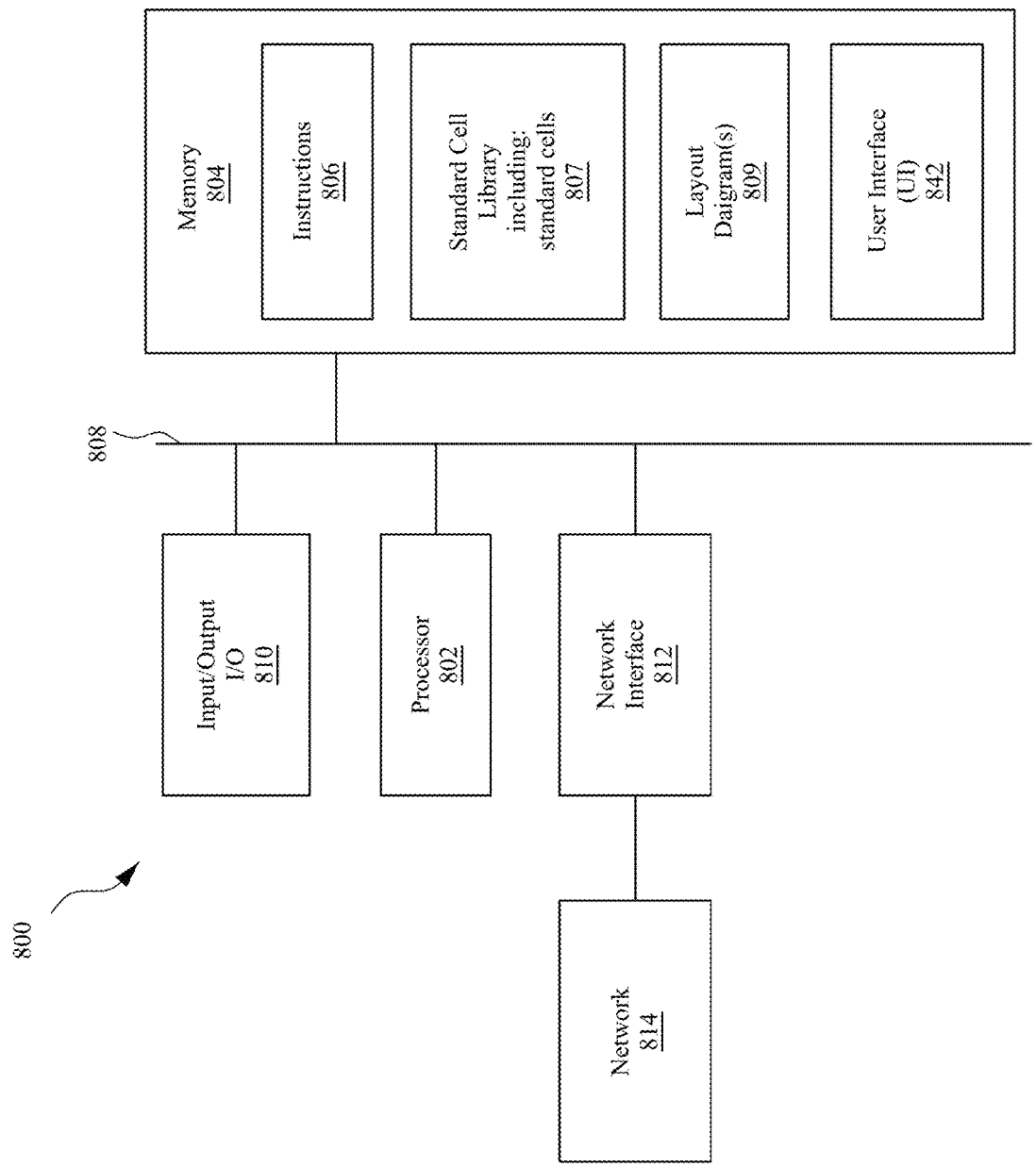
FIG. 8 is a block diagram of an electronic design automation (EDA) system in accordance with some embodiments.

FIG. 8 is a block diagram of an electronic design automation (EDA) system 800 in accordance with some embodiments. Additionally or alternatively, EDA system 800 includes an APR system. In some embodiments, methods described herein of designing layout diagrams represent wire routing arrangements, in accordance with one or more embodiments, are implementable, for example, using EDA system 800, in accordance with some embodiments.

In some embodiments, EDA system 800 is a general purpose computing device including a hardware processor 802 and a non-transitory, computer-readable storage medium 804. Additionally or alternatively, storage medium 804, amongst other things, is encoded with, i.e., stores, computer program code 806, i.e., a set of executable instructions. In some embodiments, execution of computer program code 806 by hardware processor 802 represents (at least in part) an EDA tool which implements a portion or all of the methods described herein in accordance with one or more embodiments (hereinafter, the noted processes and/or methods).

In some embodiments, processor 802 is electrically coupled to computer-readable storage medium 804 via a bus 808. Additionally or alternatively, processor 802 is also electrically coupled to an I/O interface 810 by bus 808. In some embodiments, a network interface 812 is also electrically connected to processor 802 via bus 808. Additionally or alternatively, network interface 812 is connected to a network 814, so that processor 802 and computer-readable storage medium 804 are capable of connecting to external elements via network 814. In some embodiments, processor 802 is configured to execute computer program code 806 encoded in computer-readable storage medium 804 in order to cause EDA system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause EDA system 800 (where such execution represents (at least in part) the EDA tool) to be usable for performing a portion or all of the noted processes and/or methods. In one or more embodiments, storage medium 804 also stores information which facilitates performing a portion or all of the noted processes and/or methods. In one or more embodiments, storage medium 804 stores library 807 of standard cells including such standard cells as disclosed herein. In one or more embodiments, storage medium 804 stores one or more layout diagrams 809 corresponding to one or more layout diagrams disclosed herein.

In some embodiments, EDA system 800 includes I/O interface 810. Additionally or alternatively, I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

In some embodiments, EDA system 800 also includes network interface 812 coupled to processor 802. Additionally or alternatively, network interface 812 allows EDA system 800 to communicate with network 814, to which one or more other computer systems are connected. In some embodiments, network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 800.

In some embodiments, EDA system 800 is configured to receive information through I/O interface 810. Additionally or alternatively, the information received through I/O interface 810 includes one or more of instructions, data, design rules, libraries of standard cells, and/or other parameters for processing by processor 802. In some embodiments, the information is transferred to processor 802 via bus 808. Additionally or alternatively, EDA system 800 is configured to receive information related to a UI through I/O interface 810. In some embodiments, the information is stored in computer-readable medium 804 as user interface (UI) 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout diagram which includes standard cells is generated using a tool such as VIRTUOSO® available from CADENCE DESIGN SYSTEMS, Inc., or another suitable layout diagram generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
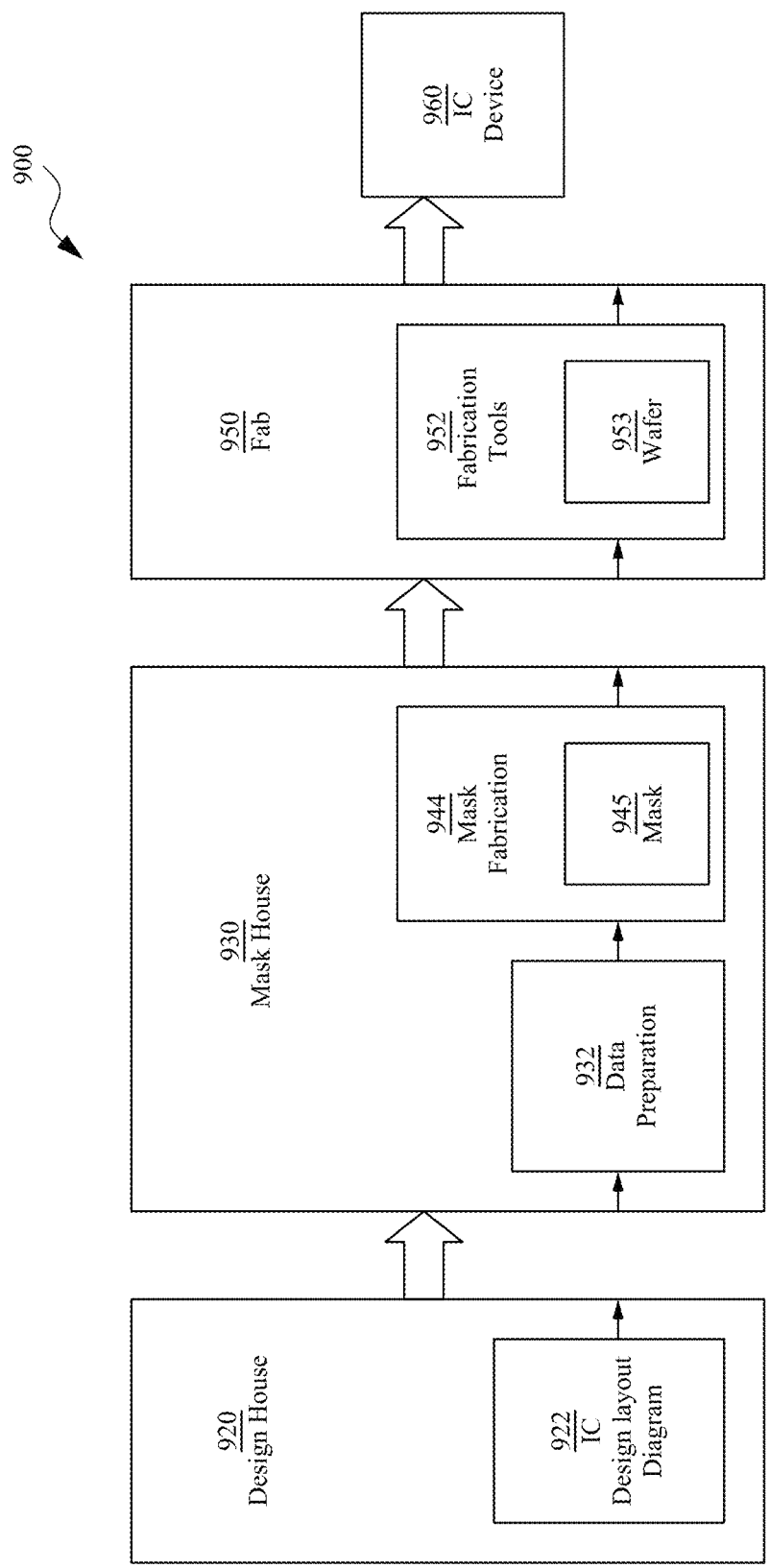
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 900.

In some embodiments, in FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. Additionally or alternatively, the entities in system 900 are connected by a communications network. In some embodiments, the communications network is a single network. In some embodiments, the communications network is a variety of different networks, such as an intranet and the Internet. Additionally or alternatively, the communications network includes wired and/or wireless communication channels. In some embodiments, each entity interacts with one or more of the other entities and provides services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

In some embodiments, design house (or design team) 920 generates an IC design layout diagram 922. Additionally or alternatively, IC design layout diagram 922 includes various geometrical patterns designed for an IC device 960. In some embodiments, the geometrical patterns correspond to patterns of metal, oxide, or semiconductor layers that make up the various components of IC device 960 to be fabricated. Additionally or alternatively, the various layers combine to form various IC features. For example, a portion of IC design layout diagram 922 includes various IC features, such as an active region, gate terminal, source terminal and drain terminal, metal lines or vias of an interlayer interconnection, and openings for bonding pads, to be formed in a semiconductor substrate (such as a silicon wafer) and various material layers on the semiconductor substrate. In some embodiments, design house 920 implements a proper design procedure to form IC design layout diagram 922. Additionally or alternatively, the design procedure includes one or more of logic design, physical design or place and route. In some embodiments, IC design layout diagram 922 is presented in one or more data files having information of the geometrical patterns. For example, IC design layout diagram 922 is expressed in a GDSII file format or DFII file format.

In some embodiments, mask house 930 includes mask data preparation 932 and mask fabrication 944. Additionally or alternatively, mask house 930 uses IC design layout diagram 922 to manufacture one or more masks 945 to be used for fabricating the various layers of IC device 960 according to IC design layout diagram 922. In some embodiments, mask house 930 performs mask data preparation 932, where IC design layout diagram 922 is translated into a representative data file ("RDF"). Additionally or alternatively, mask data preparation 932 provides the RDF to mask fabrication 944. In some embodiments, mask fabrication 944 includes a mask writer. Additionally or alternatively, a mask writer converts the RDF to an image on a substrate, such as a mask (reticle) 945 or a semiconductor wafer 953. In some embodiments, the design layout diagram 922 is manipulated by mask data preparation 932 to comply with particular characteristics of the mask writer and/or requirements of IC fab 950. Additionally or alternatively, in FIG. 9, mask data preparation 932 and mask fabrication 944 are illustrated as separate elements. In some embodiments, mask data preparation 932 and mask fabrication 944 are collectively referred to as mask data preparation.

In some embodiments, mask data preparation 932 includes optical proximity correction (OPC) which uses lithography enhancement techniques to compensate for image errors, such as those that arise from diffraction, interference, other process effects and the like. Additionally or alternatively, OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which undoes part of the modifications performed by OPC in order to meet mask creation rules.

In some embodiments, mask data preparation 932 includes lithography process checking (LPC) that simulates processing that will be implemented by IC fab 950 to fabricate IC device 960. Additionally or alternatively, LPC simulates this processing based on IC design layout diagram 922 to create a simulated manufactured device, such as IC device 960. In some embodiments, the processing parameters in LPC simulation include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

In some embodiments, the above description of mask data preparation 932 has been simplified for the purposes of clarity. In some embodiments, mask data preparation 932 includes additional features such as a logic operation (LOP) to modify the IC design layout diagram 922 according to manufacturing rules. Additionally, the processes applied to IC design layout diagram 922 during mask data preparation 932 are executed in a variety of different orders.

In some embodiments, after mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Additionally or alternatively, mask 945 is formed in various technologies. In some embodiments, mask 945 is formed using binary technology. In some embodiments, a mask pattern includes opaque regions and transparent regions. Additionally or alternatively, a radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask. In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask is attenuated PSM or alternating PSM. Additionally or alternatively, the mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

In some embodiments, IC fab 950 is an IC fabrication business that includes one or more manufacturing facilities for the fabrication of a variety of different IC products. In some embodiments, IC fab 950 is a semiconductor foundry. For example, there is a manufacturing facility for the front end fabrication of a plurality of IC products (front-end-of-line (FEOL) fabrication), while a second manufacturing facility provides the back end fabrication for the interconnection and packaging of the IC products (back-end-of-line (BEOL) fabrication), and a third manufacturing facility provides other services for the foundry business.

In some embodiments, IC fab 950 includes fabrication tools 952 configured to execute various manufacturing operations on semiconductor wafer 953 such that IC device 960 is fabricated in accordance with the mask(s), e.g., mask 945. In various embodiments, fabrication tools 952 include one or more of a wafer stepper, an ion implanter, a photo-resist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

In some embodiments, IC fab 950 uses mask(s) 945 fabricated by mask house 930 to fabricate IC device 960. Additionally or alternatively, IC fab 950 at least indirectly uses IC design layout diagram 922 to fabricate IC device 960. In some embodiments, semiconductor wafer 953 is fabricated by IC fab 950 using mask(s) 945 to form IC device 960. In some embodiments, the IC fabrication includes performing one or more lithographic exposures based at least indirectly on IC design layout diagram 922. In some embodiments, semiconductor wafer 953 includes a silicon substrate or other proper substrate having material layers formed thereon. Additionally or alternatively, semiconductor wafer 953 further includes one or more of various doped regions, dielectric features, multilevel interconnects, and the like (formed at subsequent manufacturing steps).

In some embodiments, details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 2066640838, published Feb. 6, 2014, and U.S. Pat. No. 7,260,442, granted Aug. 21, 2007, the entireties of each of which are hereby incorporated by reference.

In some embodiments, a method comprises forming a first transistor stack over a substrate. The first transistor stack comprises a first transistor of a first conductivity type, and a second transistor of a second conductivity type different from the first conductivity type. The second transistor is above the first transistor. A plurality of first conductive lines is formed in a first metal layer above the first transistor stack. The plurality of first conductive lines comprises, over the first transistor stack, a power conductive line configured to route power to the first transistor stack, one or more signal conductive lines configured to route one or more signals to the first transistor stack, and a shielding conductive line configured to shield the routed one or more signals on the one or more signal conductive lines. The one or more signal conductive lines are between the power conductive line and the shielding conductive line.

In some embodiments, a method comprises forming a first transistor stack over a substrate. The first transistor stack comprises: a first transistor of a first conductivity type, and a second transistor of a second conductivity type different from the first conductivity type. The second transistor is above the first transistor. A plurality of first conductive lines is formed in a first metal layer above the first transistor stack. At least one of the plurality of first conductive lines is electrically connected to the first transistor stack. A plurality of second conductive lines is formed in a second metal layer below the substrate and underneath the first transistor stack. At least one of the plurality of second conductive lines is electrically connected to the first transistor stack. The plurality of first conductive lines are configured asymmetrically with respect to the plurality of second conductive lines.

In some embodiments, a method comprises forming a first transistor of a first conductivity type over a substrate. The method also includes forming a second transistor of a second conductivity type different from the first conductivity type over the first transistor to obtain a transistor stack. The method also includes forming, in a metal layer and over the transistor stack, a power conductive line to route power to the transistor stack, one or more signal conductive lines to route one or more signals to the transistor stack, and a shielding conductive line to shield the routed one or more signals on the one or more signal conductive lines. The method also includes forming an abutting transistor stack over the substrate. At least one of the power conductive line or the shielding conductive line is shared with the abutting transistor stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first transistor stack over a substrate, the first transistor stack comprising:
        a first transistor of a first conductivity type; and
        a second transistor of a second conductivity type different from the first conductivity type, the second transistor above the first transistor; and
    forming a plurality of first conductive lines in a first metal layer above the first transistor stack, the plurality of first conductive lines comprising, over the first transistor stack:
        a power conductive line configured to route power to the first transistor stack;
        one or more signal conductive lines configured to route one or more signals to the first transistor stack; and
        a shielding conductive line configured to shield the routed one or more signals on the one or more signal conductive lines, wherein the one or more signal conductive lines are between the power conductive line and the shielding conductive line.

2. The method of claim 1, further comprising:
forming a plurality of second conductive lines in a second metal layer below the substrate, the plurality of second conductive lines comprising, underneath the first transistor stack:
  a power conductive line configured to route power to the first transistor stack; and
  one or more signal conductive lines configured to route one or more signals to the first transistor stack.

3. The method of claim 2, further comprising:
forming a via electrically connecting the second transistor and at least one of the one or more signal conductive lines of the second metal layer below the substrate.

4. The method of claim 1, further comprising:
forming a conductive interconnect between and electrically connecting a source terminal/drain terminal of the first transistor to a source terminal/drain terminal of the second transistor.

5. The method of claim 1, further comprising:
forming a gate connection structure between and electrically connecting a gate of the first transistor to a gate of the second transistor.

6. The method of claim 1, further comprising:
forming a second transistor stack over the substrate and under the first metal layer, the second transistor stack abutting the first transistor stack, the second transistor stack comprising:
  a third transistor of one of the first conductivity type and the second conductivity type; and
  a fourth transistor of the other of the first conductivity type and the second conductivity type, the fourth transistor above the third transistor,
wherein the plurality of first conductive lines comprises, over the second transistor stack:
  the power conductive line of the first transistor stack that extends partially over the second transistor stack and is configured to route power to both the first transistor stack and the second transistor stack;
  one or more signal conductive lines configured to route one or more signals to the second transistor stack; and
  a shielding conductive line configured to shield the routed one or more signals on the one or more signal conductive lines of the second transistor stack, wherein the one or more signal conductive lines of the second transistor stack are between the power conductive line and the shielding conductive line of the second transistor stack.

7. The method of claim 1, further comprising:
forming a second transistor stack over the substrate and under the first metal layer, the second transistor stack abutting the first transistor stack, the second transistor stack comprising:
  a third transistor of one of the first conductivity type and the second conductivity type; and
  a fourth transistor of the other of the first conductivity type and the second conductivity type, the fourth transistor above the third transistor,
wherein the plurality of first conductive lines comprises, over the second transistor stack:
  a power conductive line configured to route power to the second transistor stack;
  one or more signal conductive lines configured to route one or more signals to the second transistor stack; and
  the shielding conductive line of the first transistor stack that extends partially over the second transistor stack and is configured to shield the routed one or more signals on both the one or more signal conductive lines of the first transistor stack and the one or more signal conductive lines of the second transistor stack, wherein the one or more signal conductive lines of the second transistor stack are between the power conductive line of the second transistor stack and the shielding conductive line.

8. The method of claim 7, further comprising:
forming a first via electrically connecting the power conductive line of the first transistor stack and the second transistor of the first transistor stack;
forming a second via connected to the first transistor; and
forming a plurality of second conductive lines in a second metal layer below the substrate, the plurality of second conductive lines comprising, underneath the first transistor stack:
  a power conductive line;
  one or more signal conductive lines configured to route one or more signals to the first transistor stack; and
  a shielding conductive line partially underneath the first transistor stack and partially underneath the second transistor stack, and electrically connected to the second via.

9. The method of claim 8, wherein
the plurality of first conductive lines further comprises, over the second transistor stack, an additional signal conductive line between the shielding conductive line of the first transistor stack and the one or more signal conductive lines of the second transistor stack.

10. The method of claim 9, further comprising:
forming a third via electrically connecting the additional signal conductive line and the third transistor of the second transistor stack.

11. A method, comprising:
forming a first transistor stack over a substrate, the first transistor stack comprising:
  a first transistor of a first conductivity type; and
  a second transistor of a second conductivity type different from the first conductivity type, the second transistor above the first transistor;
forming a plurality of first conductive lines in a first metal layer above the first transistor stack, at least one of the plurality of first conductive lines electrically connected to the first transistor stack; and
forming a plurality of second conductive lines in a second metal layer below the substrate and underneath the first transistor stack, at least one of the plurality of second conductive lines electrically connected to the first transistor stack,
wherein the plurality of first conductive lines are configured asymmetrically with respect to the plurality of second conductive lines.

12. The method of claim 11, wherein
the plurality of first conductive lines comprises, over the first transistor stack:
  a power conductive line configured to route power to the first transistor stack;
  one or more signal conductive lines configured to route one or more signals to the first transistor stack; and
  a shielding conductive line configured to shield the routed one or more signals on the one or more signal conductive lines, wherein the one or more signal conductive lines are between the power conductive line and the shielding conductive line; and
the plurality of second conductive lines comprises, underneath the first transistor stack:

a power conductive line configured to route power to the first transistor stack; and one or more signal conductive lines configured to route one or more signals to the first transistor stack.

13. The method of claim 12, further comprising:

forming a second transistor stack over the substrate and abutting the first transistor stack, wherein the power conductive line of the first transistor stack extends from over the first transistor stack to partially over the second transistor stack and is configured to power the second transistor stack.

14. The method of claim 12, further comprising:

forming a second transistor stack over the substrate and abutting the first transistor stack, wherein the plurality of first conductive lines comprises, over the second transistor stack, one or more signal conductive lines configured to route one or more signals to the second transistor stack, and the shielding conductive line of the first transistor stack extends from over the first transistor stack to partially over the second transistor stack, and is configured to shield the routed one or more signals on the one or more signal conductive lines of the first transistor stack from the routed one or more signals on the one or more signal conductive lines of the second transistor stack.

15. The method of claim 12, wherein the plurality of second conductive lines further comprises, underneath the first transistor stack, a shielding conductive line configured to shield the routed one or more signals of the one or more signal conductive lines in the plurality of second conductive lines, and among the plurality of second conductive lines, the one or more signal conductive lines are between the power conductive line and the shielding conductive line.

16. A method, comprising:

forming a first transistor of a first conductivity type over a substrate;

forming a second transistor of a second conductivity type different from the first conductivity type over the first transistor to obtain a transistor stack;

forming, in a first conductive layer, a power conductive line to route power to the transistor stack;

one or more signal conductive lines to route one or more signals to the transistor stack; and a shielding conductive line to shield the routed one or more signals on the one or more signal conductive lines, wherein the one or more signal conductive lines are between the power conductive line and the shielding conductive line; and forming an abutting transistor stack over the substrate, wherein at least one of the power conductive line or the shielding conductive line is shared with the abutting transistor stack.

17. The method of claim 16, wherein the first conductive layer is over the transistor stack.

18. The method of claim 16, further comprising:

forming, in a second conductive layer, a power conductive line to route power to the transistor stack; and one or more signal conductive lines to route one or more signals to the transistor stack, wherein the transistor stack and the abutting transistor stack are between the first conductive layer and the second conductive layer.

19. The method of claim 18, further comprising:

forming, in the second conductive layer, a shielding conductive line to shield the routed one or more signals on the one or more signal conductive lines in the second conductive layer, wherein, in the second conductive layer, the one or more signal conductive lines are between the power conductive line and the shielding conductive line.

20. The method of claim 18, further comprising:

forming, in the first conductive layer, an additional signal conductive line to route an additional signal to the transistor stack.

* * * * *